US009202759B2

(12) United States Patent
Okuno et al.

(10) Patent No.: US 9,202,759 B2
(45) Date of Patent: Dec. 1, 2015

(54) SEMICONDUCTOR DEVICE MANUFACTURING METHOD

(71) Applicant: FUJITSU SEMICONDUCTOR LIMITED, Yokohama, Kanagawa (JP)

(72) Inventors: Masaki Okuno, Yokohama (JP); Hajime Yamamoto, Yokohama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/192,382

(22) Filed: Feb. 27, 2014

(65) Prior Publication Data

US 2014/0179081 A1 Jun. 26, 2014

Related U.S. Application Data

(62) Division of application No. 13/301,682, filed on Nov. 21, 2011, now Pat. No. 8,697,526.

(30) Foreign Application Priority Data

Feb. 28, 2011 (JP) ................................ 2011-042675

(51) Int. Cl.

*H01L 21/336* (2006.01)
*H01L 21/8234* (2006.01)
*H01L 27/02* (2006.01)
*H01L 27/11* (2006.01)
*H01L 29/66* (2006.01)
*H01L 29/78* (2006.01)

(52) U.S. Cl.

CPC .... *H01L 21/823481* (2013.01); *H01L 27/0207* (2013.01); *H01L 27/1104* (2013.01); *H01L 29/665* (2013.01); *H01L 29/78* (2013.01)

(58) Field of Classification Search

USPC .......................... 438/622, 637, 671, 672, 675
See application file for complete search history.

(56) References Cited

U.S. PATENT DOCUMENTS

| | | | | |
|---|---|---|---|---|
| 7,064,395 | B2 | 6/2006 | Minami et al. | |
| 2006/0151827 | A1 * | 7/2006 | Kumazaki | H01L 21/84 257/318 |
| 2009/0275193 | A1 * | 11/2009 | Chakihara et al. | 438/618 |

FOREIGN PATENT DOCUMENTS

JP 2002-033389 A 1/2002

OTHER PUBLICATIONS

USPTO, (Jean Baptiste) Notice of Allowance and Notice of Allowability, Dec. 13, 2013, in U.S. Appl. No. 13/301,682 [now allowed].
USPTO, (Jean Baptiste) Ex Parte Quayle Action, Jul. 30, 2013, in U.S. Appl. No. 13/301,682 [now allowed].
USPTO, (Jean Baptiste) Restriction Requirement, May 2, 2013, in U.S. Appl. No. 13/301,682 [now allowed].

* cited by examiner

*Primary Examiner* — Marc Armand
*Assistant Examiner* — Wilner Jean Baptiste
(74) *Attorney, Agent, or Firm* — Fujitsu Patent Center

(57) ABSTRACT

A semiconductor manufacturing method includes exposing on a photoresist film a first partial pattern of a contact hole, overlapping a part of a gate interconnection in alignment with an alignment mark formed simultaneously with forming the gate interconnection, exposing on the photoresist film a second partial pattern, overlapping a part of an active region in alignment with an alignment mark formed simultaneously with forming the active region, developing the photoresist film to form an opening at the portion where the first partial pattern and the second partial pattern have been exposed, and etching an insulation film to form a contact hole down to the gate interconnection and the source/drain diffused layer.

8 Claims, 52 Drawing Sheets

SEMICONDUCTOR DEVICE MANUFACTURING METHOD

CROSS-REFERENCE TO RELATED APPLICATION

This application is a divisional of application Ser. No. 13/301,682, filed Nov. 21, 2011, which is based upon and claims the benefit of priority of the prior Japanese Patent Application No. 2011-42675, filed on Feb. 28, 2011, the entire contents of which are incorporated herein by reference.

FIELD

The embodiments discussed herein are related to a semiconductor device manufacturing method.

BACKGROUND

Static Random Access Memory (SRAM) is a semiconductor device having the memory cells formed of flip-flop circuits and is operative at high speed.

In semiconductor devices, such as SRAM, etc., gate interconnections, conductor plugs, etc. are laid out in the memory cell parts in very high densities. The gate interconnections, the conductor plugs, etc. are laid out in very high density, whereby the size of the memory cells can be reduced, and the memory capacity can be increased.

Recently, to realize lower costs and larger capacities, the memory cells are required to be more micronized and integrated.

It is required to manufacture SRAM of high reliability at higher yields.

Related reference is as follows:

Japanese Laid-open Patent Publication No. 2002-33389.

SUMMARY

According to one aspect of an embodiment, a semiconductor device manufacturing method comprising: forming a device isolation region for defining a plurality of active regions in a semiconductor substrate and forming a first alignment mark in the semiconductor substrate; forming a first gate interconnection which is formed, crossing over one of said plurality of active regions and which is linear and includes the gate electrode of a first transistor, and a second gate interconnection which is formed, crossing over the other of said plurality of active regions and which is linear and in parallel with the first gate interconnection over the semiconductor substrate with a gate insulation film formed therebetween, and forming a second alignment mark over the semiconductor substrate; forming source/drain diffused layers respectively in the active regions; forming an insulation film over the semiconductor substrate and over the first gate interconnection and the second gate interconnection; forming a photoresist film over the insulation film; making alignment by using the second alignment mark and exposing on the photoresist film a first partial pattern for forming a first contact hole in the insulation film, overlapping at least a part of the first gate interconnection; making alignment by using the first alignment mark and exposing on the photoresist film a second partial pattern for forming the first contact hole in the insulation film, overlapping at least a part of the source/drain diffused layer of the second transistor; developing the photoresist film to form a first opening in the photoresist film at the portion where the first partial pattern and the second partial pattern have been exposed; etching the insulation film with the photoresist film as the mask to form in the insulation film the first contact hole down to the first gate interconnection and the source/drain diffused layer of the second transistor; and burying the first contact layer in the first contact hole.

According to another aspect of the embodiment, a semiconductor device manufacturing method comprising: forming a device isolation region for defining a plurality of active regions in a semiconductor substrate and forming a first alignment mark in the semiconductor substrate; forming a first gate interconnection which is formed, crossing over one of said plurality of active regions and which is linear and includes the gate electrode of a first transistor, and a second gate interconnection which is formed, crossing over the other of said plurality of active regions and which is linear and in parallel with the first gate interconnection over the semiconductor substrate with a gate insulation film formed therebetween, and forming a second alignment mark over the semiconductor substrate; forming source/drain diffused layers respectively in the active regions on both sides of the gate electrodes; forming the first insulation film over the semiconductor substrate, the first gate interconnection and the second gate interconnection; forming over the first insulation film the second insulation film which is different from the first insulation film in the etching characteristics; forming the first photoresist film over the second insulation film; making alignment by using the second alignment mark and exposing on the first photoresist film a first partial pattern for a first contact hole in the first insulation film, overlapping at least a part of the first gate interconnection; developing the first photoresist film to form a first opening in the first photoresist film at the portion where the first partial pattern has been exposed; etching the second insulation film by using as the mask the first photoresist film with the first opening formed in; forming a second photoresist film over the second insulation film; making alignment by using the first alignment mark to expose on the second photoresist film a second partial pattern for forming the first contact hole in the first insulation film, overlapping at least a part of the source/drain diffused layer of the second transistor; developing the second photoresist film to form a second opening in the second photoresist film at the portion where the second partial pattern has been exposed; etching the second insulation film by using as the mask the second photoresist film with the second opening formed in; etching the first insulation film with the second insulation film as the mask to form in the first insulation film the first contact hole down to the first gate interconnection and the source/drain diffused layer of the second transistor; and burying the first contact layer in the first contact hole.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 5A to 29B are views of the semiconductor device according to the first embodiment in the steps of the method for manufacturing the semiconductor device, which illustrate the method;

DESCRIPTION OF EMBODIMENTS

The proposed semiconductor device manufacturing method has not been always able to provide sufficiently high reliability and yields.

The semiconductor device manufacturing method according to the reference example will be described with reference to FIGS. 49A to 52B. FIGS. 49A to 52B are plan views of the semiconductor device in the steps of the semiconductor device manufacturing method, which illustrate the method.

Figure 49A:
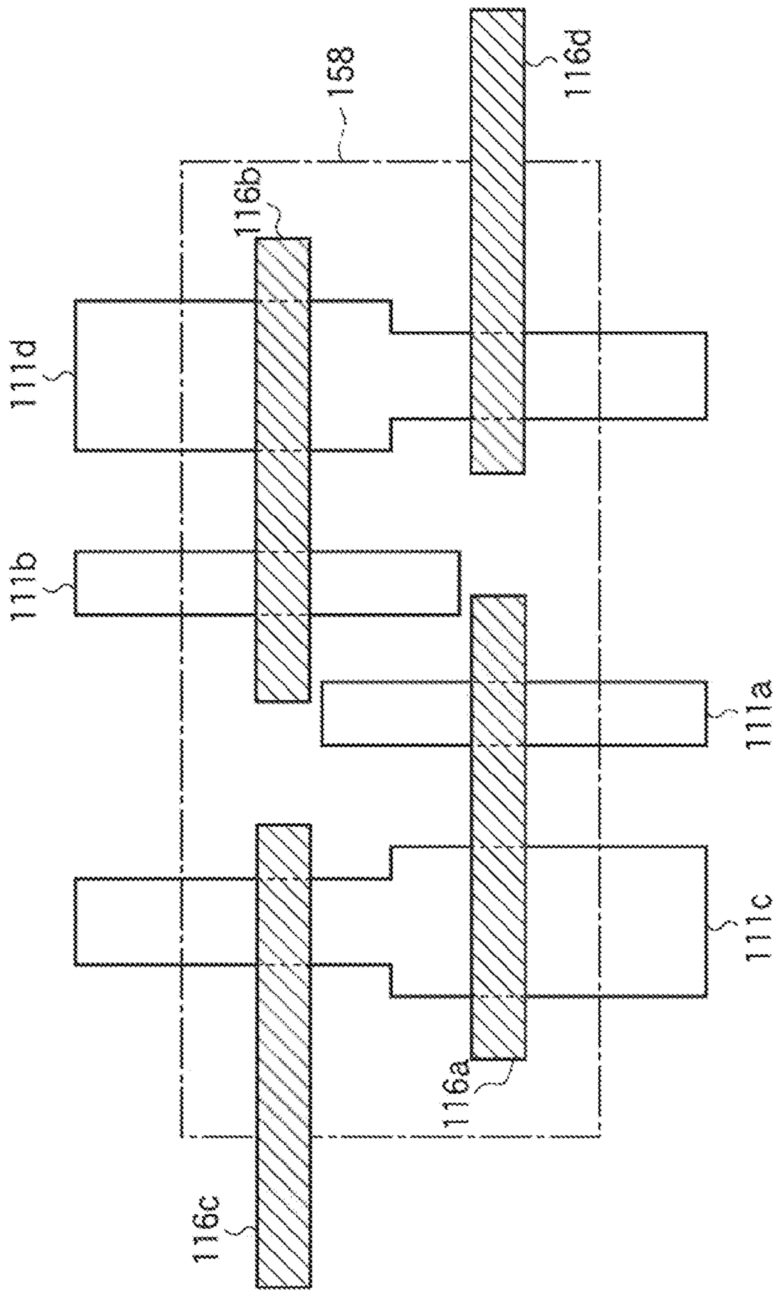
FIGS. 49A to 52B are sectional views of the semiconductor device in the steps of the semiconductor device manufacturing method according to a reference example, which illustrate the method.
Figure 49B:
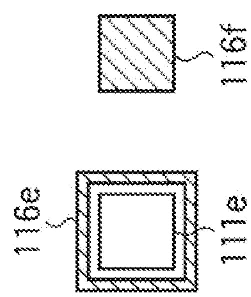
Figure 50A:
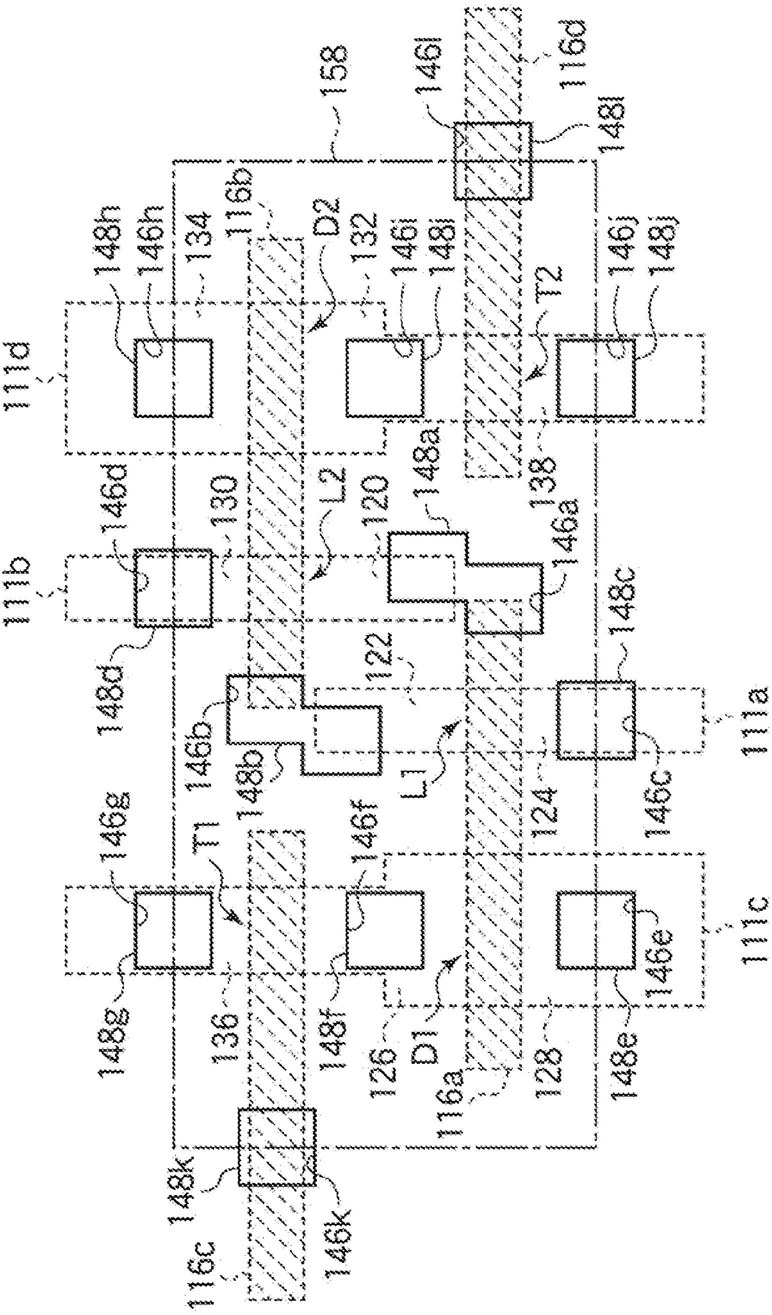
Figure 50B:
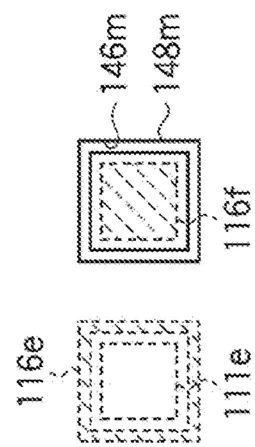

As illustrated in FIGS. 49A and 49B, active regions 111*a*-111*d* defined by a device isolation region (not illustrated) is formed in a part of a semiconductor substrate (not illustrated) a memory cell 158 is to be formed. Simultaneously with forming the active regions 111*a*-111*d*, alignment mark 111*e* is also formed. The alignment mark 111*e* is formed of the same film of the device isolation region defining the active regions 111*a*-111*e*.

Next, gate interconnections 116*a*-116*d* are formed, crossing the active regions 111*a*-111*d*. When the patterns of the gate interconnections 116*a*-116*d* are transferred, the mask (reticle) is aligned with the alignment mark 111*e*. Simultaneously with forming the gate interconnections 116*a*-116*d*, the alignment marks 116*e*, 116*f* are formed. The alignment marks 116*e*, 116*f* are formed of the same film as the gate interconnections 116*a*-116*d*.

Then, in the active regions 111*a*-111*d* on both sides of the gate interconnections 116*a*-116*d*, source/drain diffused layers 120, 122, 124, 126, 128, 130, 132, 134, 136, 138 are formed.

Thus, load transistors L1, L2, driver transistors D1, D2 and transfer transistors T1, T2 are formed.

Next, an inter-layer insulation film (not illustrated) is formed on the semiconductor substrate.

Then, contact holes 146*a*-146*l* are transferred on the inter-layer insulation film. When the contact holes 146*a*-146*l* are transferred, the mask is aligned with the alignment mark 116*f*. Simultaneously with forming the contact holes 146*a*-146*l*, an opening 146*m* of the pattern of the alignment mark for the mask is formed.

Next, contact layers 148*a*-148*l* are buried in the contact holes 148*a*-148*l*. At this time, the alignment mark 148*m* is buried in the opening 146*m* (see FIGS. 50A and 50B).

However, in aligning the mask, disalignments often take place.

Figure 51A:
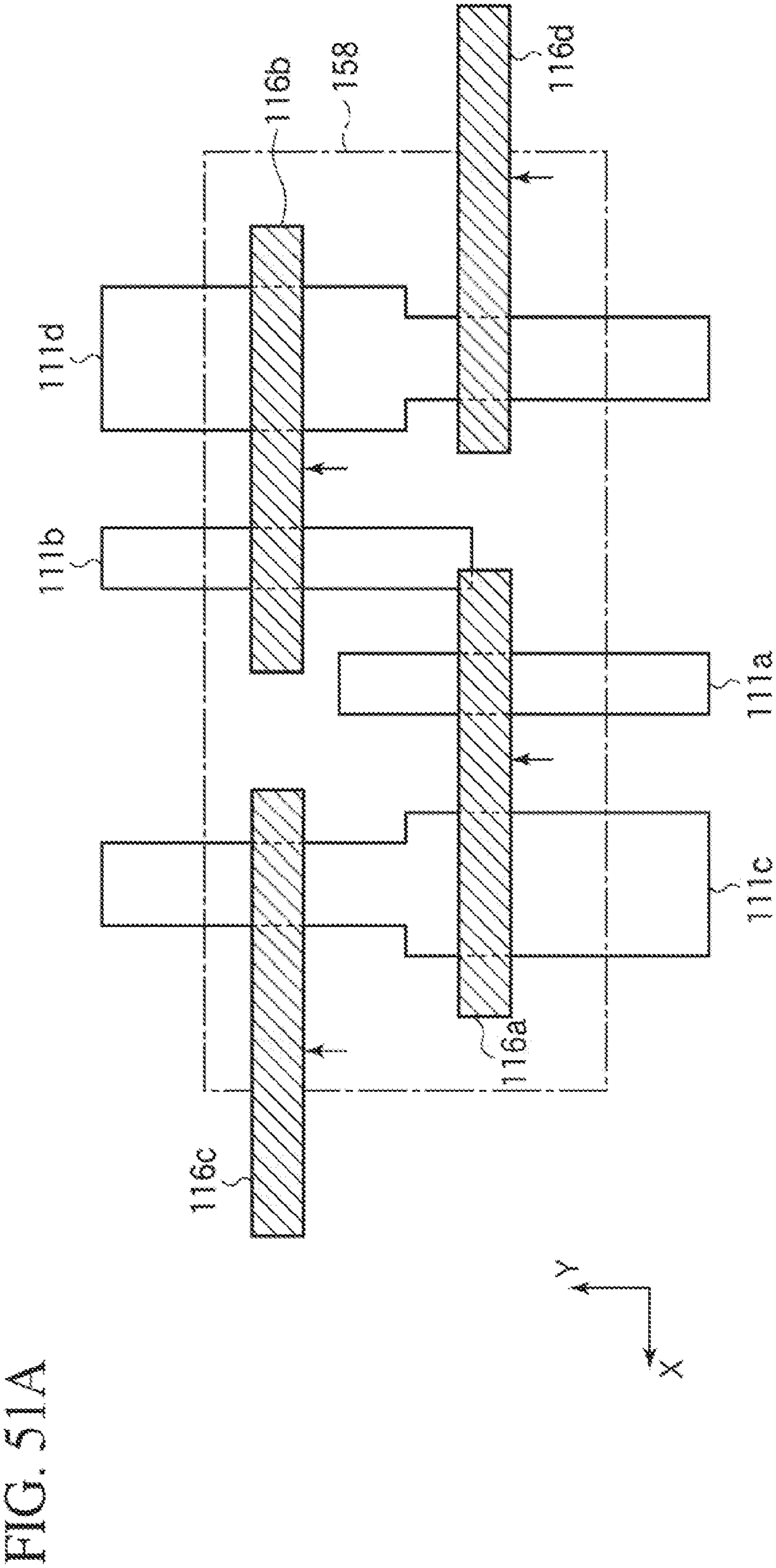
Figure 51B:
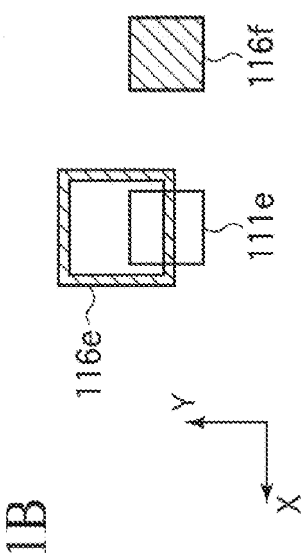

FIGS. 51A and 51B illustrate a case that a large disalignment has taken place in the Y direction in transferring the patterns of the gate interconnections 116*a*-116*d*.

Figure 52A:
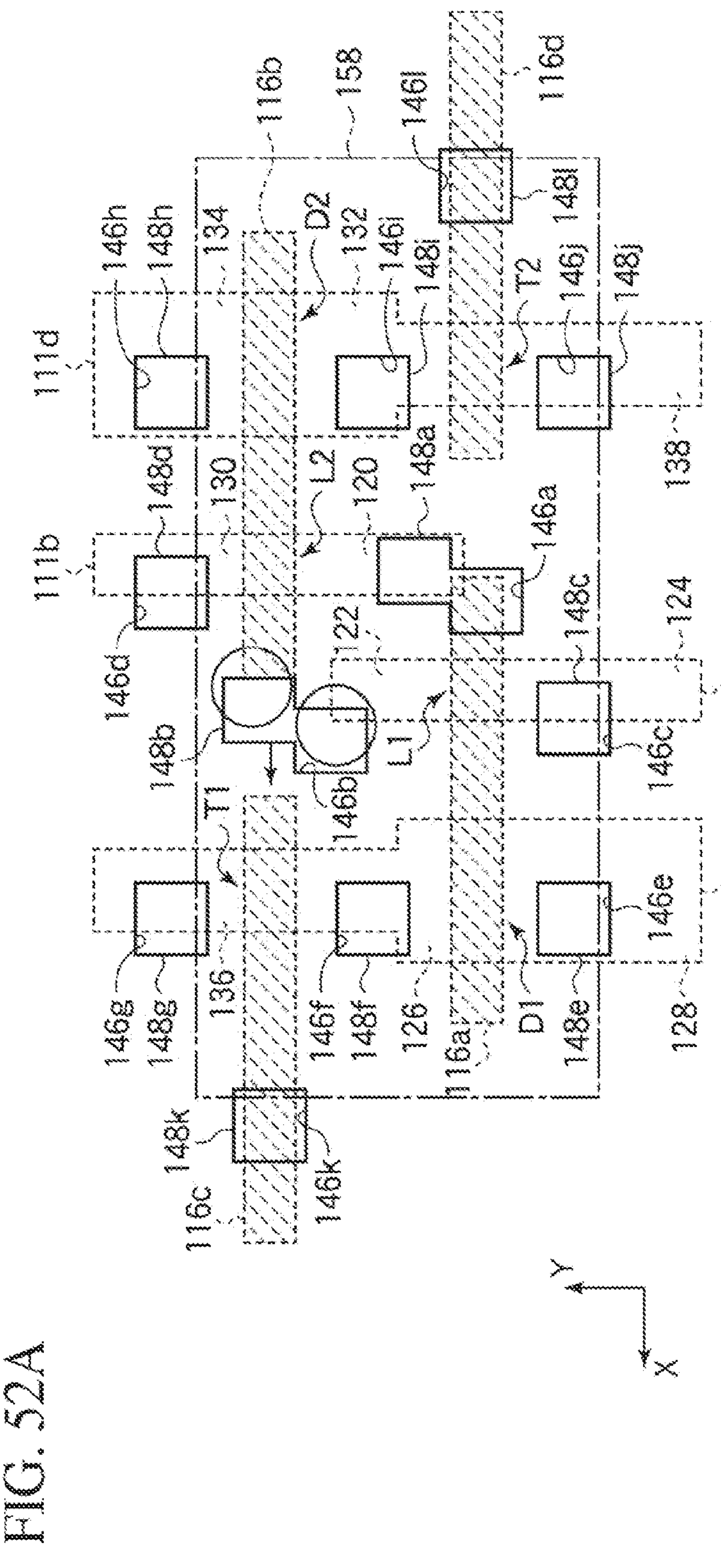
Figure 52B:
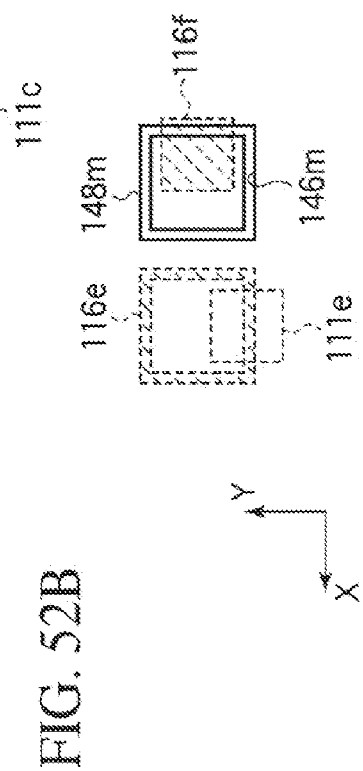

FIGS. 52A and 52*b* illustrate a case that a large disalignment has further taken place in the X direction in transferring the pattern of the contact holes 246*a*.

When such disalignments take place, defective connections often take place between the contact layers 148*a*, 148*b* and the gate interconnections 116*a*, 116*b* in the encircled parts in FIG. 52A. Between the contact layers 148*a*, 148*b* and the source/drain diffused layers 120, 122, defective connections often take place.

The inventors of the present application have made earnest studies and got an idea that a semiconductor device of high reliability can be manufactured in the following way with high yields.

Preferred embodiments of the present invention will be explained with reference to accompanying drawings.

[a] First Embodiment

The semiconductor device according to a first embodiment and its manufacturing method will be described with reference to FIGS. 1A to 33B.

The Semiconductor Device

Figure 1A:
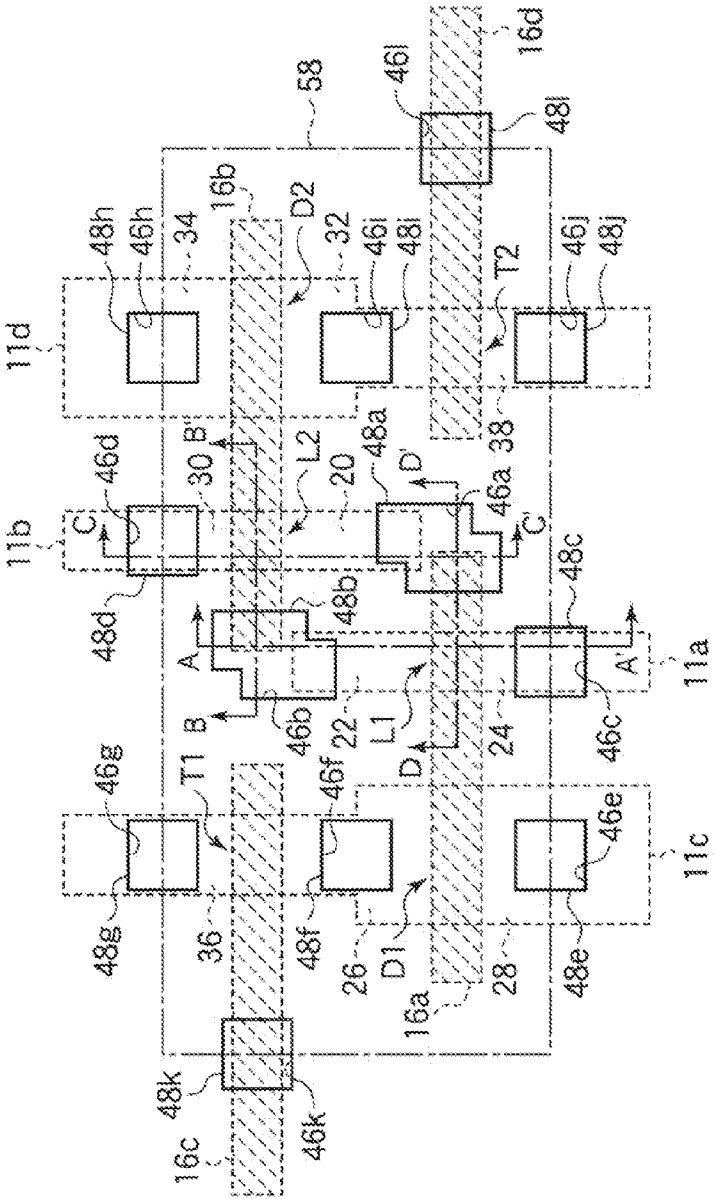
FIGS. 1A and 1B are plan views of the semiconductor device according to a first embodiment (Part 1)
Figure 1B:
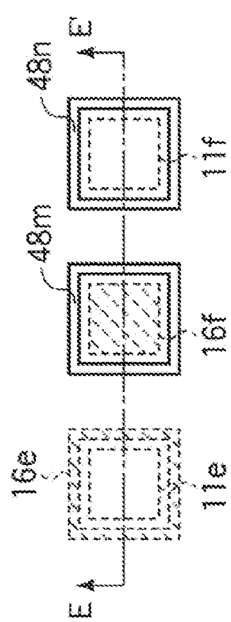
Figure 2A:
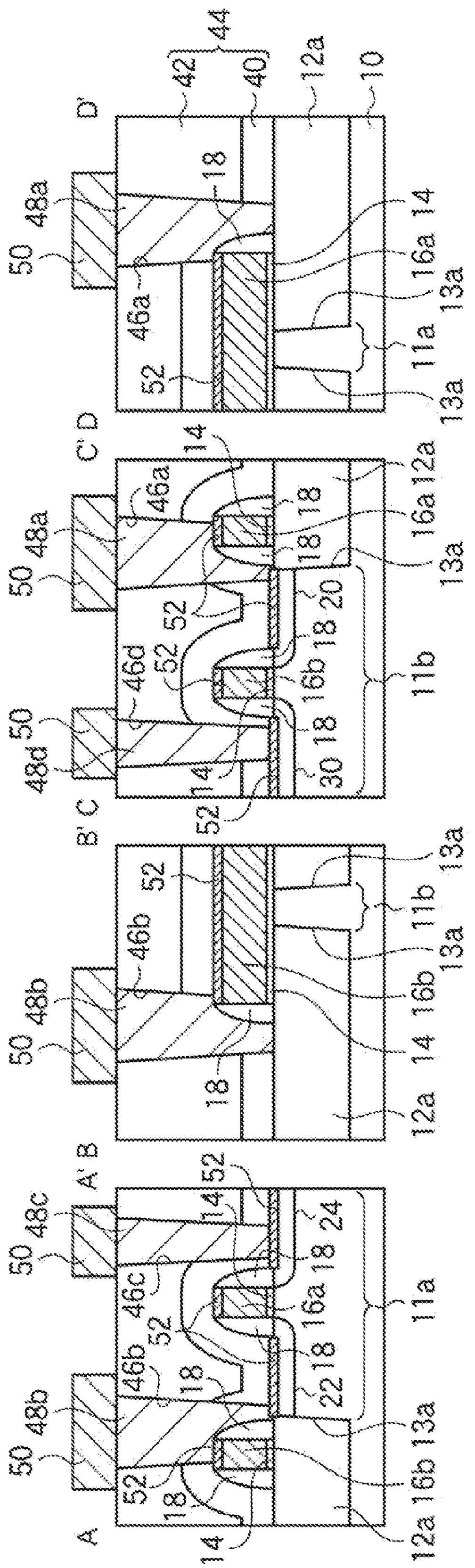
FIGS. 2A and 2B are sectional views of the semiconductor device according to the first embodiment.
Figure 2B:
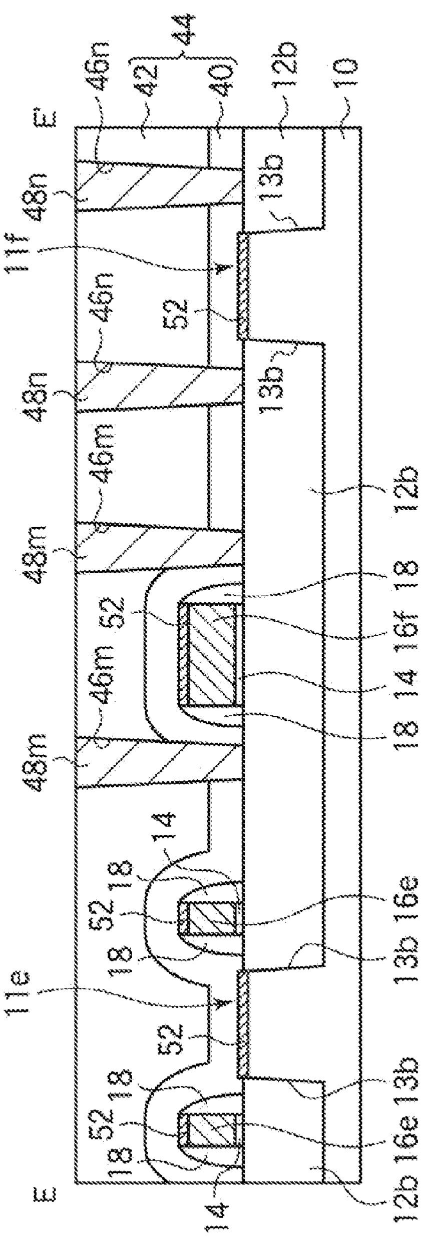
Figure 3:
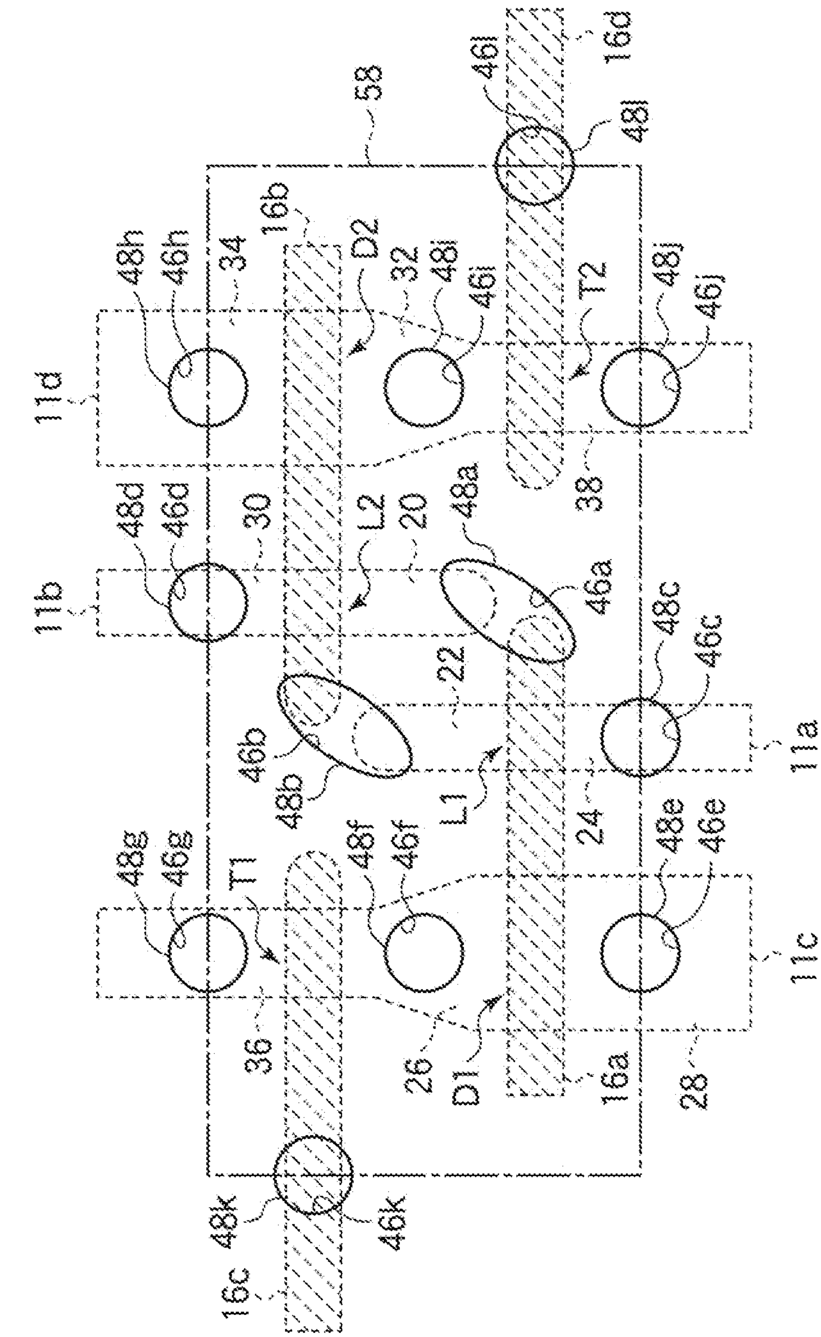
FIG. 3 is a plan view of the semiconductor device according to the first embodiment (Part 2)
Figure 4:
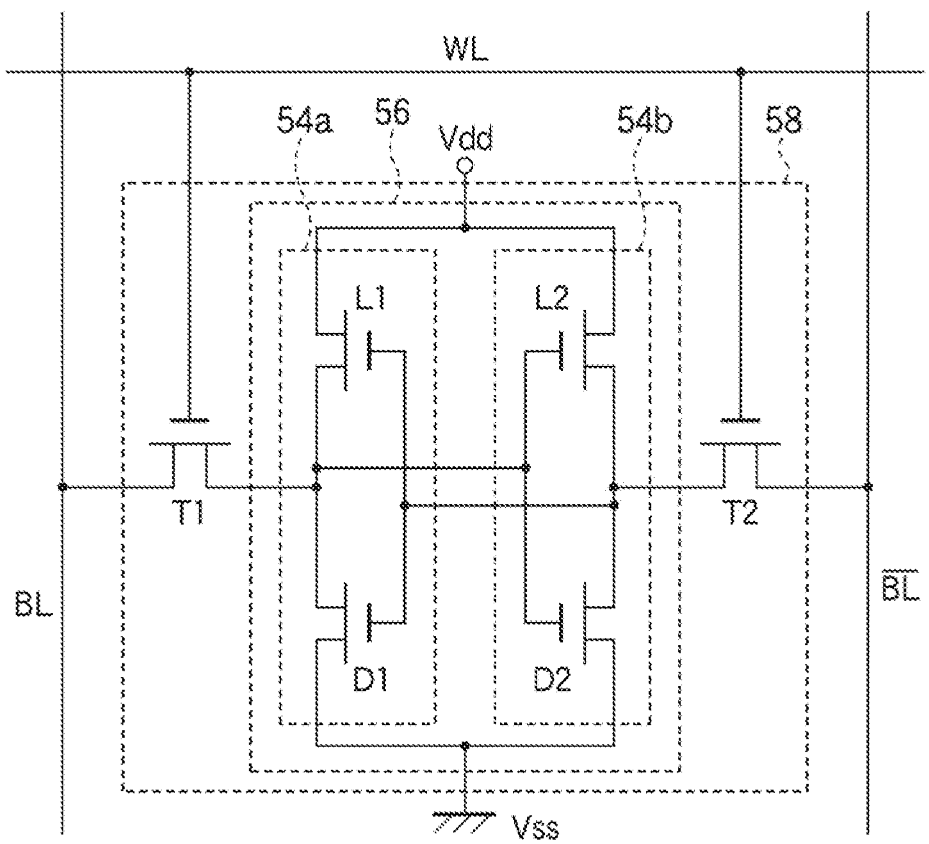
FIG. 4 is a circuit diagram of the semiconductor device according to the first embodiment.

First, the semiconductor device according to the present embodiment will be described with reference to FIGS. 1A to 4. FIGS. 1A and 1B are plan views of the semiconductor device according to the present embodiment (Part 1). FIG. 1A illustrates one of plural memory cells formed in the memory cell region. FIG. 1B illustrates the alignment marks provided in the peripheral part of a semiconductor chip. FIGS. 2A and 2B are sectional views of the semiconductor device according to the present embodiment. The leftmost view of FIG. 2A is the A-A' line sectional view of FIG. 1A. The second view of FIG. 2A from the left is the B-B' line sectional view of FIG. 1A. The third view of FIG. 2A from the left is the C-C' line sectional view of FIG. 1A. The fourth view of FIG. 2A from the left is the D-D' line sectional view of FIG. 1A. FIG. 2B is the E-E' line sectional view of FIG. 1B. FIG. 3 is a plan view (Part 2) of the semiconductor device according to the present embodiment. FIGS. 1A and 1B illustrate the configuration of the design pattern, and FIG. 3 illustrates an example of the configuration of the pattern to be actually formed. FIG. 3 corresponds to FIG. 1A, and FIG. 4 is a circuit view of the semiconductor device according to the present embodiment.

In a semiconductor substrate 10, a device isolation region 12*a* defining the device regions 11*a*-11*d* is formed. The device isolation region 12*a* is buried in a trench 13*a* formed in the semiconductor substrate 10. The semiconductor substrate 10 is, e.g., a silicon substrate. As the device isolation region 12*a*, silicon oxide film, for example, is used.

In the semiconductor substrate 10, alignment marks 11*e*, 11*f* are formed. The alignment marks 11*e*, 11*f* are provided, e.g., in the peripheral part of the semiconductor substrate (semiconductor chip) 10. The alignment marks 11*e*, 11*f* are defined by the same insulation film 12*b* as the device isolation region 12*a*. The insulation film 12*b* defining the alignment marks 11*e*, 11*f* is buried in the trench 13*b* formed in the semiconductor substrate 10.

The plane shape of the alignment marks 11*e*, 11*f* is, e.g., a rectangle.

The plane shape of the alignment marks 11*e*, 11*f* is not limited to rectangle. The plane shapes of the alignment marks 11*e*, 11*f* can be, e.g., a frame shape or others.

On the semiconductor substrate 10, gate interconnections 16*a*-16*d* are formed with a gate insulation film 14 formed therebetween. On the semiconductor substrate 10, alignment marks 16_e_, 16_f_ are formed with the insulation film 14 formed therebetween. The alignment marks 16_e_, 16_f_ are formed of the same film as the gate interconnections 16_a_-16_d_. That is, the gate interconnections 16_a_-16_d_ and the alignment marks 16_e_, 16_f_ are formed by patterning the same film.

The plane shape of the alignment mark 16_e_ is, e.g., a frame-shape.

The plane shape of the alignment mark 16_e_ is not limited to a frame-shape. The plane shape of the alignment mark 16_e_ can be a rectangle or others.

The plane shape of the alignment mark 16_f_ is, e.g., a rectangle.

The plane shape of the alignment mark 16_f_ is not limited to a rectangle. The plane shape of the alignment mark 16_f_ can be, e.g., a frame shape or others.

A sidewall insulation film 18 is formed on the respective side walls of the gate interconnections 16_a_-16_d_ and the alignment marks 16_e_, 16_f_.

The gate interconnection 16_a_ is formed, crossing the device regions 11_a_, 11_c_. The gate interconnection 16_a_ includes the gate electrode of a load transistor L1, the gate electrode of a driver transistor D1 and commonly connects the gate electrode of the load transistor L1 and the gate electrode of the driver transistor D1. The gate interconnection 16_a_ is extended to the vicinity of the source/drain diffusion layers 20 of the load transistor L2 formed in the device region 11_b_.

In the device region 11_a_ on both sides of the gate interconnection 16_a_, source/drain regions 22, 24 are formed. The gate electrode 16_a_ and the source/drain diffused layers 22, 24 form the load transistor L1.

In the device region 11_c_ on both sides of the gate interconnection 16_a_, source/drain diffused layers 26, are formed. The gate electrode 16_a_ and the source/drain diffused layer 26, 28 form the driver transistor D1.

The gate interconnection 16_b_ is formed, crossing the device regions 11_b_, 11_d_. The gate interconnection 16_b_ includes the gate electrode of the load transistor L2 and the gate electrode of the driver transistor D2 and commonly connects the gate electrode of the load transistor L2 and the gate electrode of the driver transistor D2. The gate interconnection 16_b_ is extended to the vicinity of the source/drain diffused layer 22 of the load transistor L1 formed in the device region 11_a_. The longitudinal direction of the gate interconnection 16_a_ and the longitudinal direction of the gate interconnection 16_b_ are the same. The gate interconnections 16_a_ and the gate interconnection 16_b_ are opposed to each other in a partial region.

In the device region 11_b_ on both sides of the gate interconnection 16_b_, source/drain diffused layers 20, are formed. The gate electrode 16_b_ and the source/drain diffused layer 20, 30 form the load transistor L2.

In the device region 11_d_ on both sides of the gate interconnection 16_b_, source/drain diffused layers 32, are formed. The gate electrode 16_b_ and the source/drain diffused layers 32, 34 form the driver transistor D2.

The gate interconnection 16_c_ is formed, crossing the device region 11_c_. The gate interconnection 16_c_ is positioned on the extended line of the gate interconnection 16_b_. The gate interconnection 16_c_ includes the gate electrode of a transfer transistor T1. Source/drain diffused layers 26, 36 are formed in the device region 11_c_ on both sides of the gate interconnection 16_c_. The gate electrode 16_c_ and the source/drain diffused layers 26, 36 form the transfer transistor T1. One of the source/drain diffused layers 26 of the transfer transistor T1 and one of the source/drain diffused layers 26 of the driver transistor D1 are formed of the common source/drain diffused layer 26.

The gate interconnection 16_d_ is formed, crossing the device region 11_d_. The gate interconnection 16_d_ is positioned on the extended line of the gate interconnection 16_a_. The gate interconnection 16_d_ includes the gate electrode of a transfer transistor T2. Source/drain diffused layers 32, 38 are formed in the device region 11_d_ on both sides of the gate electrode 16_d_. The gate electrode 16_d_ and the source/drain diffused layers 32, 38 form the transfer transistor T2. One of the source/drain diffused layers 32 of the transfer transistor T2 and one of the source/drain diffused layers of the driver transistor D2 is formed of the common source/drain diffused layer 32.

The width of the gate interconnections 16_a_-16_d_, e.g., the gate length is, e.g., about 35-60 nm. The height of the gate interconnections 16_a_-16_d_ is, e.g., about 70-100 nm. The interval between the gate interconnections 16_a_, 16_d_ and the gate interconnections 16_b_, 16_c_, i.e., the pitch of the gate interconnections is, e.g., about 0.16-0.2 μm.

On the source/drain diffused layers 20, 22, 24, 26, 28, 30, 32, 34, 36, 38, a silicide film 52 of, e.g., nickel silicide is formed. The silicide film 52 on the source/drain diffused layers 20, 22, 24, 26, 28, 30, 32, 34, 36, 38 functions as the source/drain electrodes. On the gate interconnections 16_a_-16_d_, the silicide film 52 of, e.g., nickel silicide is formed.

On the semiconductor substrate 10 with these transistors L1, L2, D1, D2, T1, T2 formed on, an insulation film 40 of, e.g., silicon nitride is formed. The insulation film 40 is formed, filling the gaps between the gate electrodes 16_a_-16_d_.

On the semiconductor substrate 10 with the insulation film 40 formed on, an insulation film 42 of, e.g., silicon dioxide is formed. The surface of the insulation film 42 is planarized by polishing. The insulation film 40 and the insulation film 42 form an inter-layer insulation film 44.

In the inter-layer insulation film 44, a contact hole (opening) 46_a_ for exposing the end of the gate interconnection 16_a_ and the source/drain diffused layer 20 of the load transistor L2 is formed. The shape of the section of the opening 46_a_ in the direction parallel with the surface of the semiconductor substrate 10 is, e.g., substantially elliptical (see FIG. 3). In the opening 46_a_, a contact layer (conductor plug) 48_a_ of, e.g., tungsten is buried.

In the inter-layer insulation film 44, an opening 46_b_ for integrally exposing the end of the gate interconnection 16_b_ and the source/drain diffused layer 22 of the load transistor L1 is formed. The shape of the section of the opening 46_b_ in the direction parallel with the surface of the semiconductor substrate 10 is, e.g., substantially elliptical (see FIG. 3). In the opening 46_b_, a contact layer 48_b_ of, e.g., tungsten is buried.

The contact layers 48_a_, 48_b_ are called shared contacts.

In the inter-layer insulation film 44, an opening 46_c_ for exposing the source/drain diffused layer of the load transistor L1 and an opening 46_d_ for exposing the source/drain diffused layer 30 of the load transistor L2 are formed. In the inter-layer insulation film 44, an opening 46_e_ for exposing the source/drain diffused layer 28 of the driver transistor D1 and an opening 46_f_ for exposing the common source/drain diffused layer 26 of the driver transistor D1 and the transfer transistor T1 are formed. In the inter-layer insulation film 44, an opening 46_g_ for exposing the source/drain diffused layer 36 of the driver transistor T1 and an opening 46_h_ for exposing the source/drain diffused layer of the driver transistor D2 are formed. In the inter-layer insulation film 44, an opening 46_i_ for exposing the common source/drain diffused layer 32 of the driver transistor D2 and the transfer transistor T2 and an opening 46_j_ for exposing the source/drain diffused layer 38 of the driver transistor T2 are formed. In the inter-layer insulation film 44, an opening 46*k* for exposing the gate interconnection 16*c* and an opening 46*l* for exposing the gate interconnection 16*d* are formed.

The shape of the section of the openings 46*c*-46*l* in the direction parallel with the surface of the semiconductor substrate 10 is, e.g., substantially circular (see FIG. 3). The diameter of the openings 46*c*-46*l* is, e.g., 50-80 nm. In the openings 46*c*-46*l*, contact layers 48*c*-48*l* of, e.g., tungsten are buried.

In the inter-layer insulation film 44, openings 46*m*, 46*n* are formed down to the insulation film 12*b*. In the openings 46*m*, 46*n*, alignment marks 48*m*, 48*n* are buried.

The plane shape of the alignment marks 48*m*, 48*n* is, e.g., a frame shape.

The plane shape of the alignment marks 48*m*, 48*n* are not especially limited to the frame shape. The plane shapes of the alignment marks 48*m*, 48*n* can be, e.g., a rectangle or others.

On the inter-layer insulation film 44, interconnections 50 (see FIGS. 2A and 2B) connected respectively to the contact layers 48*a*-48*l* are formed.

The contact layer 48*a* and the contact layer 48*i* are electrically connected by the interconnection 50. The contact layer 48*b* and the contact layer 48*f* are electrically connected by the interconnection 50.

The interconnection 50 connected to the contact layers 48*c*, 48*d* are electrically connected to a source voltage Vdd (see FIG. 4). The interconnection 50 connected to the contact layers 48*e*, 48*h* are electrically connected to a source voltage Vss (see FIG. 4).

The interconnections 50 connected to the contact layers 46*g*, 46*j* are electrically connected to the bit lines BL (see FIG. 4). The gate interconnections 16*a*, 16*b* are electrically connected to the word line WL (see FIG. 4) via contact layers not illustrated and the interconnections 50.

FIG. 4 is a circuit diagram of the memory cell of the semiconductor device according to the present embodiment.

As illustrated in FIG. 4, the load transistor L1 and the driver transistor D1 form an inverter 54*a*. The load transistor L2 and a driver transistor D2 form an inverter 54*b*. The inverter 54*a* and the inverter 54*b* form a flip-flop circuit 56. The flip-flop circuit 56 is controlled by the transfer transistors T1, T2 connected to the bit lines BL and the word line WL. The load transistors L1, L2, the driver transistors D1, D2 and the transfer transistors T1, T2 form the memory cell 58.

The Method for Manufacturing the Semiconductor Device

Figure 11A:
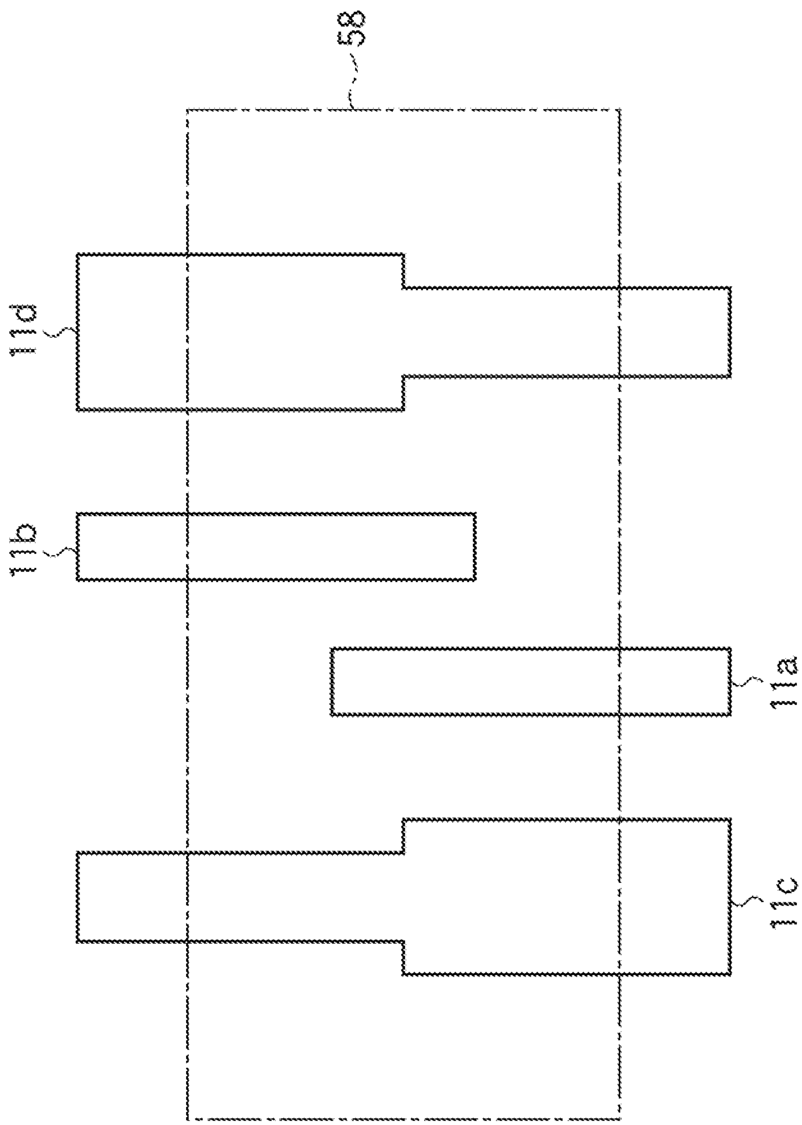
Figure 11B:
Figure 12A:
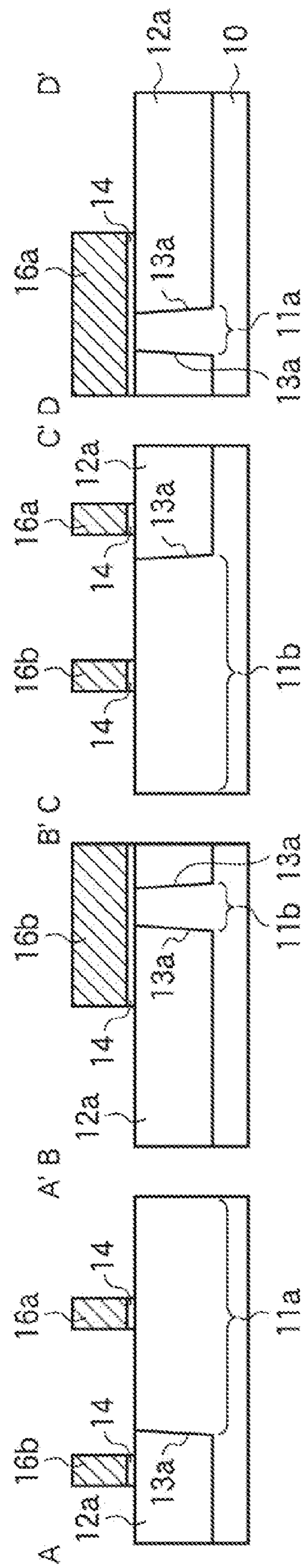
Figure 12B:
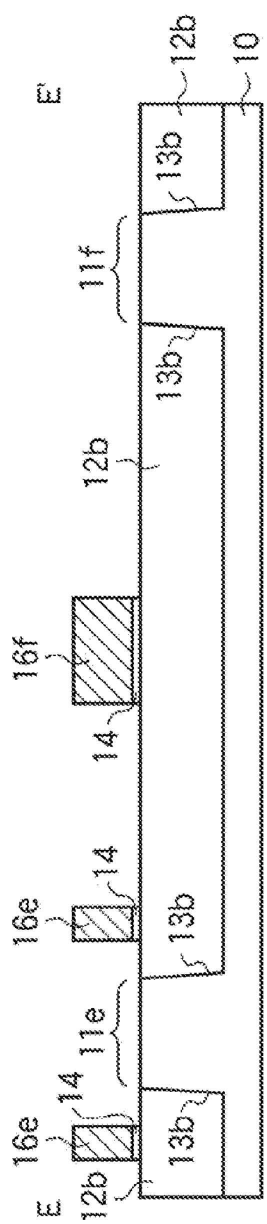
Figure 13A:
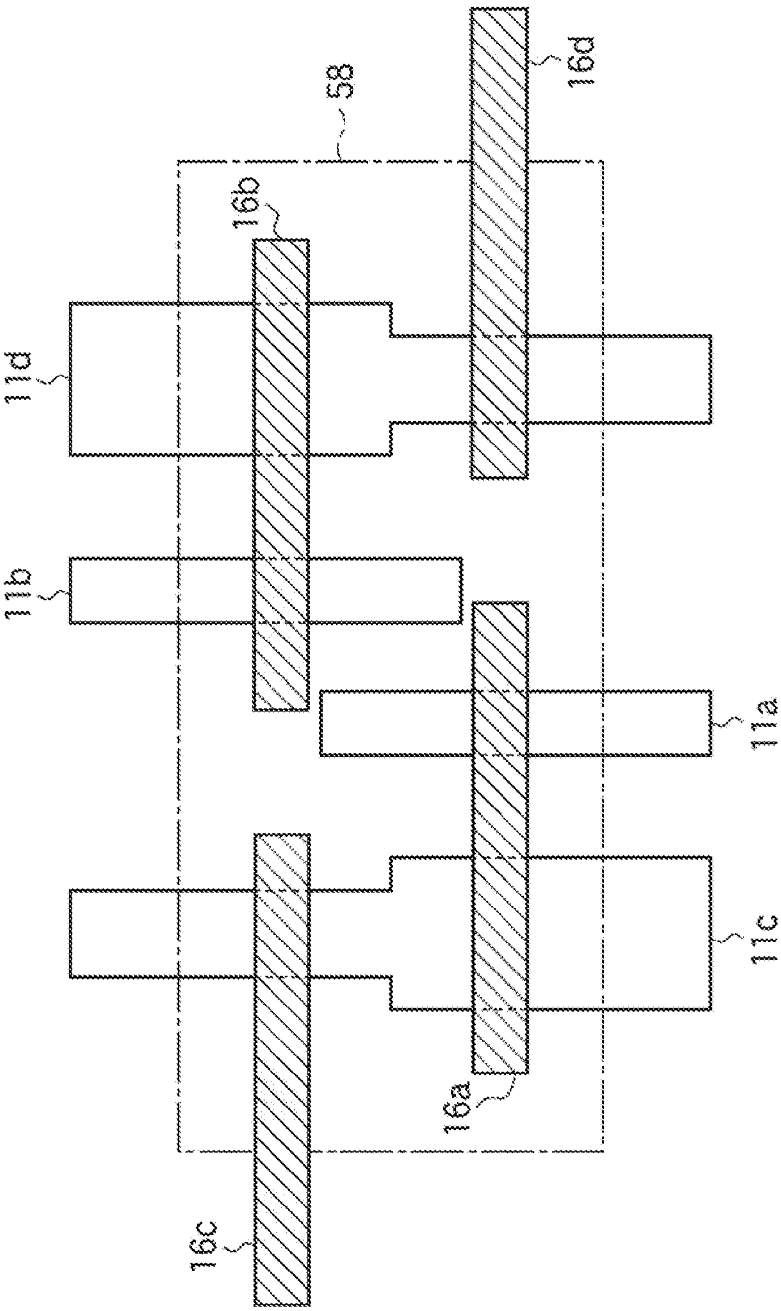
Figure 13B:
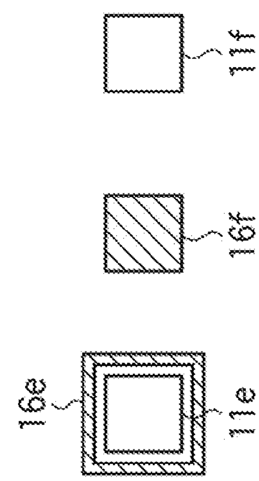
Figure 14A:
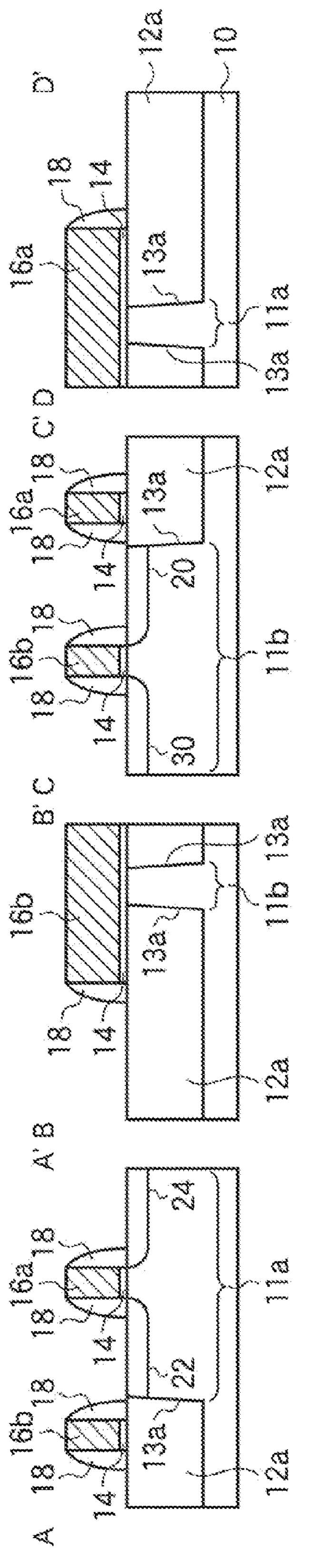
Figure 14B:
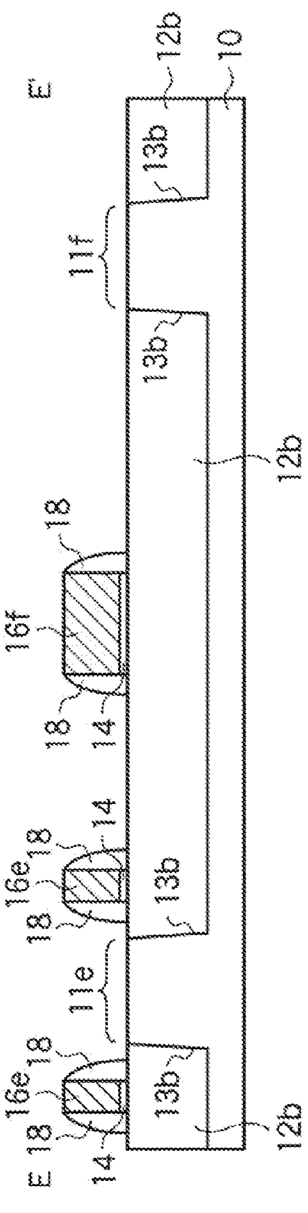
Figure 15A:
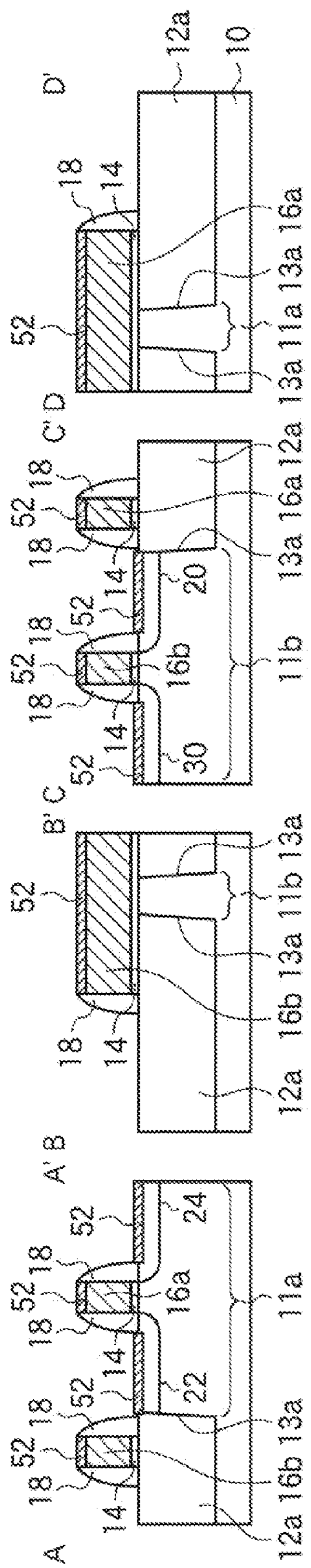
Figure 15B:
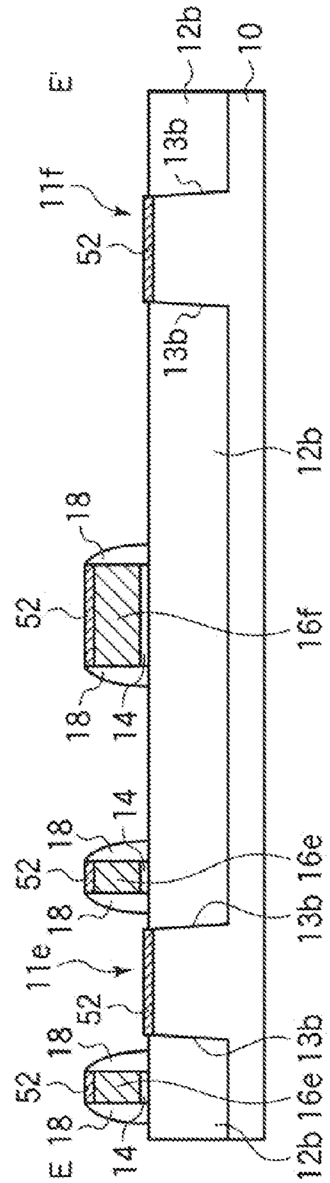
Figure 16A:
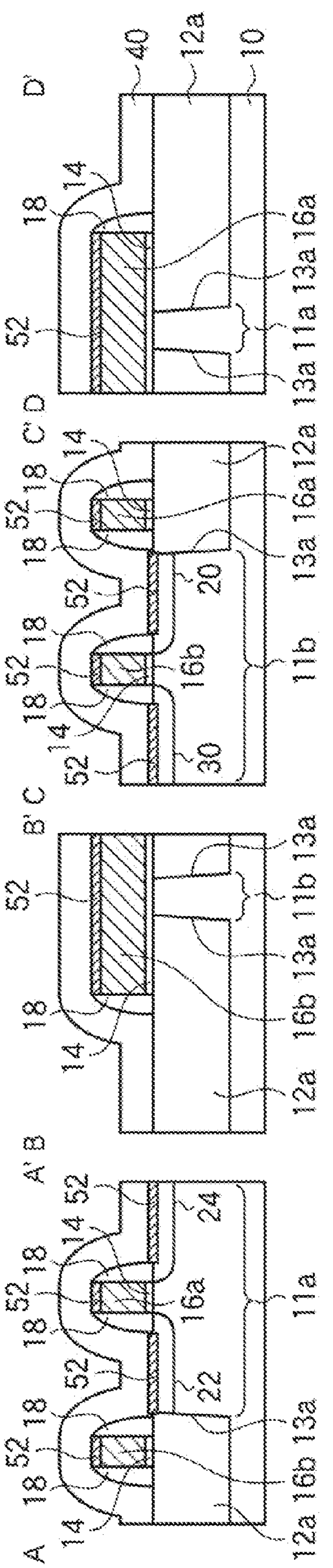
Figure 16B:
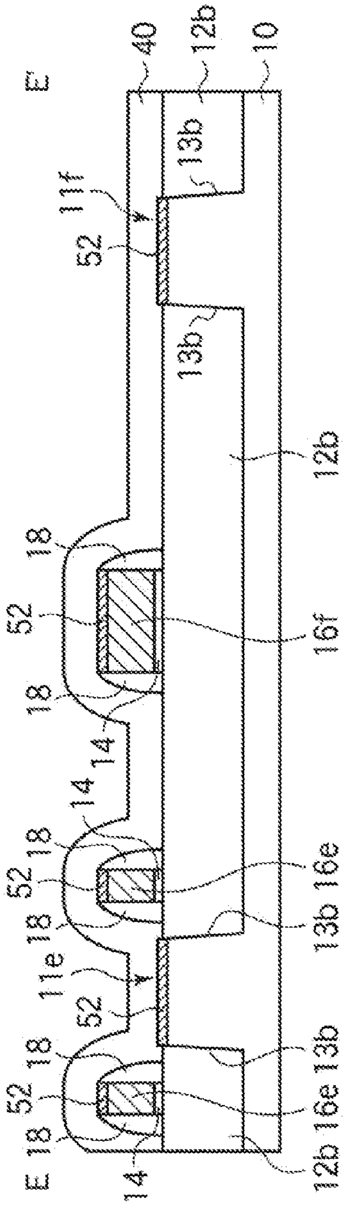
Figure 17A:
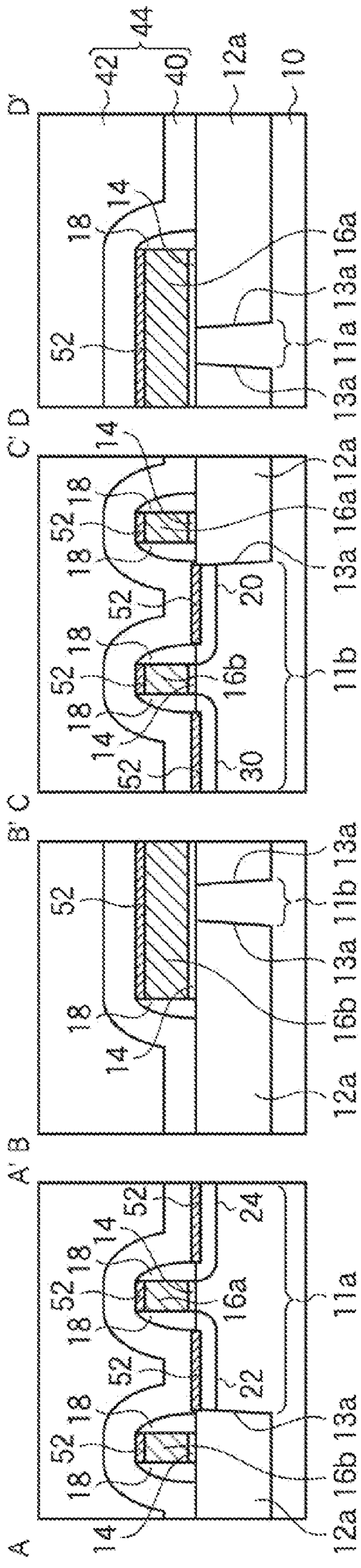
Figure 17B:
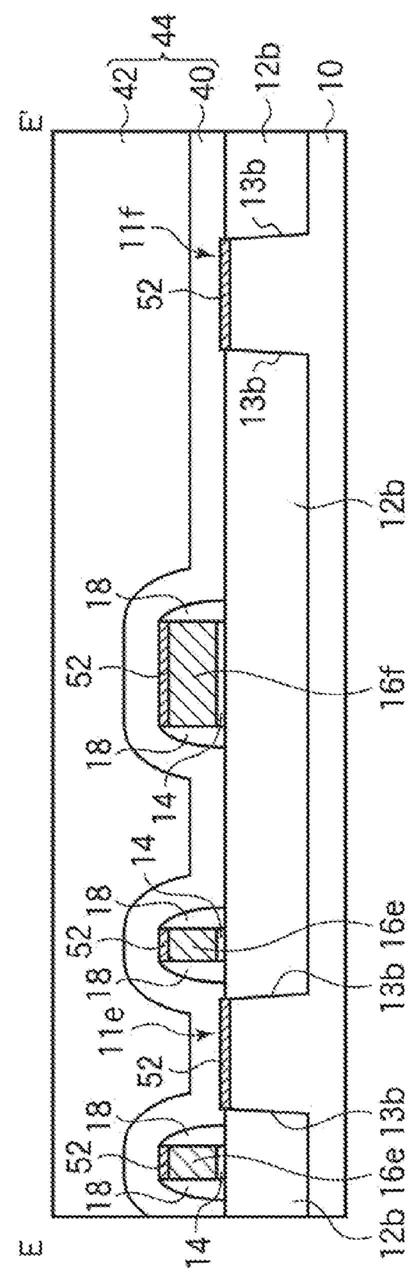
Figure 20A:
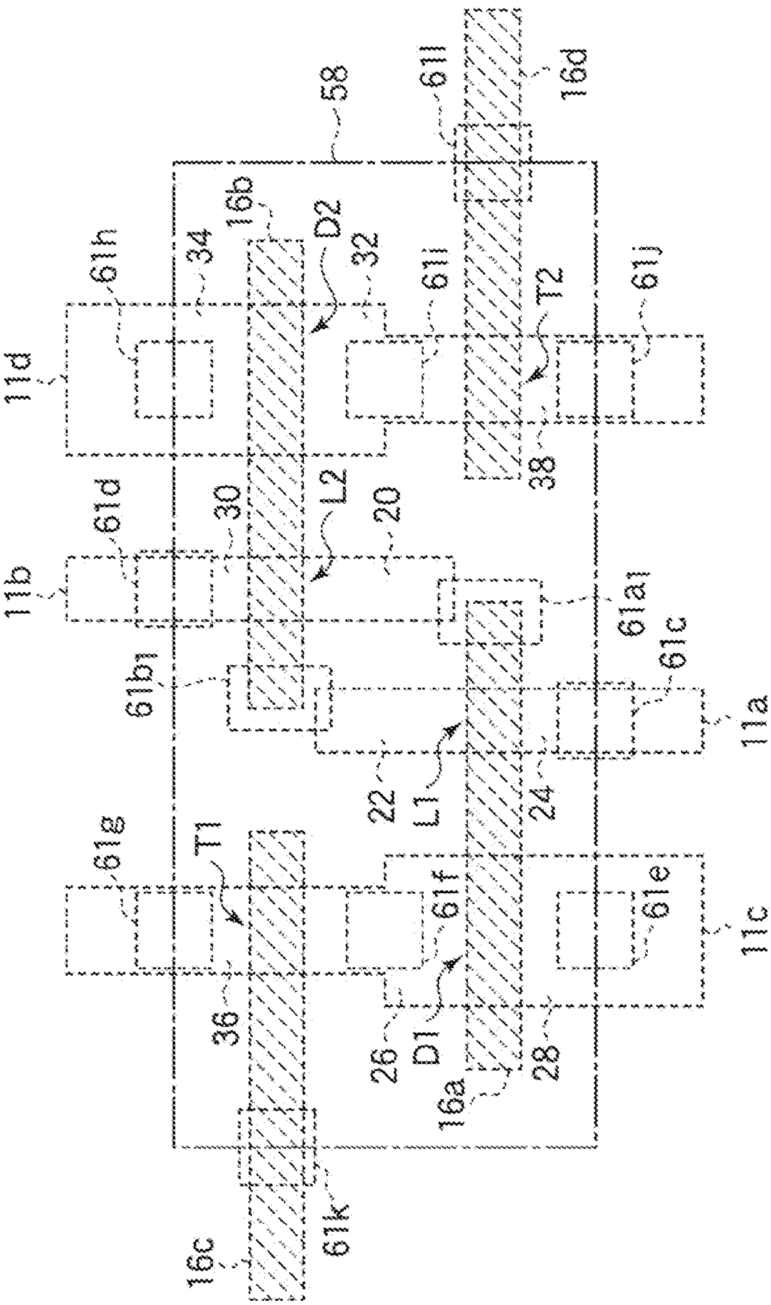
Figure 20B:
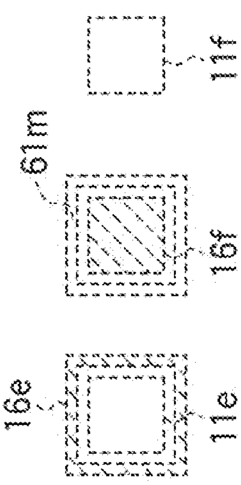
Figure 21A:
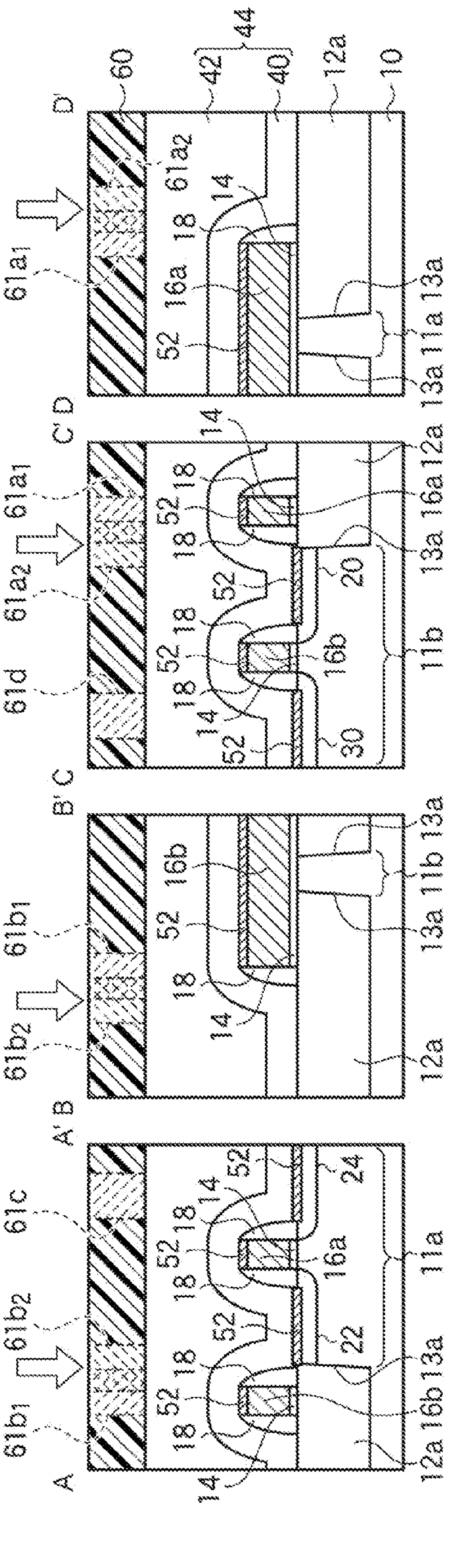
Figure 21B:
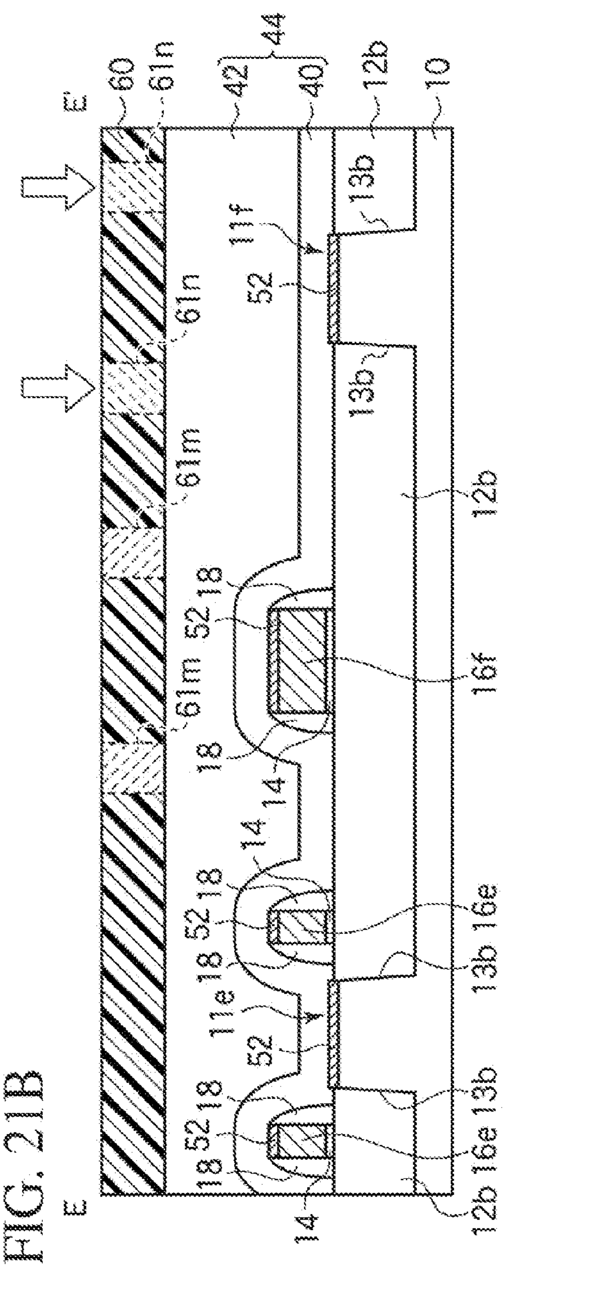
Figure 22A:
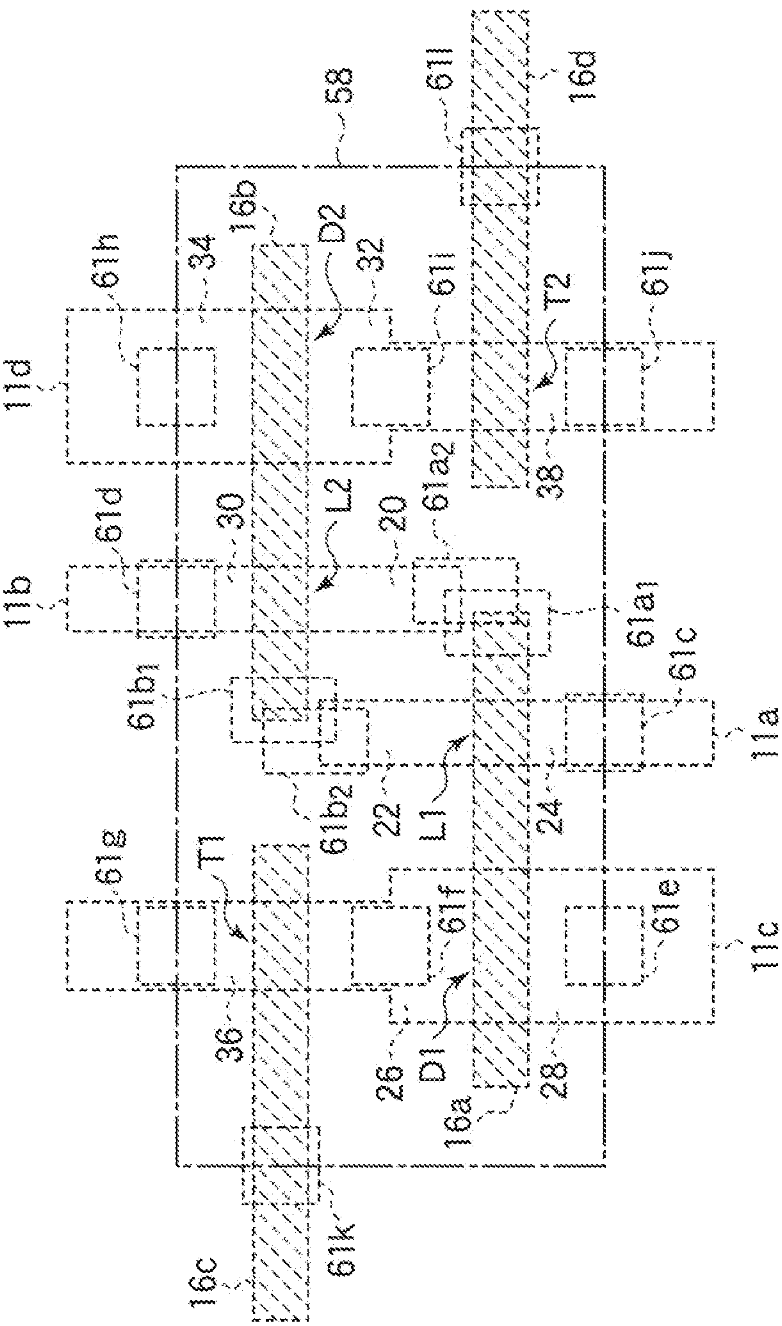
Figure 22B:
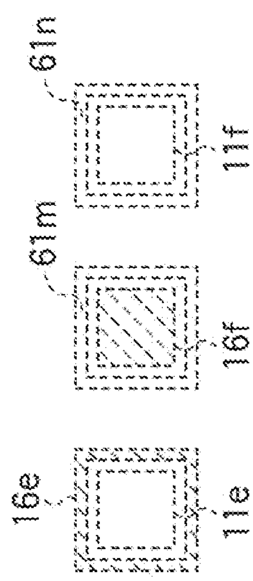
Figure 23A:
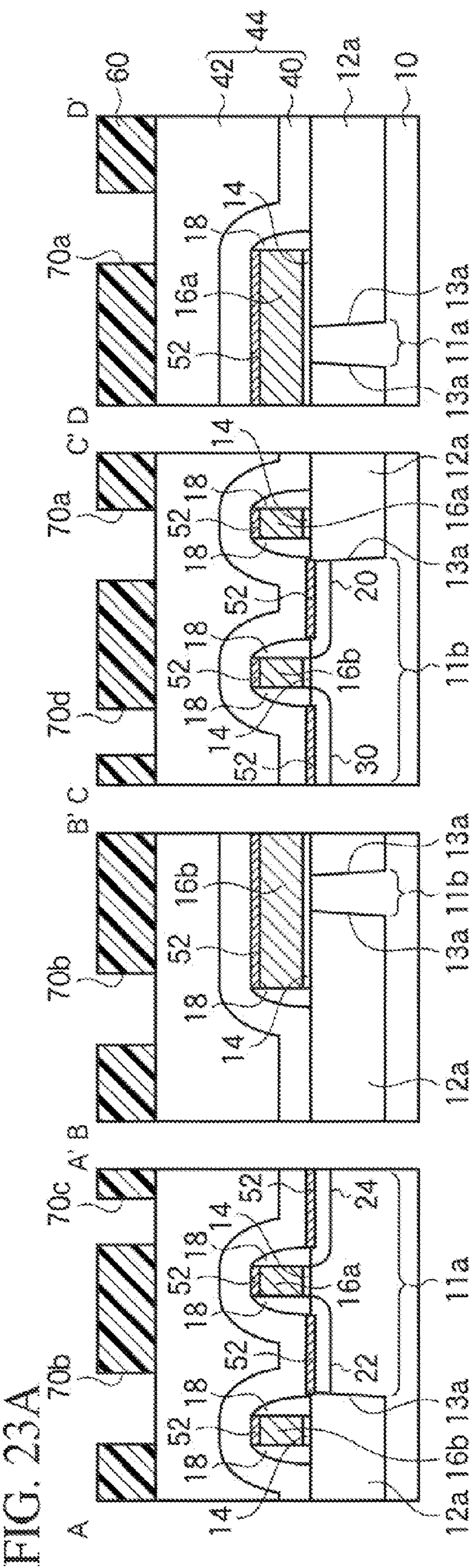
Figure 23B:
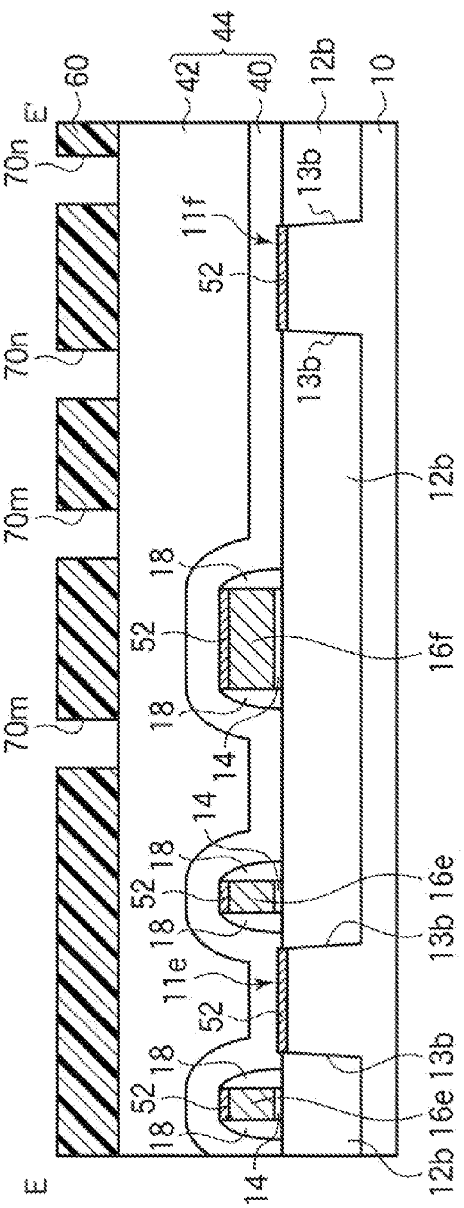
Figure 24A:
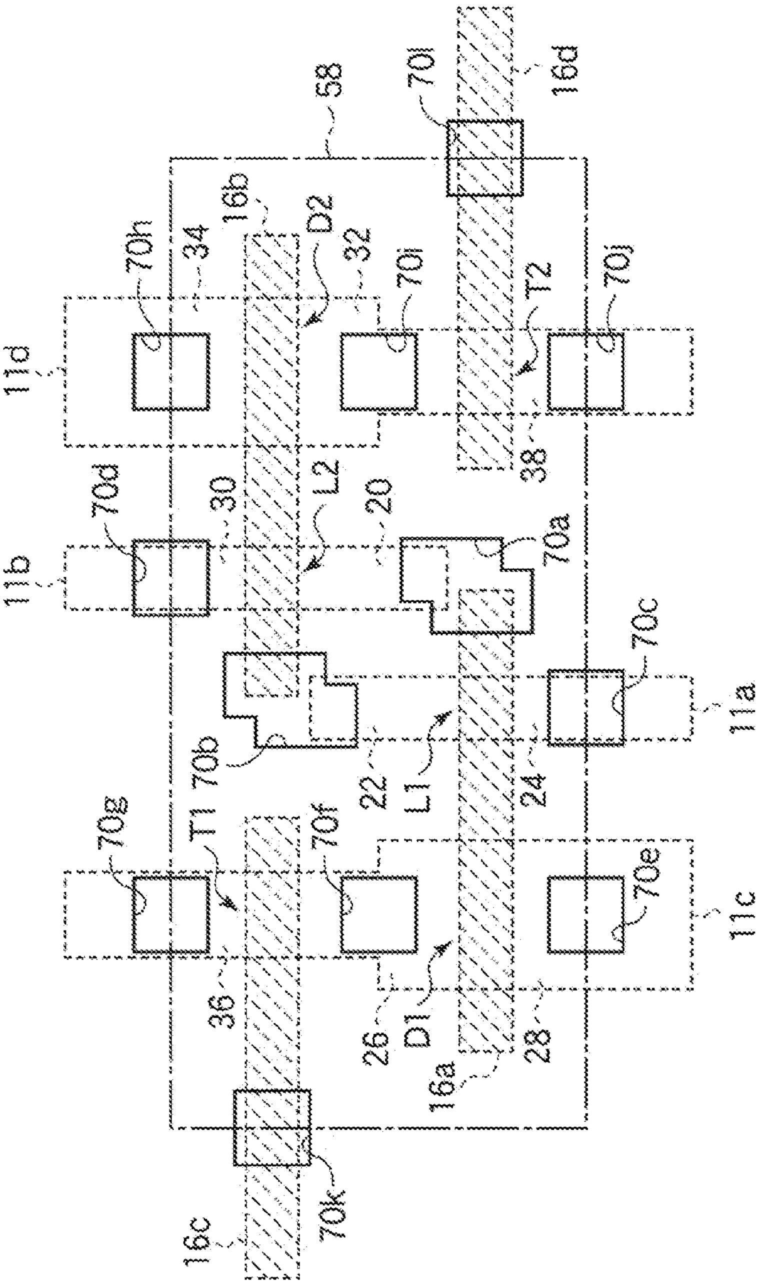
Figure 24B:
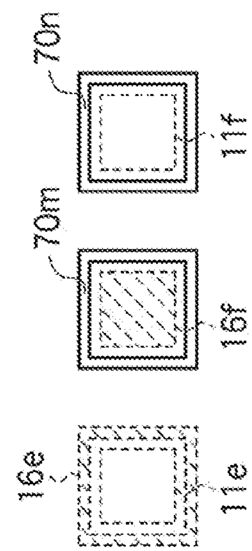
Figure 25A:
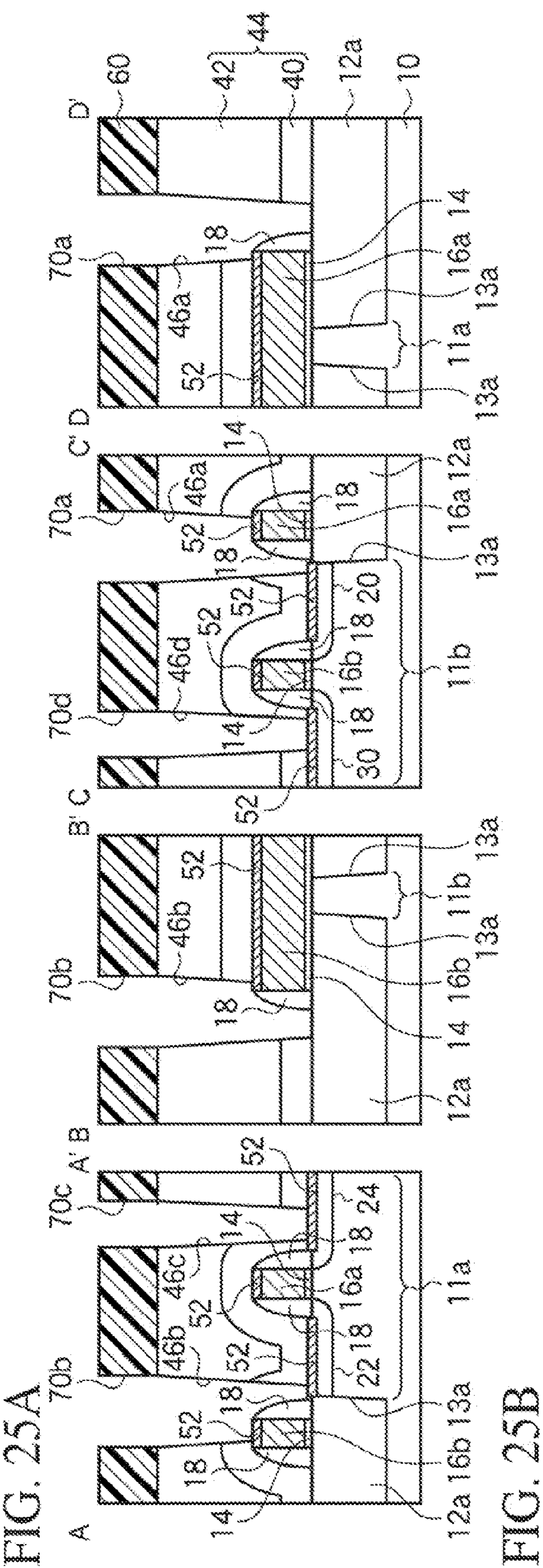
Figure 25B:
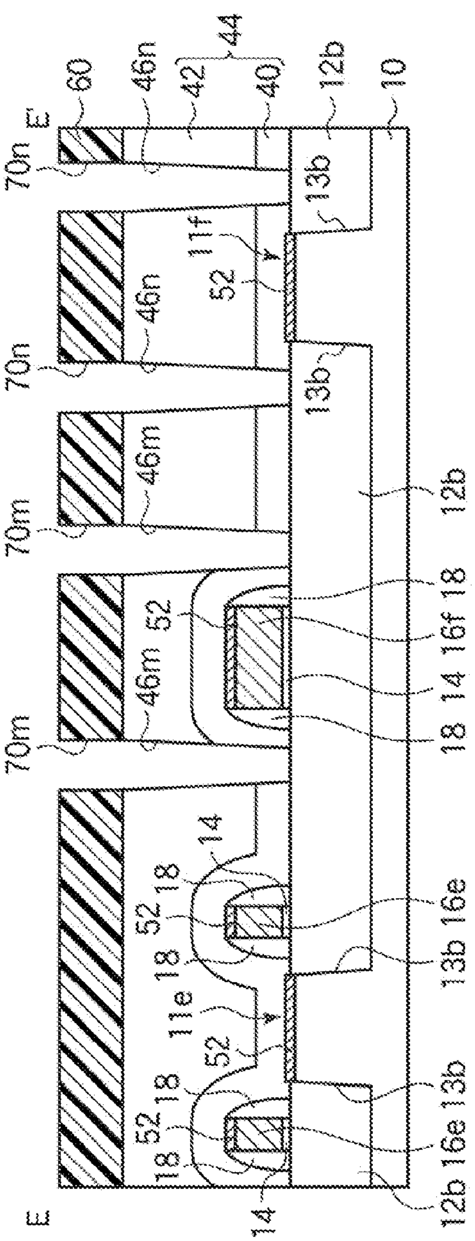
Figure 26A:
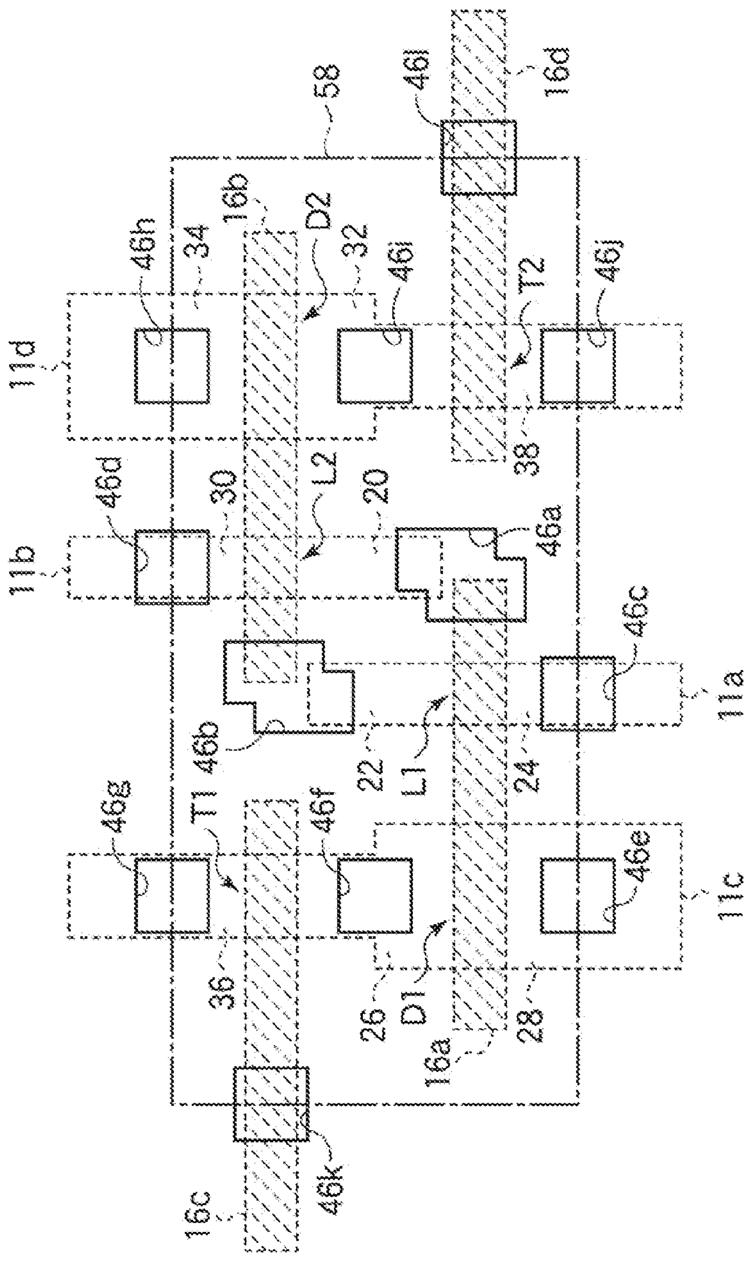
Figure 26B:
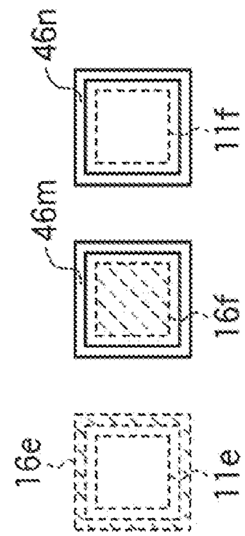
Figure 27A:
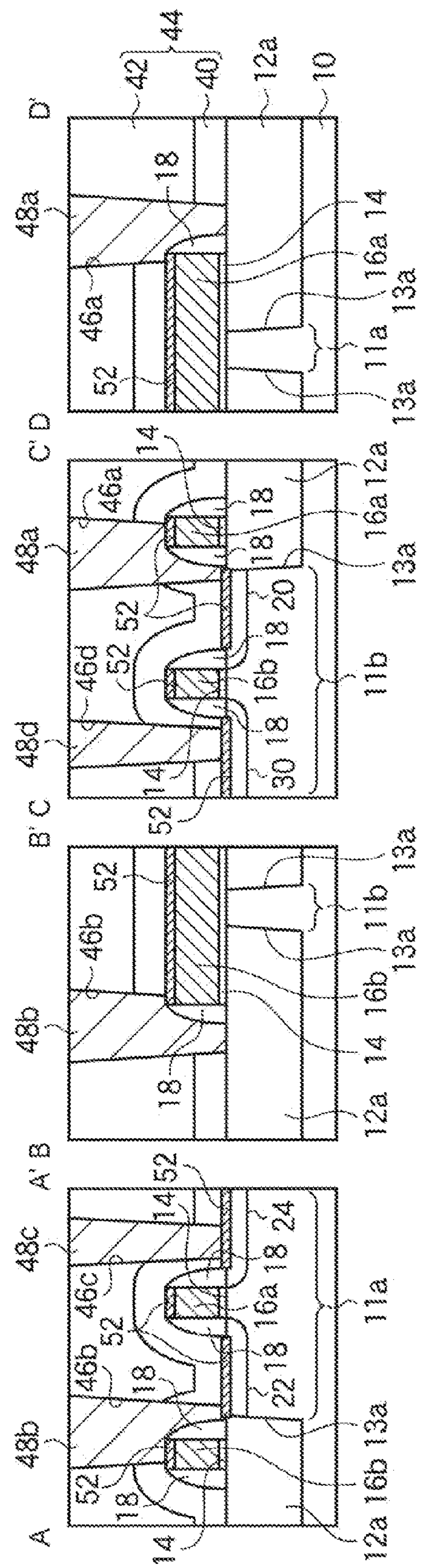
Figure 27B:
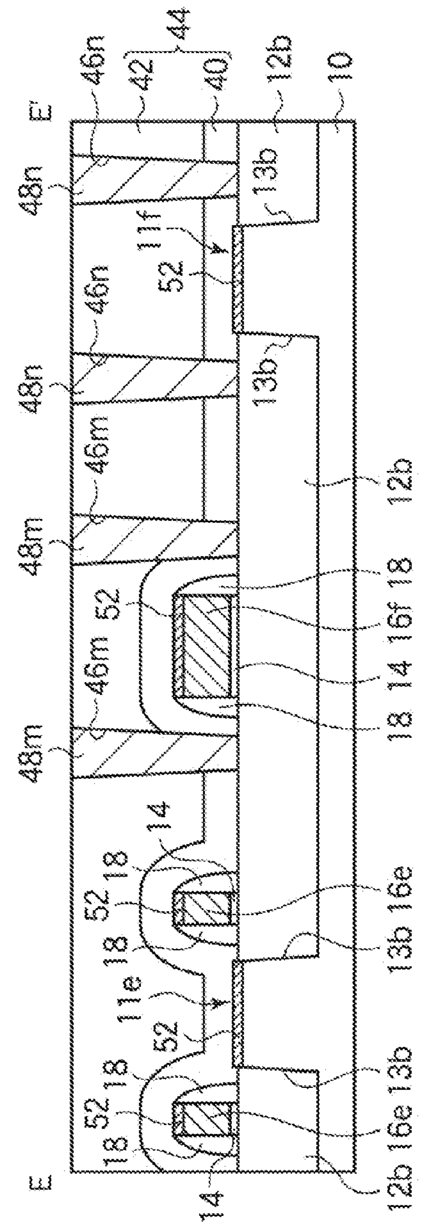
Figure 28A:
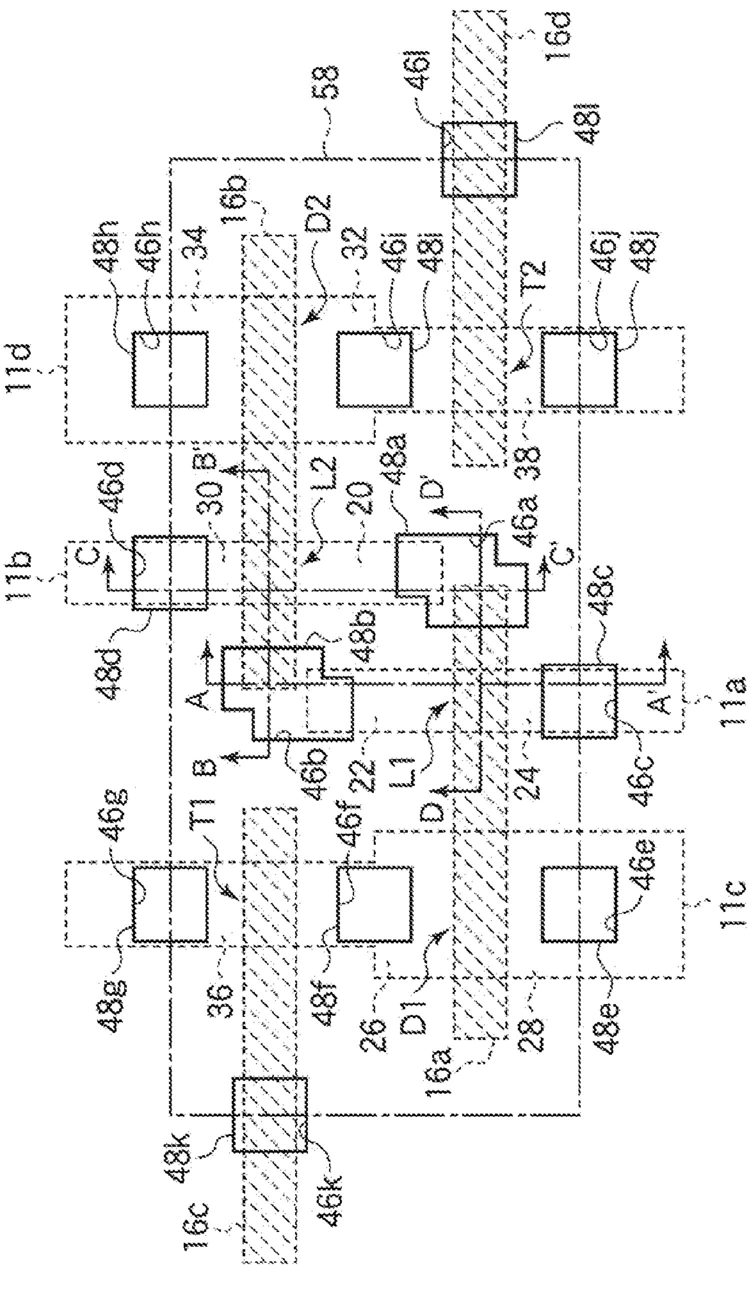
Figure 28B:
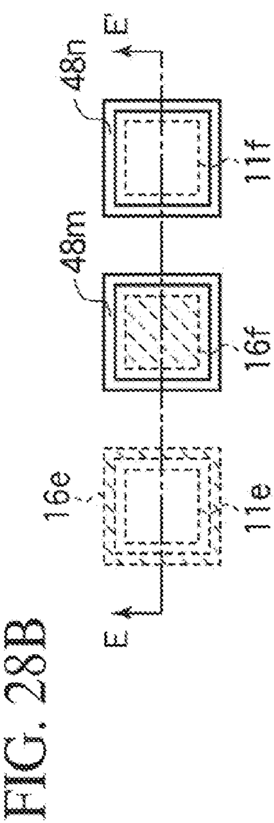
Figures 29A, 29B:
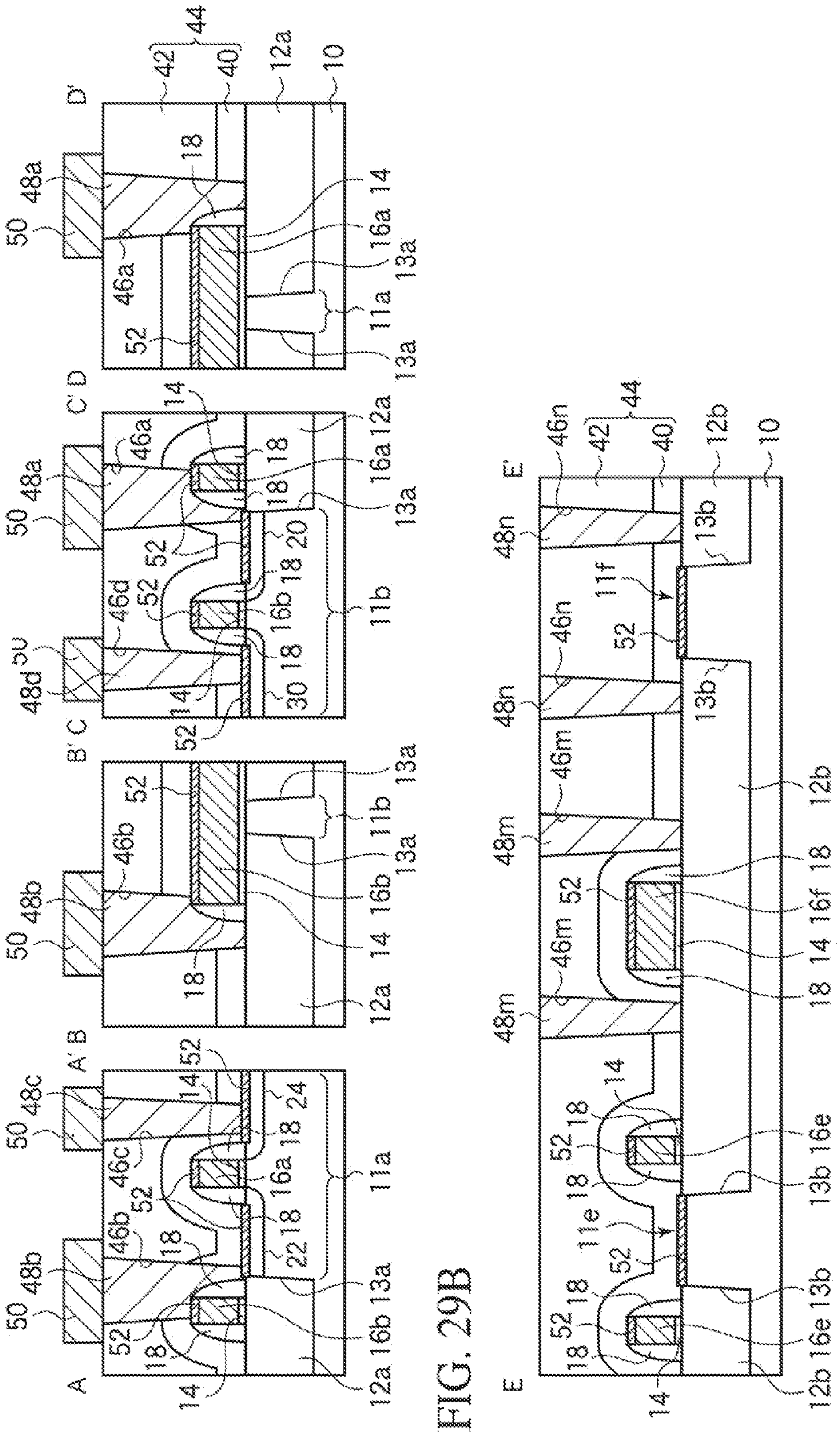

Next, the method for manufacturing the semiconductor device according to the present embodiment will be described with reference to FIGS. 5A to 29B. FIGS. 5A to 29B are views of the semiconductor device according to the present embodiment in the steps of the method for manufacturing the semiconductor device. FIGS. 5A to 10B are sectional views. FIGS. 11A and 11B are plan views corresponding to the views of FIGS. 10A and 10B. FIGS. 12A and 12B are sectional views. FIGS. 13A and 13B are plan views corresponding to the views of FIGS. 12A and 12B. FIGS. 14A to 19B are sectional views. FIGS. 20A and 20B are plan views corresponding to the views of FIGS. 19A and 19B. FIGS. 21A and 21B are sectional views. FIGS. 22A and 22B are plan views corresponding to the views of FIGS. 21A and 21B. FIGS. 23A and 23B are sectional views. FIGS. 24A and 24B are plan views corresponding to the views of FIGS. 23A and 23B. FIGS. 25A and 25B are sectional views. FIGS. 26A and 26B are plan views corresponding to the views of FIGS. 25A and 25B. FIGS. 27A and 27B are sectional views. FIGS. 28A and 28B are plan views corresponding to the views of FIGS. 27A and 27B. FIGS. 29A and 29B are sectional views.

Figure 5A:
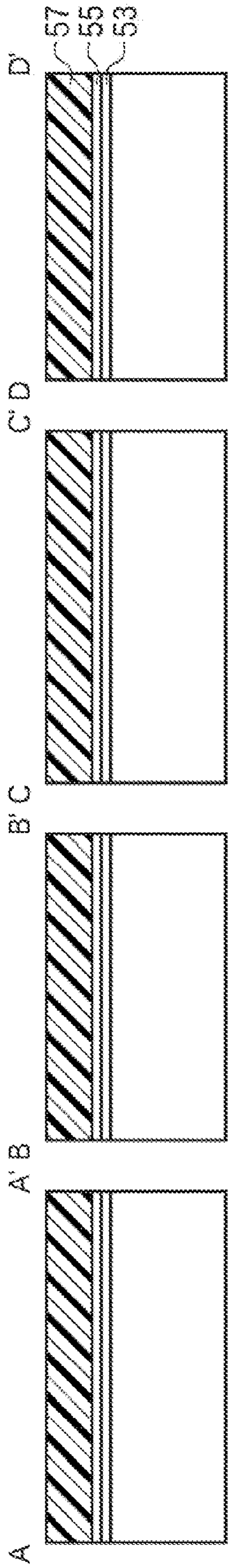
Figure 5B:
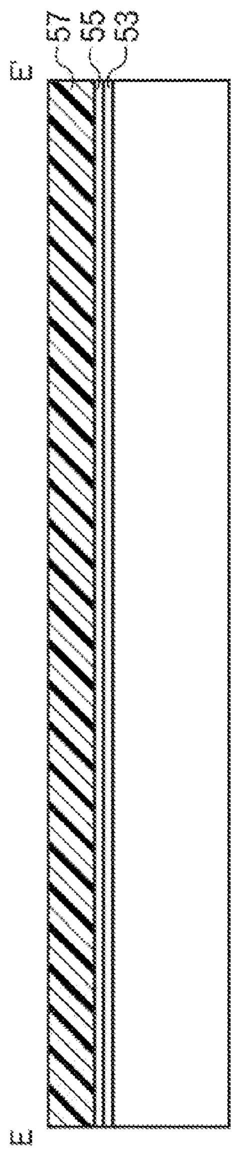

First, as illustrated in FIGS. 5A and 5B, the semiconductor substrate (semiconductor wafer) 10 is prepared. As the semiconductor substrate 10, a silicon wafer, for example, is used.

Next, a silicon oxide film 53 of an about 10 nm-film thickness is formed on the semiconductor substrate 10 by, e.g., thermal oxidation.

Next, a silicon nitride film 55 of an about 100 nm-film thickness is formed on the entire surface by, e.g., CVD (Chemical Vapor Deposition).

Next, a photoresist film 57 is formed on the entire surface by, e.g., spin coating.

Then, by using a reticle having the patterns of the active regions (device regions) 11*a*-11*d* and the patterns of the alignment marks 11*e*, 11*f* formed on, these patterns are exposed on the photoresist film 57.

Next, the photoresist film 57 is developed.

Figure 6A:
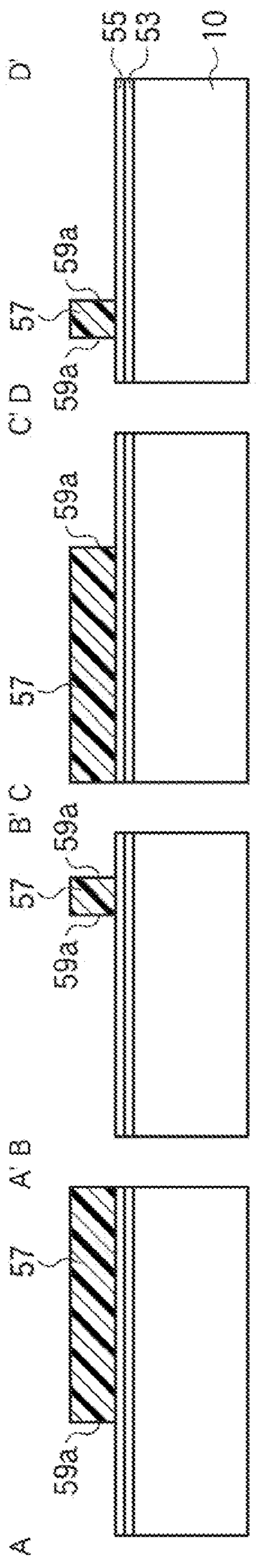
Figure 6B:
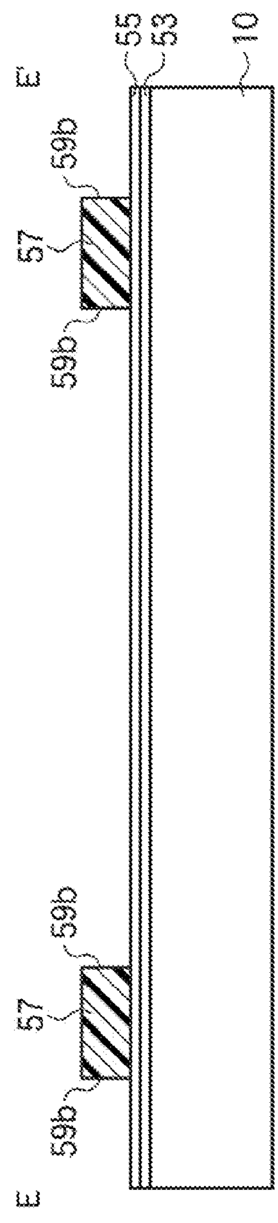

Thus, the patterns of the active regions 11*a*-11*d* and the patterns of the alignment marks 11*e*, 11*f* are transferred on the photoresist film 57 (see FIGS. 6A and 6B). Specifically, the openings 59*a* for forming the device isolation regions 12*a*, and the openings 59*b* for forming the alignment marks 11*e*, 11*f* are formed in the photoresist film 57.

Figure 7A:
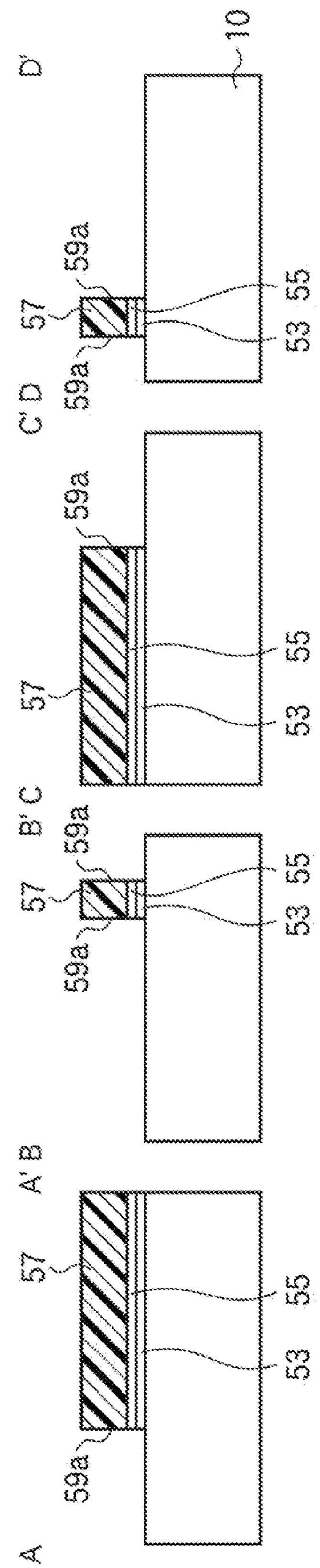
Figure 7B:
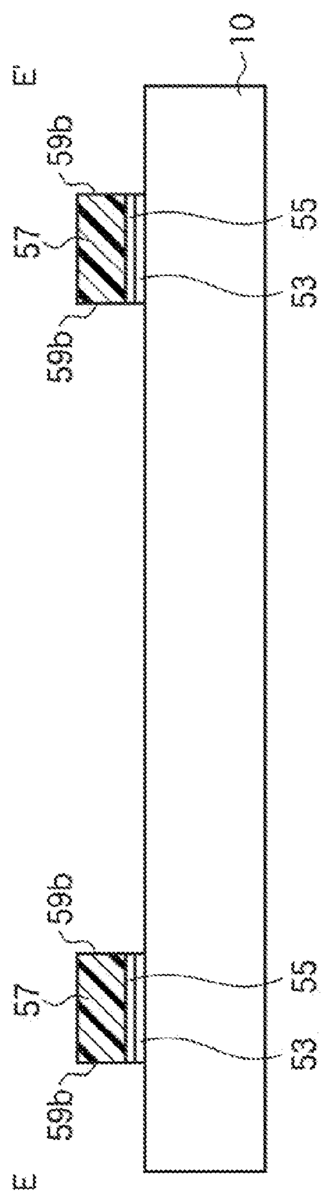

Next, as illustrated in FIGS. 7A and 7B, the silicon nitride film 55 and the silicon oxide film 53 are etched with the photoresist film 57 as the mask.

Figure 8A:
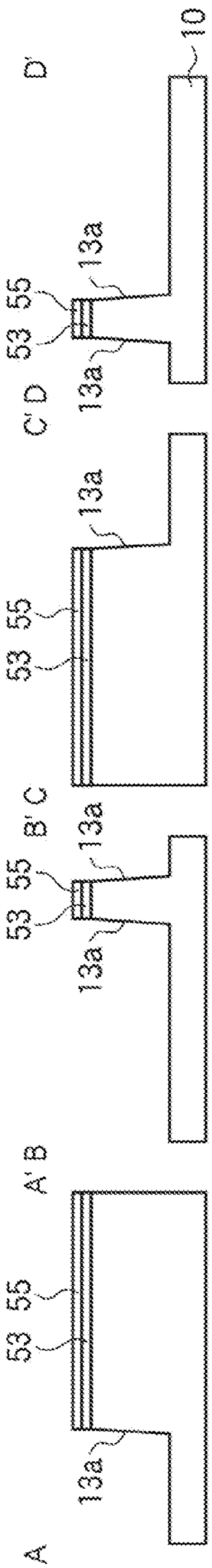
Figure 8B:
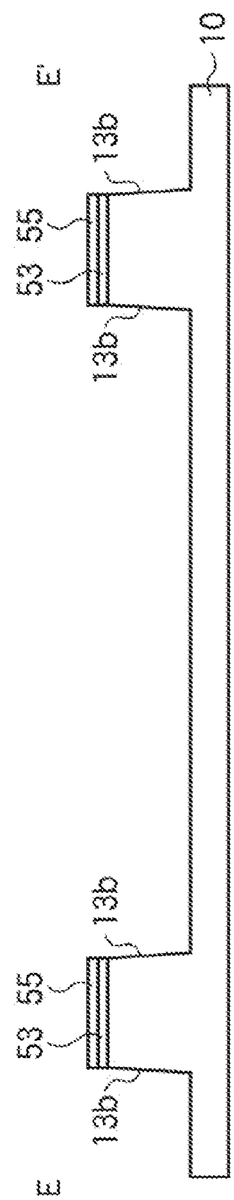

Next, as illustrated in FIGS. 8A and 8B, with the photoresist film 57 as the mask, the semiconductor wafer 10 is etched to the trench 13*a* for the device isolation region 12*a* to be buried in and the trench 13*b* for the insulation film 12*b* to be buried in are formed in the semiconductor wafer 10.

Then, the photoresist film 57 is released by, e.g., asking.

Figure 9A:
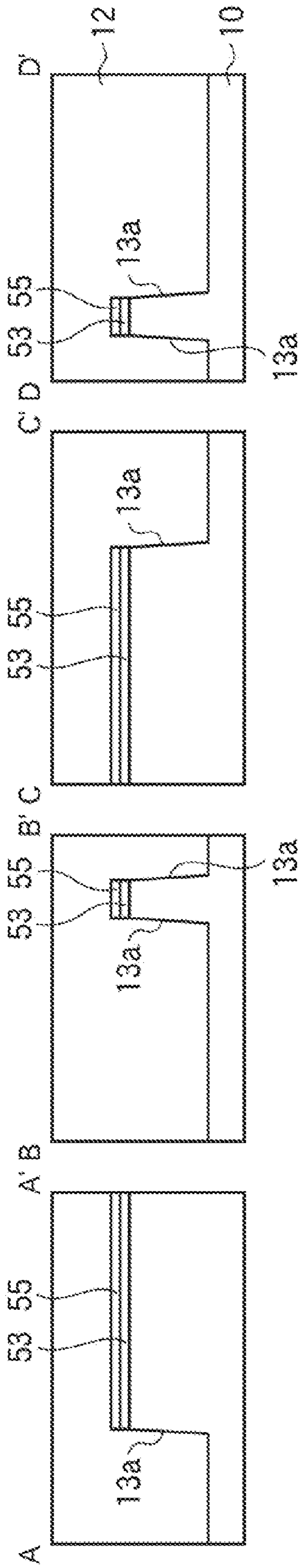
Figure 9B:
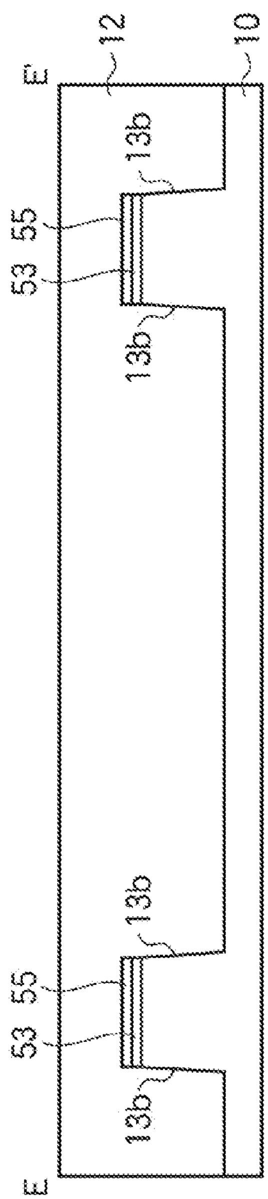
Figure 10A:
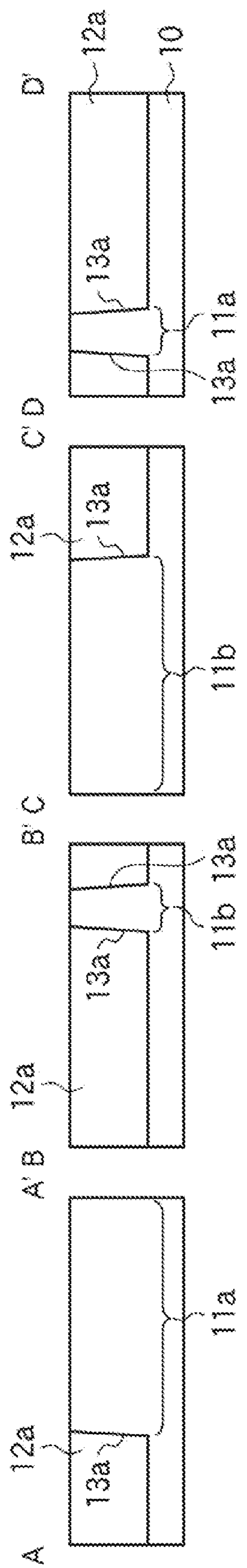
Figure 10B:
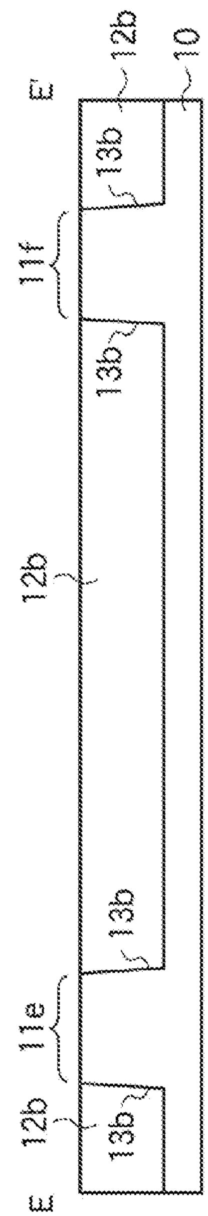

Next, as illustrated in FIGS. 9A and 9B, an insulation film 12 of, e.g., a 500 nm-film thickness is formed in the trenches 13*a*, 13*b* and on the semiconductor wafer 10.

Then, the insulation film 12 is polished by, e.g., CMP (Chemical Mechanical Polishing). Then, the silicon nitride film 55 and the silicon oxide film 53 are etched off. Thus, the device isolation region 12*a* and the insulation film 12*b* are buried respectively in the trench 13*a* and the trench 13*b*. The alignment marks 11*e*, 11*f* are respectively defined by the insulation film 12*b* buried in the trench 13*b* (see FIGS. 10A to 11B). The alignment marks 11*e*, 11*f* are formed respectively at plural parts of the periphery of the semiconductor chip.

The plane shape of the alignment marks 11*e*, 11*f* is, e.g., rectangle.

The plane shape of the alignment marks 11*e*, 11*f* is not limited to a rectangle. The plane shapes of the alignment marks 11*e*, 11*f* can be, e.g., a frame-shape or others.

Thus, the active regions 11*a*-11*d* are defined by the device isolation regions 12*a*, and the alignment marks 11*e*, 11*f* are formed, defined by the insulation film 12*b*.

Next, although not illustrated, ion implantation for forming wells (not illustrated) and ion implantation for forming the channel doped layers (not illustrated) are made in the active regions 11*a*-11*d*, and then activation anneal is made.

Then, the gate insulation film 14 of silicon dioxide of, e.g., a physical film thickness 0.6-2 nm thickness is formed on the entire surface by, e.g., thermal oxidation.

Then, a polysilicon film of, e.g., a 70-120 nm-film thickness is formed on the entire surface by CVD (Chemical Vapor Deposition).

Then, a photoresist film (not illustrated) is formed on the entire surface by, e.g., spin coating.

Next, by using a reticle having the patterns of the gate interconnections 16*a*-16*d* and the patterns of the alignment marks 16*e*, 16*f* formed on, these patterns are exposed on the photoresist film.

To align the reticle, the alignment mark 11*e* defined by the isolation film 12*b* is used.

Next, the photoresist film is developed.

Thus, the patterns of the gate interconnections 16*a*-16*d* and the patterns of the alignment marks 16*e*, 16*f* are transferred on the photoresist film.

Then, with the photoresist film as the mask the polysilicon film is etched. Thus, the gate interconnections 16*a*-16*d* of polysilicon and the alignment marks 16*e*, 16*f* of polysilicon are formed (see FIGS. 12A to 13B).

The gate interconnection 16*a* is formed linear, crossing the device regions 11*a*, 11*c*. The gate interconnection 16*b* is formed linear, crossing the device regions 11*b*, 11*d*. The gate interconnection 16*c* is formed linear, crossing the device region 11*d*. The longitudinal directions of the gate interconnections 16*a*-16*d* are in the same direction. The gate interconnections 16*a* and the gate interconnection 16*b* are formed, neighboring each other in parts of the regions. The gate interconnection 16*c* is formed, positioned on the line extended from the gate interconnection 16*b*. The gate interconnection 16*d* is formed, positioned on the line extended from the gate interconnection 16*a*. The width of the gate interconnections 16*a*-16*d*, i.e., the gate length is, e.g., about 35-60 nm. The interval between the gate interconnections 16*a*, 16*d* and the gate interconnections 16*b*, 16*c*, i.e., the pitch of the gate interconnections is, e.g., about 0.16-0.2 μm. The alignment marks 16*e*, 16*f* are formed respectively at plural parts of the periphery of the semiconductor chip.

The plane shape of the alignment marks 16*e* is, e.g., a frame-shape.

The plane shape of the alignment marks 16*e* is not limited to the frame shape. The plane shape of the alignment mark 16*e* can be, e.g., a rectangle or others.

The plane shape of the alignment mark 16*f* is, e.g., a rectangle.

The plane shape of the alignment mark 16*f* is not limited to a rectangle. The plane shape of the alignment mark 16*f* can be a frame shape or others.

Thus, the gate interconnections 16*a*-16*d* are formed while the alignment marks 16*e*-16*f* are formed.

Then, a dopant impurity is implanted by ion implantation to form the extension regions (not illustrated) which form the shallow regions of the extension source/drain structure respectively in the semiconductor substrate 10 on both sides of the gate interconnections 16*a*-16*d*.

Next, a silicon oxide film of, e.g., an about 30-60 nm is formed on the entire surface by, e.g., CVD.

Next, the silicon oxide film is etched by, e.g., anisotropic etching. Thus, the sidewall insulation film 18 of silicon dioxide is formed on the side walls of the gate interconnections 16*a*-16*d* (see FIGS. 14A and 14B).

A dopant impurity is implanted by ion implantation to form impurity diffused regions which form the deep regions of the extension source/drain structure in the semiconductor substrate 10 on both sides of the gate interconnections 16*a*-16*d*. Thus, the source/drain diffused layers 20, 22, 24, 26, 28, 30, 32, 34, 36, 38 (see FIGS. 1A and 1B) having the extension regions and the deep impurity diffused regions are formed.

Then, heat processing (anneal) for activating the dopant impurity implanted in the source/drain diffused layers 20, 22, 24, 26, 28, 30, 32, 34, 36, 38 is made. The heat processing temperature is, e.g., about 800-1200° C.

Then, a refractory metal film of a 5-30 nm-film thickness is formed on the entire surface by, e.g., sputtering. As the refractory metal film, nickel film, for example, is used.

Next, heat processing is made to react the surface of the semiconductor substrate 10 and the refractory metal film with each other while reacting the upper surfaces of the gate interconnections 16*a*-16*d* and the refractory metal film with each other. Then, the unreacted refractory metal film is etched off. Thus, on the source/drain diffused layers 20, 22, 24, 26, 28, 30, 32, 34, 36, 38, the silicide film 52 of, e.g., nickel silicide is formed. The silicide film 52 on the source/drain diffused layers 20, 22, 24, 26, 28, 30, 32, 34, 36, 38 function as the source/drain electrodes. On the gate interconnections 16*a*-16*d*, the silicide film 52 of, e.g., nickel silicide is formed. On the alignment marks 11*e*, 11*f*, 16*e*, 16*f*, the silicide film 52 of, e.g., nickel silicide is formed (see FIGS. 15A and 15B).

Next, the insulation film 40 of silicon nitride of, e.g., a 30-80 nm-film thickness is formed on the entire surface by, e.g., plasma CVD. The film forming conditions for the insulation film 40 are as exemplified below. That is, the frequency of high-frequency power to be applied is, e.g., 13.56 MHz. The gas to be fed into the film forming chamber is, e.g., a mixed gas containing $SiH_4$ gas, $NH_3$ gas and $N_2$ gas. The internal temperature of the film forming chamber is, e.g., 350-450° C. The insulation film 40 is formed, filling the intervals between the gate interconnections 16*a*-16*d* (see FIGS. 16A and 16B).

Then, the insulation film 42 of silicon dioxide of, e.g., an about 400-700 nm-film thickness is formed on the entire surface by, e.g., plasma CVD. The film forming conditions for the insulation film 42 are as exemplified below. That is, the frequency of the high frequency power to be applied is, e.g., 13.56 MHz. The gas to be fed into the film forming chamber is the mixed gas containing $SiH_4$ gas and $N_2O$ gas. The internal temperature of the film forming chamber is, e.g., about 350-450° C.

Next, the surface of the insulation film 42 is planarizsed by, e.g., CMP. The insulation film 40 and the insulation film 42 form the inter-layer insulation film (see FIGS. 17A and 17B).

Figure 18A:
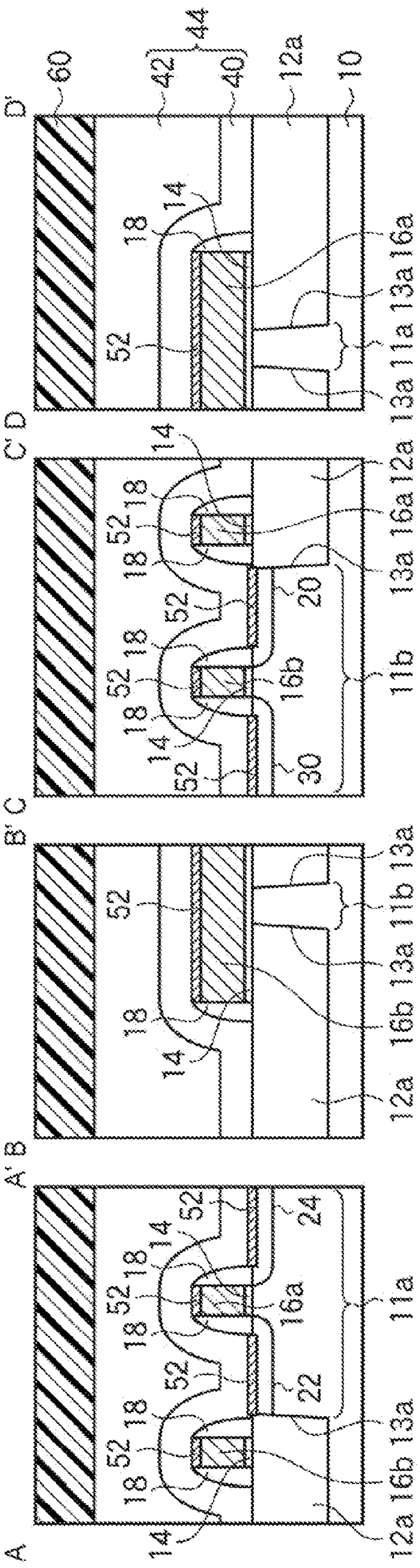
Figure 18B:
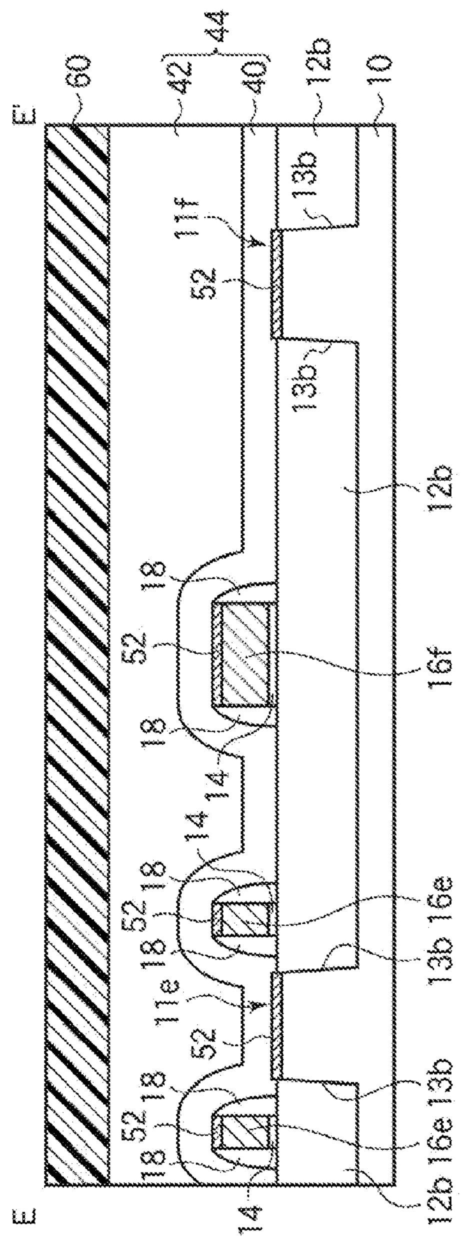
Figures 19A, 19B:
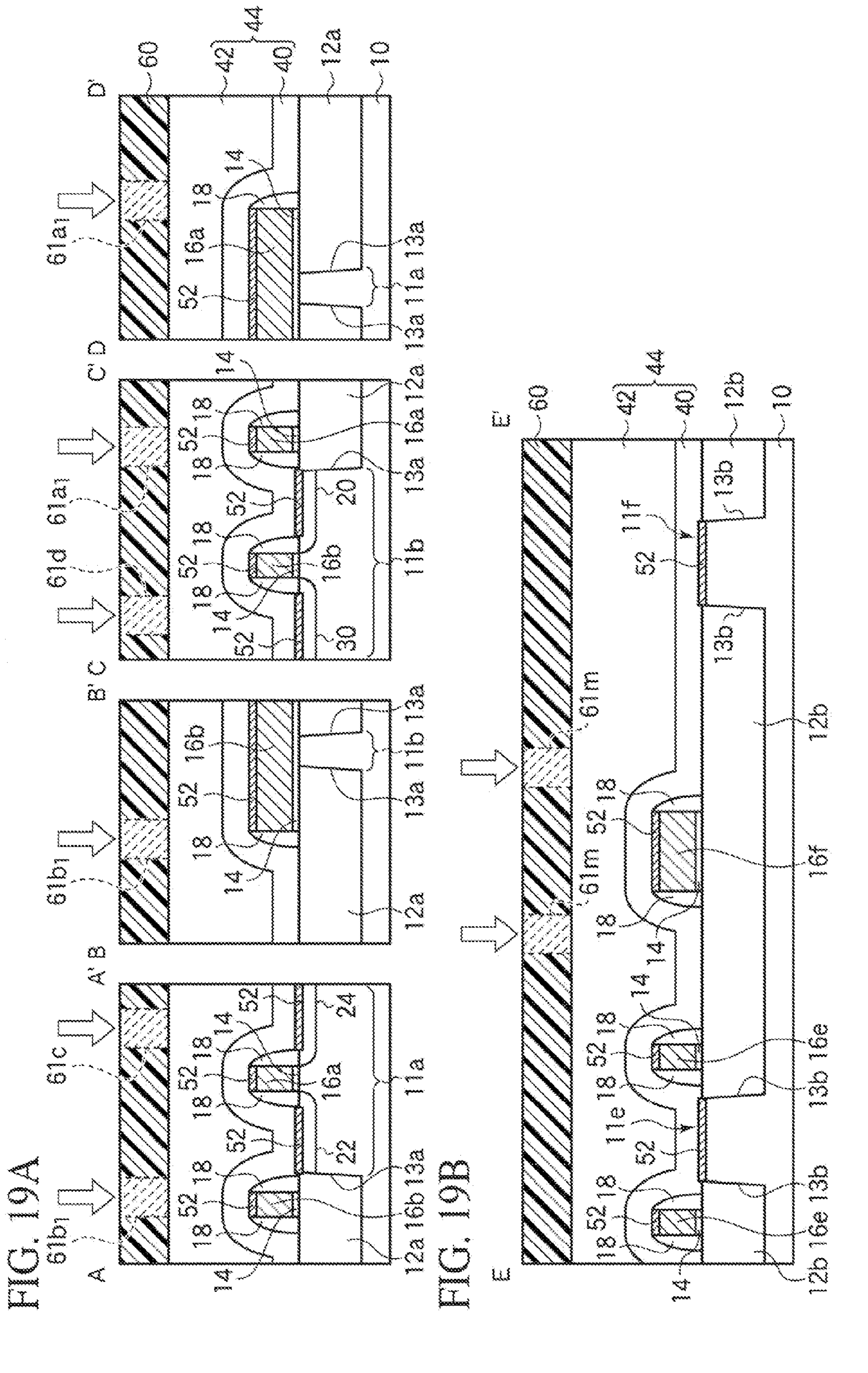

Next, as illustrated in FIGS. 18A and 18B, a photoresist film 60 is formed on the entire surface by, e.g., spin coating.

Then, by photolithography, partial patterns 61*a*1, 61*b*1 and the patterns 61*c*-61*l* are exposed on the photoresist film 60 (see FIGS. 19A to 20B). The partial patterns 61*a*1, 61*b*1 are for forming the contact holes 46*a*, 46*b*. The patterns 61*c*-61*l* are for forming the contact holes 46*c*-46*l*. The partial patterns 61*a*1, 61*b*1 are laid out, sufficiently overlapping parts of the gate interconnections 16*a*, 16*b*. The partial patterns 61*a*1, 61*b*1 are laid out, sufficiently overlapping parts of partial patterns 61*a*2, 61*b*2 (see FIGS. 21A to 22B) which will be mentioned below. In aligning the first mask (the first reticle) (not illustrated) for exposing the partial patterns 61*a*1, 61*b*1 and the patters 61*c*-61*l*, the alignment is made by using the alignment mark 16*f*.

The pattern of the alignment mark 16*f* and patterns of the gate interconnections 16*a*-16*d* were transferred by using the same mask. Accordingly, no disalignment takes place between the alignment mark 16*f*, and the gate interconnections 16*a*, 16*b*. The alignment mark 16*f* is used in aligning the first mask, whereby the disalignment between the partial patterns 61*a*1, 61*b*1, and the gate interconnections 16*a*, 16*b* can be made extremely small. Accordingly, the partial patterns 61*a*1, 61*b*1, and parts of the gate interconnections 16*a*, 16*b* can be sufficiently overlapped.

Thus, the partial patterns 61a1, 61b1 for forming the contact holes 46a, 46b, and the patterns 61c-61l for forming the contact holes 46c-46l are exposed on the photoresist film 60. At this time, the pattern 61m of the alignment mark (not illustrated) of the first mask (not illustrated) is also exposed on the photoresist film 60.

Then, by photolithography, partial patterns 61a2, 61b2 are exposed on the photoresist film 60 (see FIGS. 21A to 22B). The partial patterns 61a2, 61b2 are for forming the contact holes 46a, 46b together with the partial patterns 61a1, 61b1. The partial patterns 61a2, 61b2 are laid out, sufficiently overlapping parts of the active regions 11b, 11a. The partial patterns 61a2, 61b2 are laid out, sufficiently overlapping parts of the partial patterns 61a2, 61b2. In aligning the second mask (the second reticle) for exposing the partial patterns 61a2, 61b2, the alignment is made by using an alignment mark 11f.

The pattern of the alignment mark 11f and the patterns of the active regions 11a-11d were transferred by using the same mask. Accordingly, no disalignment takes place between the alignment mark 11f and the active regions 11a-11d. The alignment mark 11f is used in aligning the second mask, whereby the disalignment between the partial patterns 61a2, 61b2 and the active regions 11b, 11a can be made extremely small. Accordingly, parts of the partial patterns 61a2, 61b2 and parts of the active regions 11b, 11a can be sufficiently overlapped.

Thus, the partial patterns 61a2, 61b2 of the contact holes 46a, 46b are exposed on the photoresist film 60. At this time, the pattern 61n of the alignment mark (not illustrated) of the second mask is also exposed on the photoresist film 60.

The partial patterns 61a1, 61b1 and partial patterns 61a2, 61b2 are thus exposed, whereby the parts of the partial patterns 61a1, 61b1 and the parts of the partial patterns 61a2, 61b2 are surely overlapped even when disalignments take place.

Next, the photoresist film 60 is developed. Thus, the openings 70a-70l for forming the contact holes 46a-46l, the opening 70m of the pattern of the alignment mark of the first mask, and the opening 70n of the pattern of the alignment mark of the second mask are formed in the photoresist film 60 (see FIGS. 23A to 24B).

As described above, according to the present embodiment, parts of the partial patterns 61a1, 61b1 and parts of the gate interconnections 16a, 16b can be sufficiently overlapped. According to the present embodiment, parts of the partial patterns 61a1, 61b1 and parts of the active regions 11b, 11a can be sufficiently overlapped. Parts of the partial patterns 61a1, 61b1 and parts of the partial pattern 61a2, 61b2 are laid out, sufficiently overlapping each other. Accordingly, the opening 70a of the photoresist film 60 is formed, sufficiently overlapping the end of the gate interconnection 16a and the part of the source/drain diffused layer 20 of the load transistor L2. The opening 70b of the photoresist film 60 is formed, sufficiently overlapping the end of the gate interconnection 16b and the part of the source/drain diffused layer 22 of the load transistor L1.

Then, with the photoresist film 60 as the mask, the inter-layer insulation film 44 is etched. Thus, the contact holes 46a-46l and the openings 46m, 46n are formed in the inter-layer insulation film 44 (see FIGS. 25A to 26B).

As described above, the opening 70a of the photoresist film 60 sufficiently overlaps the end of the gate interconnection 16a and the part of the source/drain diffused layer 20 of the load transistor L2. Accordingly, the contact hole 46a surely exposes integrally the end of the gate interconnection 16a and the source/drain diffused layer 20 of the load transistor L2 even when a disalignment takes place.

As described above, the opening 70b of the photoresist film 60 sufficiently overlaps the end of the gate interconnection 16b and the part of the source/drain diffused layer 22 of the load transistor L1. Accordingly, the contact hole 46b surely exposes integrally the end of the gate interconnection 16b and the source/drain diffused layer 22 of the load transistor L1 even when a disalignment takes place. The shape of the section of the contact holes 46a, 46b in the direction parallel with the surface of the semiconductor substrate 10 is, e.g., substantially elliptical (see FIG. 3).

The contact hole 46c is formed, exposing the source/drain diffused layer 24 of the load transistor L1. The contact hole 46d is formed, exposing the source/drain diffused layer 30 of the load transistor L2. The contact hole 46e is formed, exposing the source/drain diffused layer 28 of the driver transistor D1. The contact hole 46f is formed, exposing the source/drain diffused layer 26 which is common between the driver transistor D1 and the transfer transistor T1. The contact hole 46g is formed, exposing the source/drain diffused layer 36 of the driver transistor T1. The contact holes 46h is formed, exposing the source/drain diffused layer 34 of the driver transistor D2. The contact hole 46i is formed, exposing the source/drain diffused layer 32 which is common between the driver transistor D2 and the transfer transistor T2. The contact hole 46j is formed, exposing the source/drain diffused layer 38 of the driver transistor T2. The shape of the section of the contact holes 46c-46j in the direction parallel with the surface of the semiconductor substrate 10 is, e.g., substantially circular (see FIG. 3). The diameter of the contact holes 46c-46l is, e.g., about 50-80 nm.

The openings 46m, 46n are formed down to the insulation film 12b. The shape of the section of the openings 46m, 46n in the direction parallel with the surface of the semiconductor substrate 10 is, e.g., the frame shape.

Next, a Ti film of, e.g., a 2-10 nm-film thickness and a TiN film of, e.g., a 2-10 nm-film thickness are sequentially formed on the entire surface by, e.g., sputtering or CVD to form a glue layer.

Then, a tungsten film of, e.g., a 70-100 nm-film thickness is formed on the entire surface by, e.g., sputtering.

Then, the tungsten film is polished by, e.g., CMP until the surface of the inter-layer insulation film is exposed. Thus, the contact layers 48a-48j of tungsten are buried in the contact holes 46a-46l. In the openings 46m, 46b, the alignment marks 48m, 48n of tungsten are respectively buried (see FIGS. 27A to 28B).

As described above, the contact hole 46a surely exposes integrally the end of the gate interconnection 16a and the part of the source/drain diffused layer 20 of the load transistor L2. Accordingly, the contact layer 48a surely connects integrally the end of the gate interconnection 16a and the source/drain diffused layer 20 of the load transistor L2.

As described above, the contact hole 46b surely exposes integrally the end of the gate interconnection 16b and the source/drain diffused layer 22 of the load transistor L1. Accordingly, the contact layer 48b surely connects integrally the end of the gate interconnection 16b and the part of the source/drain diffused layer of the load transistor L1.

Next, a conduction film is formed on the entire surface by, e.g., sputtering.

Then, the conduction film is patterned by photolithography to form the interconnections 50 respectively connected to the contact layers 48a-48l (see FIGS. 29A and 29B).

Thus, the semiconductor device according to the present embodiment is manufactured.

When a disalignment takes place in the method for manufacturing the semiconductor device according to the present embodiment, what is described below follows. The case of a disalignment will be described with reference to FIGS. 30A to 33B. FIGS. 30A to 33B are plan views of the semiconductor device according to the present embodiment in the steps of the method for manufacturing the semiconductor device, which illustrate the case of a disalignment.

Figure 30A:
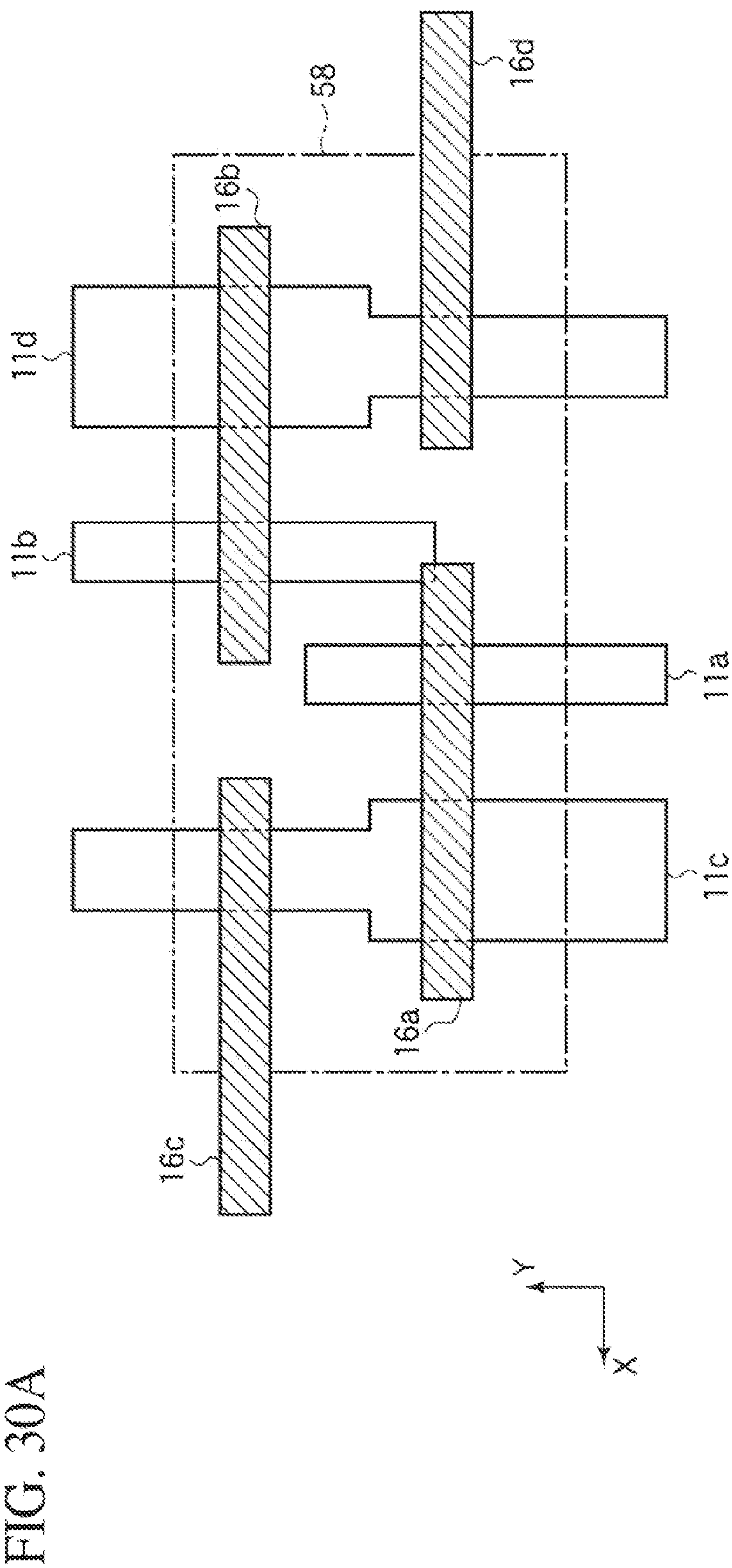
FIGS. 30A to 33B are plan views of the semiconductor device according to the first embodiment in the steps of the method for manufacturing the semiconductor device, which illustrate a case of disalignment.
Figure 30B:
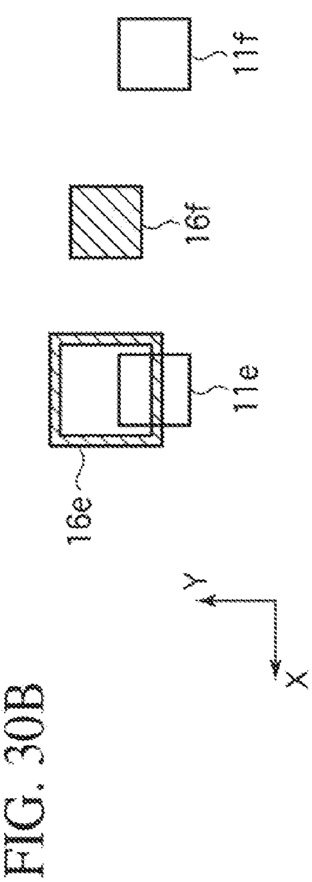

FIGS. 30A and 30B correspond to FIGS. 13A and 13B described above.

FIGS. 30A and 30B illustrate the case that a large disalignment takes place in the Y direction in transferring the patterns of the gate interconnections 16*a*-16*d*. The patterns of the alignment marks 16*e*, 16*f*, which are also transferred simultaneously with transferring the patterns of the gate interconnections 16*a*-16*d*, are disaligned largely with respect to the alignment marks 11*e*, 11*f*.

Figure 31A:
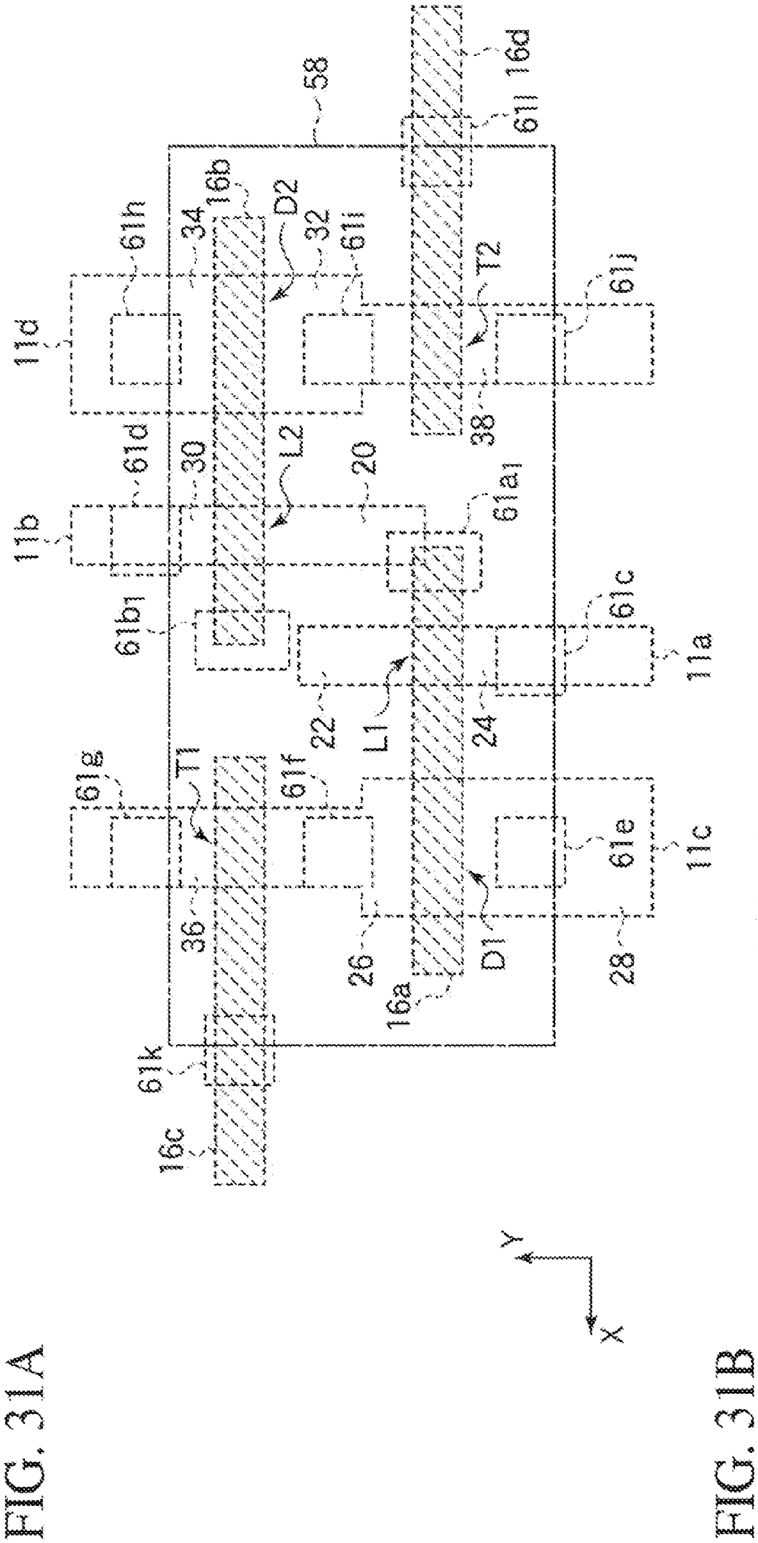
Figure 31B:
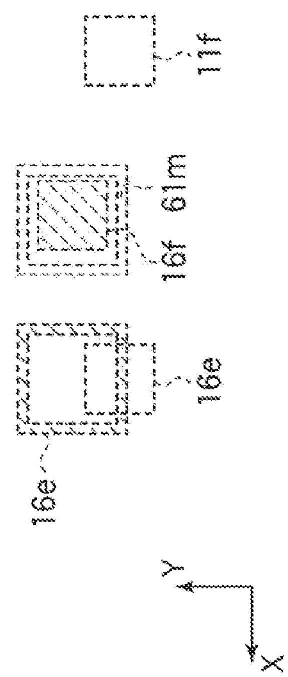

FIGS. 31A and 31B correspond to FIGS. 20A and 20B described above.

The alignment mark (not illustrated) of the first mask (not illustrated) is aligned with the alignment mark 16*f*, whereby, as illustrated in FIGS. 31A and 31B, the ends of the gate interconnections 16*a*, 16*b* and parts of the partial patterns 61*a*1, 16*b*1 can be sufficiently overlapped.

Figure 32A:
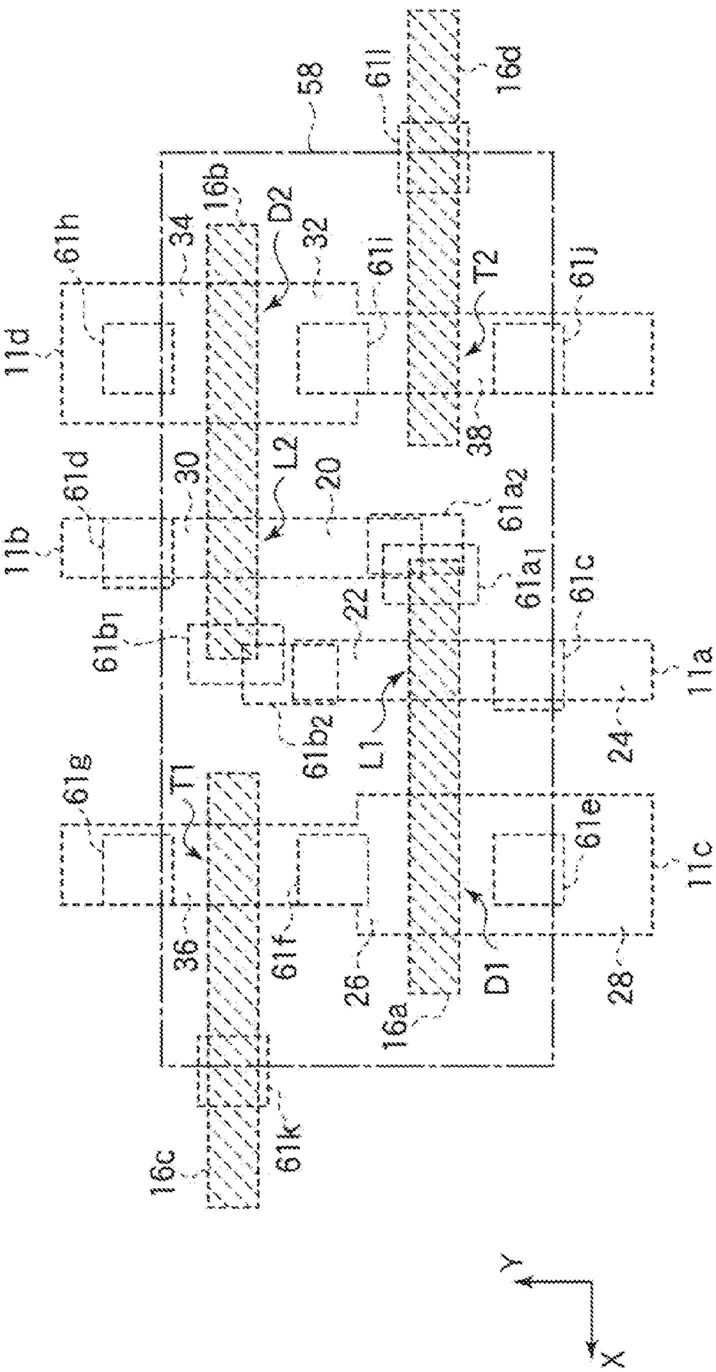
Figure 32B:
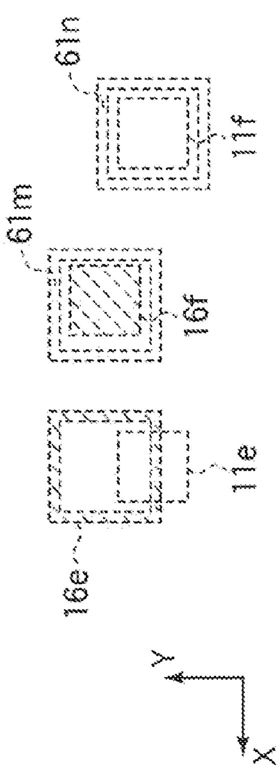

FIGS. 32A and 32B correspond to FIGS. 22A and 22B described above.

The alignment mark (not illustrated) of the second mask (not illustrated) is aligned with the alignment mark 11*f*, whereby as illustrated in FIGS. 32A and 32B, a part of the source/drain diffused layer 20 of the load transistor L2 and the partial pattern 61*a*2 can be sufficiently overlapped. A part of the source/drain diffused layer 22 of the load transistor L1 and a part of the partial pattern 61*b*2 can be sufficiently overlapped.

Figure 33A:
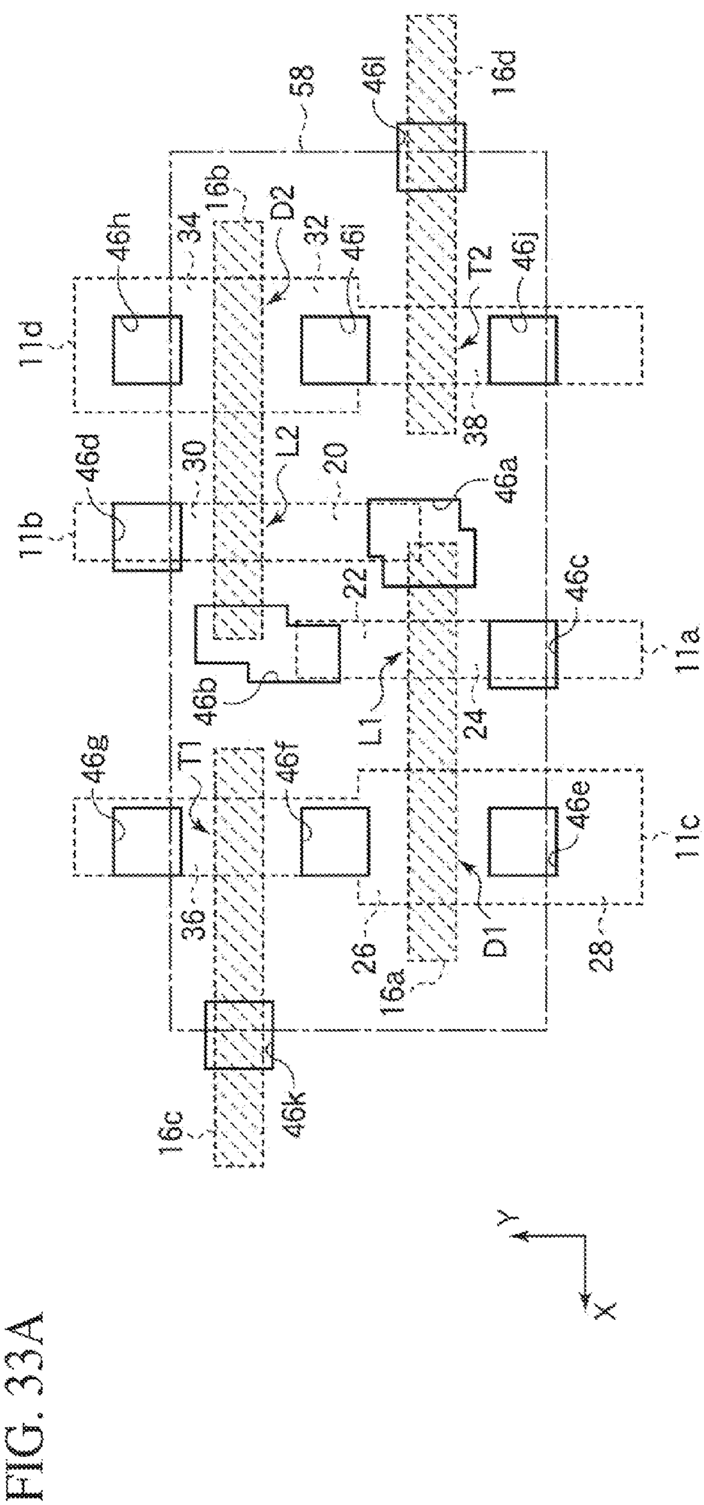
Figure 33B:
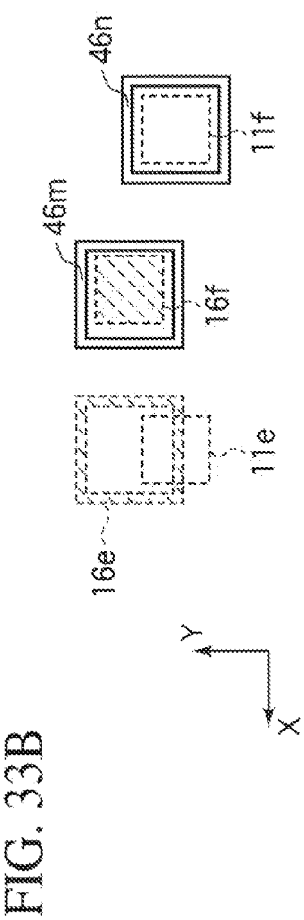

FIGS. 33A and 33B correspond to FIGS. 24A and 24B described above.

The contact hole 46*a* sufficiently exposes integrally the end of the gate interconnection 16*a* and a part of the source/drain diffused layer 20 of the load transistor L2. The contact hole 46*b* sufficiently exposes integrally the end of the gate interconnection 16*b* and a part of the source/drain diffused layer 22 of the load transistor L1.

As described above, according to the present embodiment, even when a large disalignment takes place, the contact hole 46*a* which surely exposes integrally the end of the gate interconnection 16*a* and a part of the source/drain diffused layer 20 of the load transistor L2 can be formed. According to the present embodiment, even when a large disalignment takes place, the contact hole 46*b* which surely exposes integrally the end of the gate interconnection 16*b* and a part of the source/drain diffused layer 22 of the load transistor L1 can be formed.

In the present embodiment, the partial patterns 61*a*1, 61*b*1 for forming parts of the contact holes 46*a*, 46*b* are exposed on the photoresist film 60 in alignment with the alignment mark 16*f* transferred simultaneously with transferring the patterns of the gate interconnections 16*a*, 16*b*. Accordingly, parts of the partial patterns 61*a*1, 61*b*1 and parts of the gate interconnections 16*a*, 16*b* can be sufficiently overlapped. The partial patterns 61*a*2, 61*b*2 for forming parts of the contact holes 46*a*, 46*b* are exposed on the photoresist film 60 in alignment with the alignment mark 11*f* transferred simultaneously with transferring the patterns of the active regions 11*a*, 11*b*. Accordingly, parts of the partial patterns 61*a*2, 61*b*2 and parts of the active regions 11*b*, 11*a* can be sufficiently overlapped. Parts of the partial patterns 61*a*1, 61*b*1 and parts of the partial patterns 61*a*2, 61*b*2 are laid out, sufficiently overlapping each other. Thus, according to the present embodiment, the contact hole 46*a* surely exposing integrally the end of the gate interconnection 16*a* and a part of the source/drain diffused layer 20 of the load transistor L2 can be formed. The contact hole 46*b* surely exposing integrally the end of the gate interconnection 16*b* and a part of the source/drain diffused layer 22 of the load transistor L1 can be formed. Thus, according to the present embodiment, the contact layer 48 surely connecting integrally the end of the gate interconnection 16*a* and the source/drain diffused layer 20 of the load transistor L2 can be formed. The contact layer 48*b* surely connecting integrally the end of the gate interconnection 16*b* and a part of the source/drain diffused layer 22 of the load transistor L1 can be formed. Thus, according to the present embodiment, the semiconductor device of high reliability can be manufactured with high yields.

[b] Second Embodiment

Figure 34A:
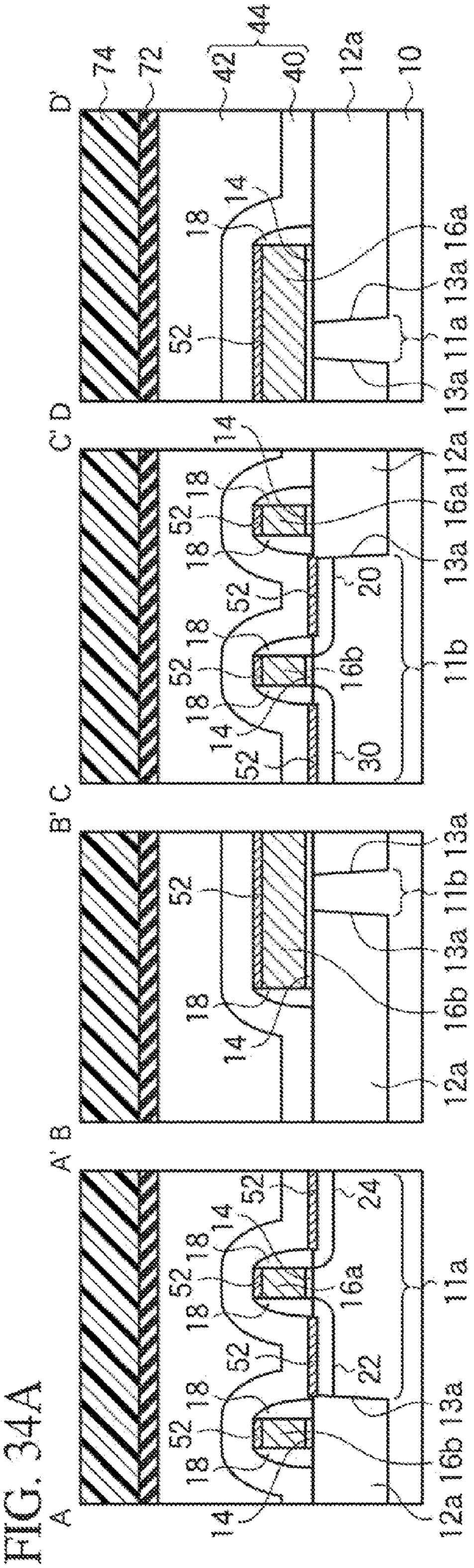
FIGS. 34A to 48B are views of the semiconductor device in the steps of the semiconductor device manufacturing method according to a second embodiment, which illustrate the method.
Figure 35:
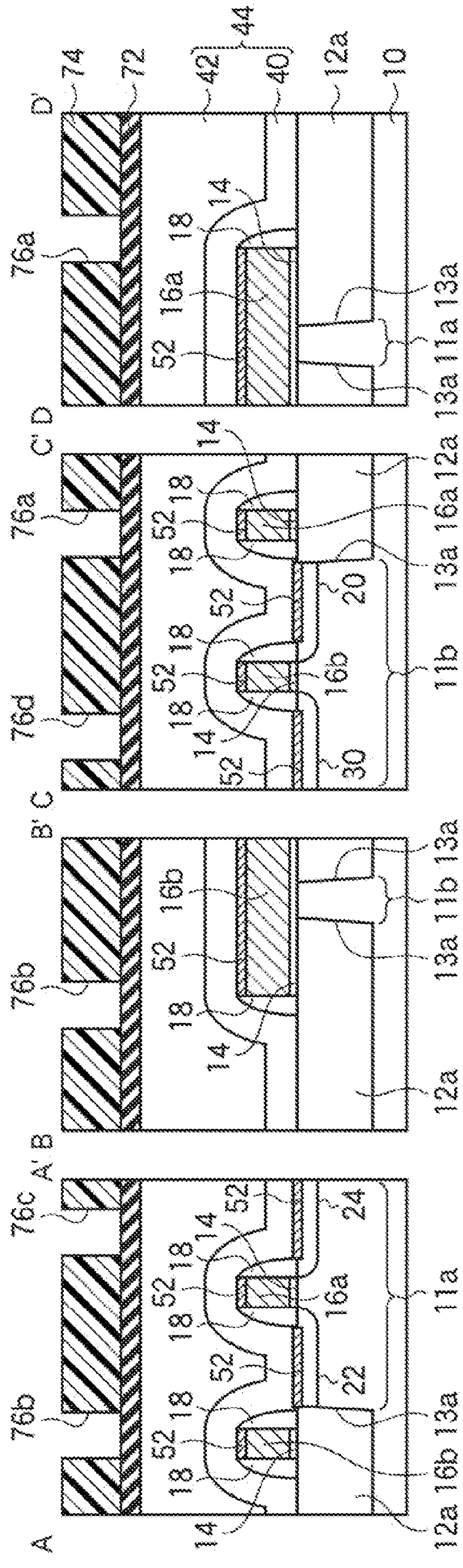
Figure 36A:
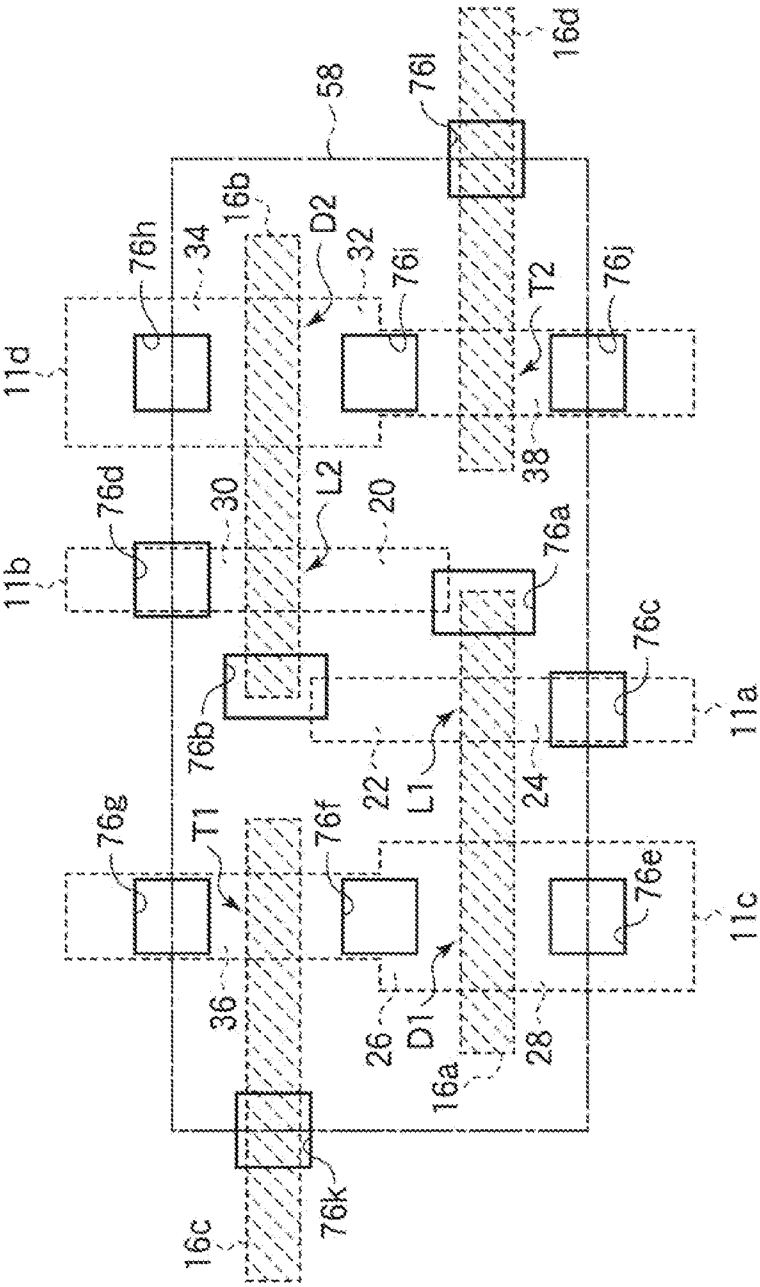
Figure 36B:
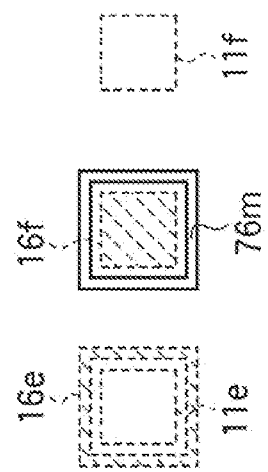
Figure 37:
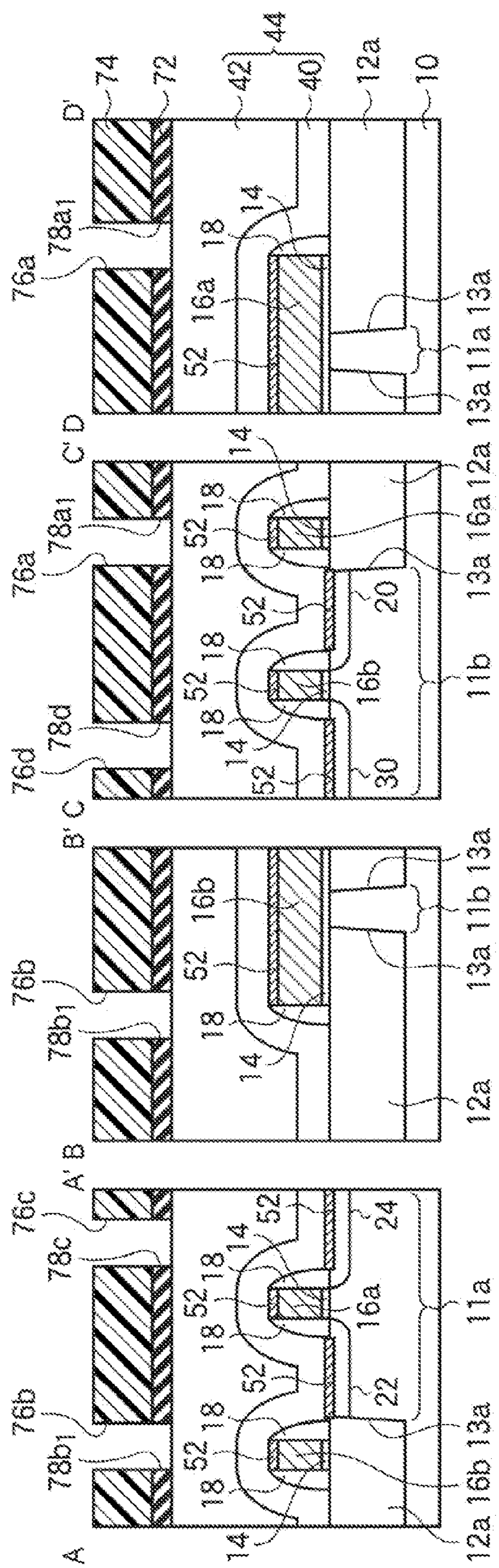
Figure 38A:
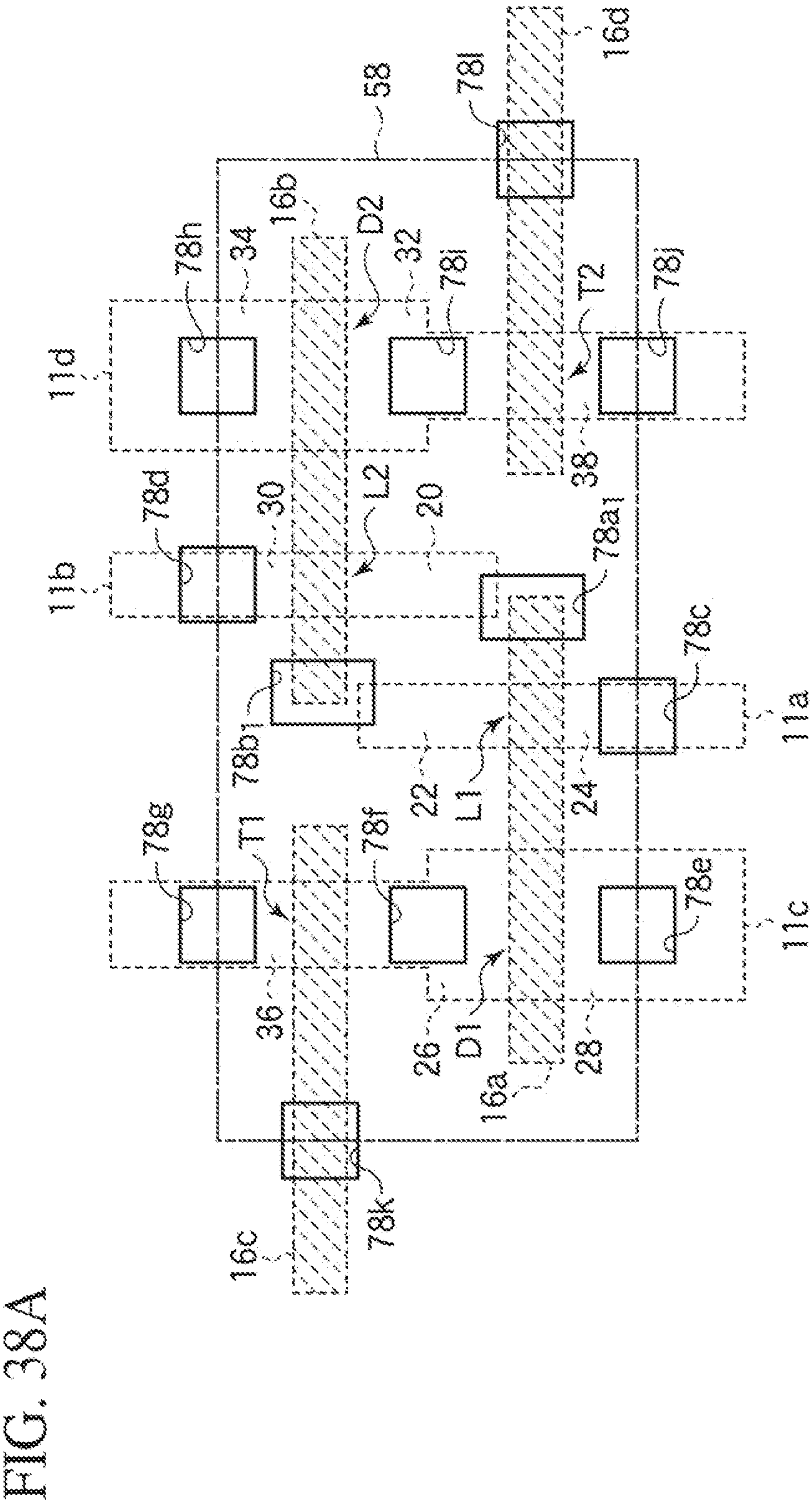
Figure 38B:
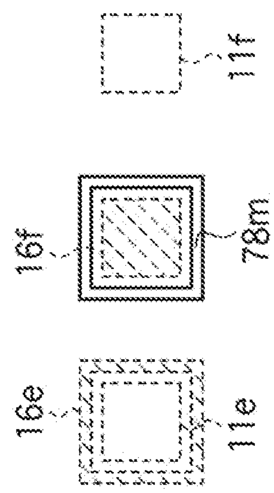
Figure 42A:
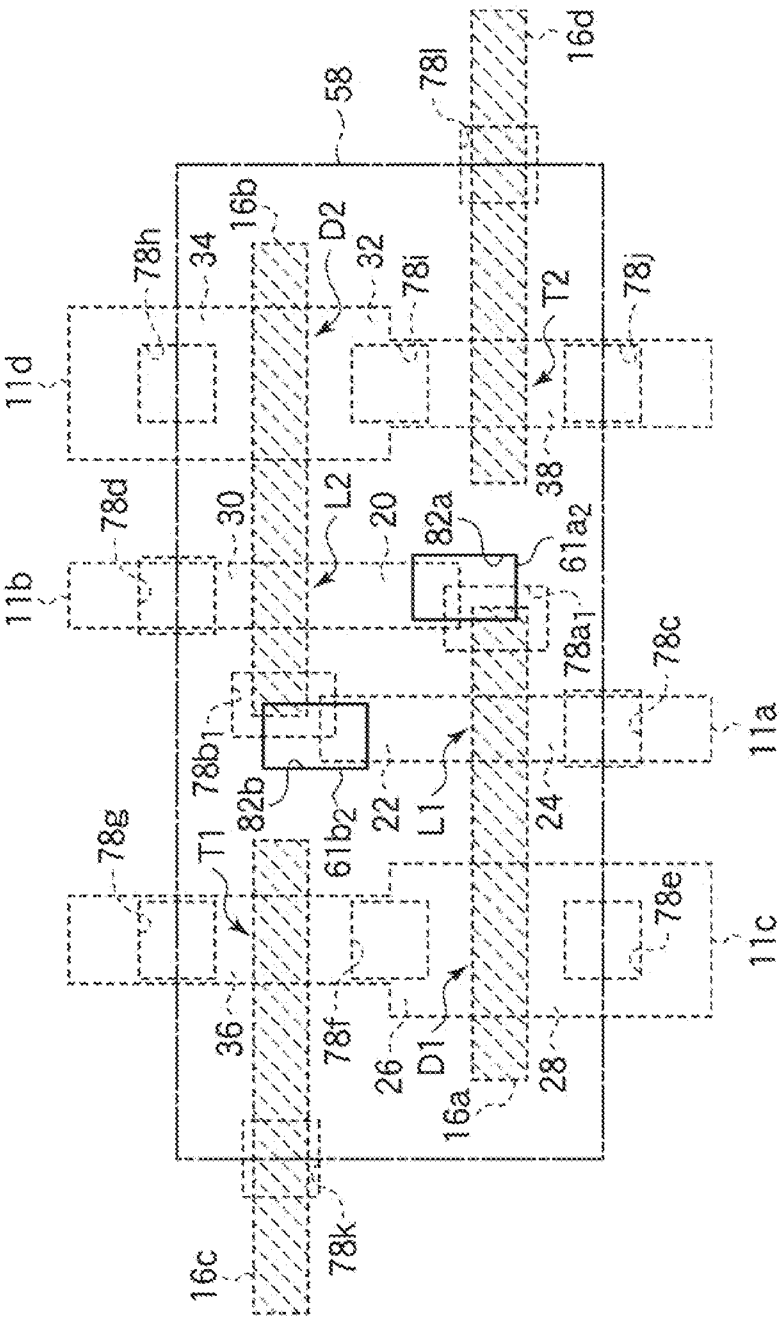
Figure 42B:
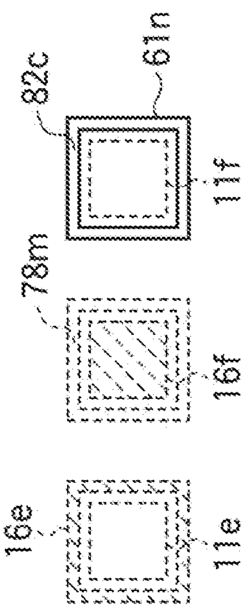
Figure 43:
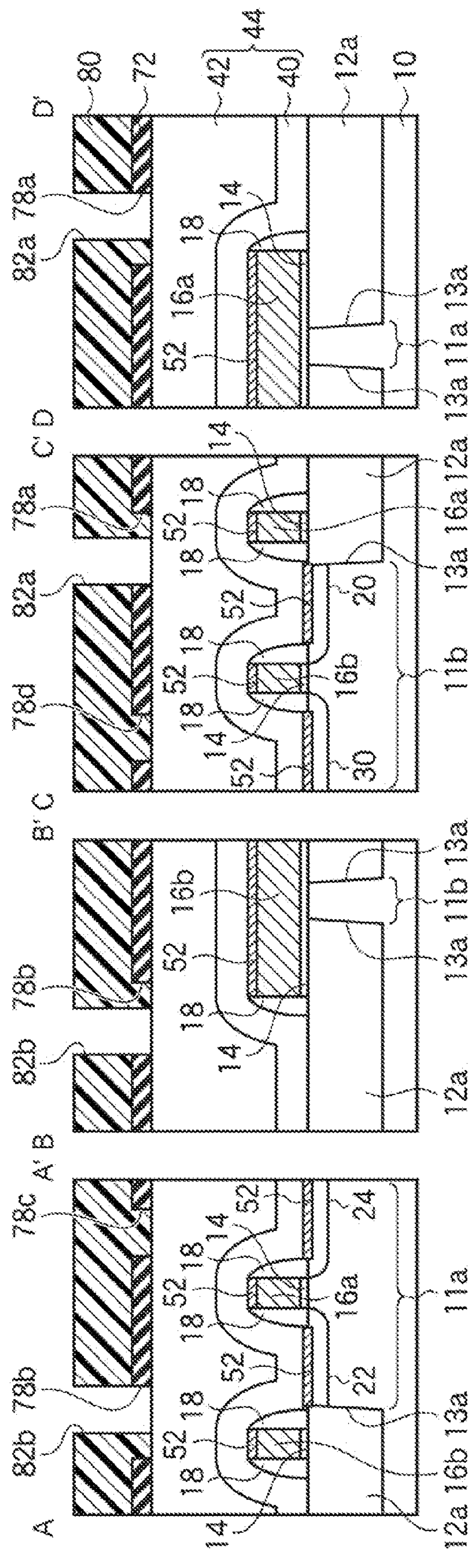
Figure 44A:
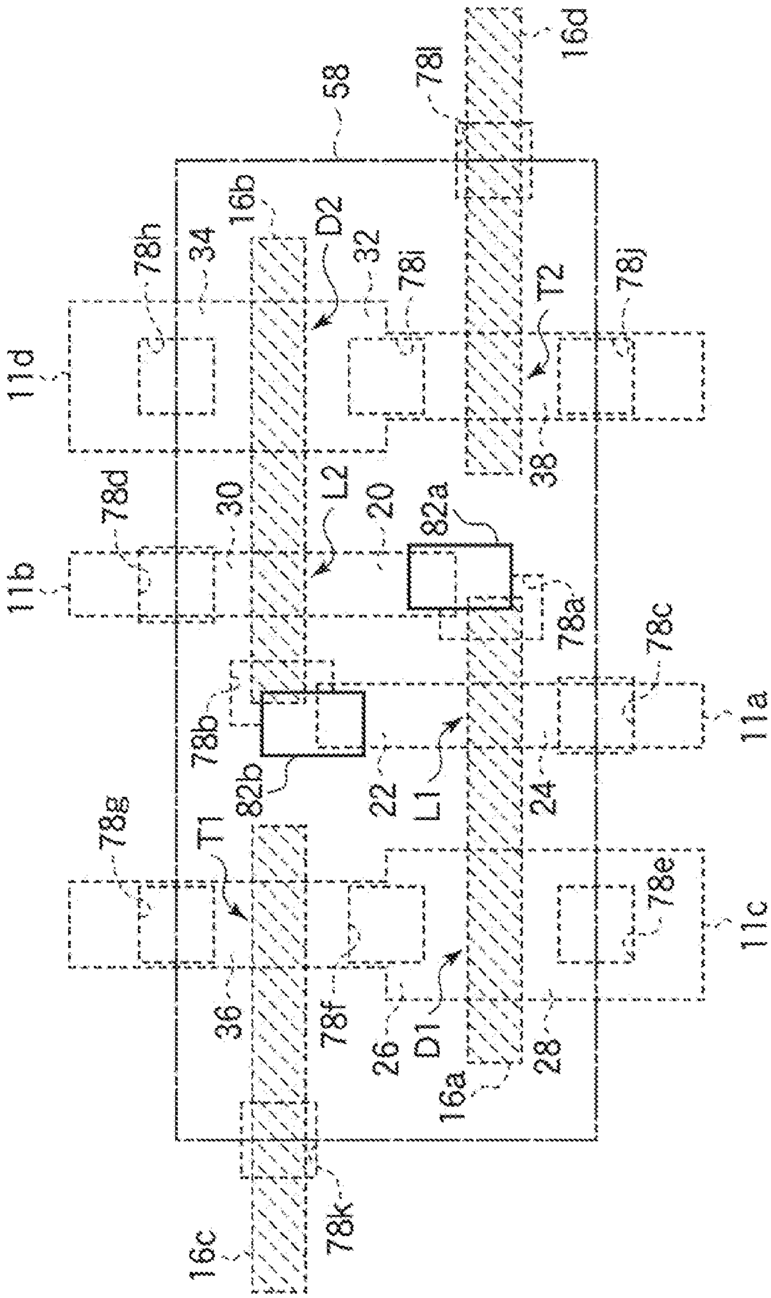
Figure 44B:
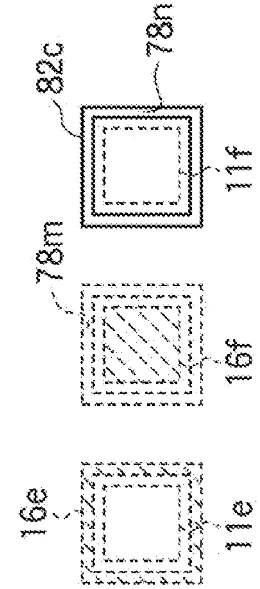
Figure 45A:
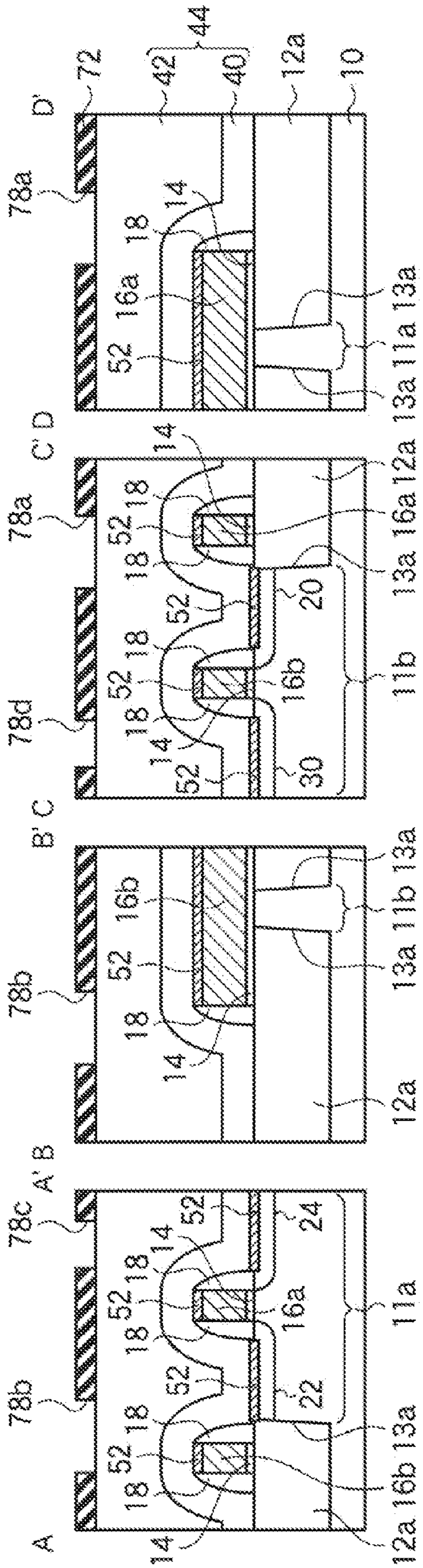
Figure 45B:
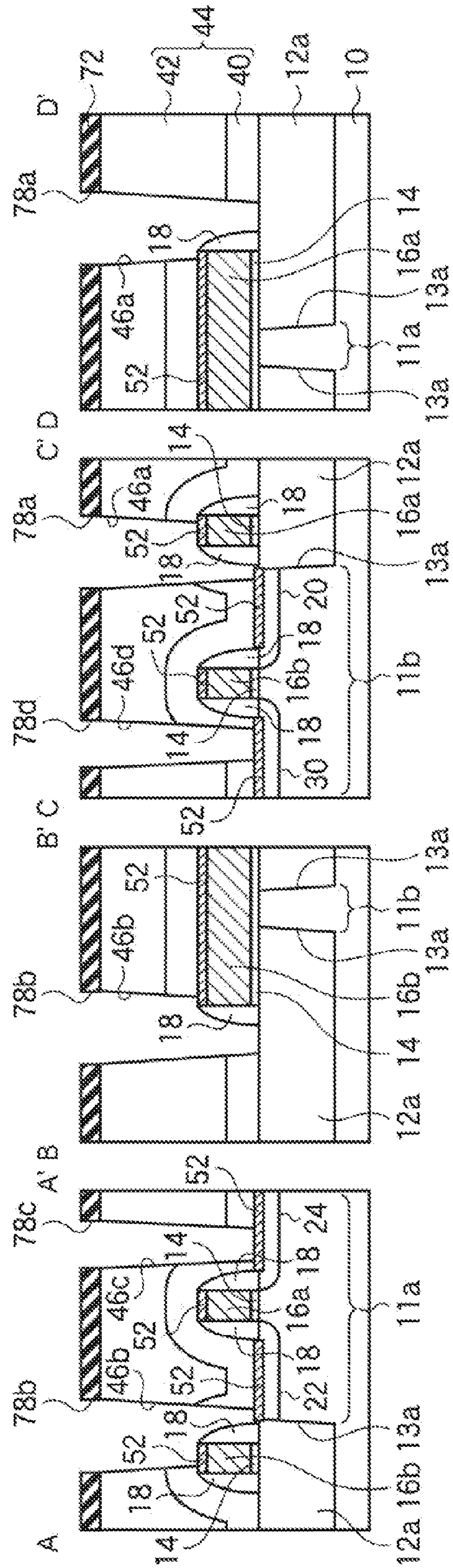
Figure 46A:
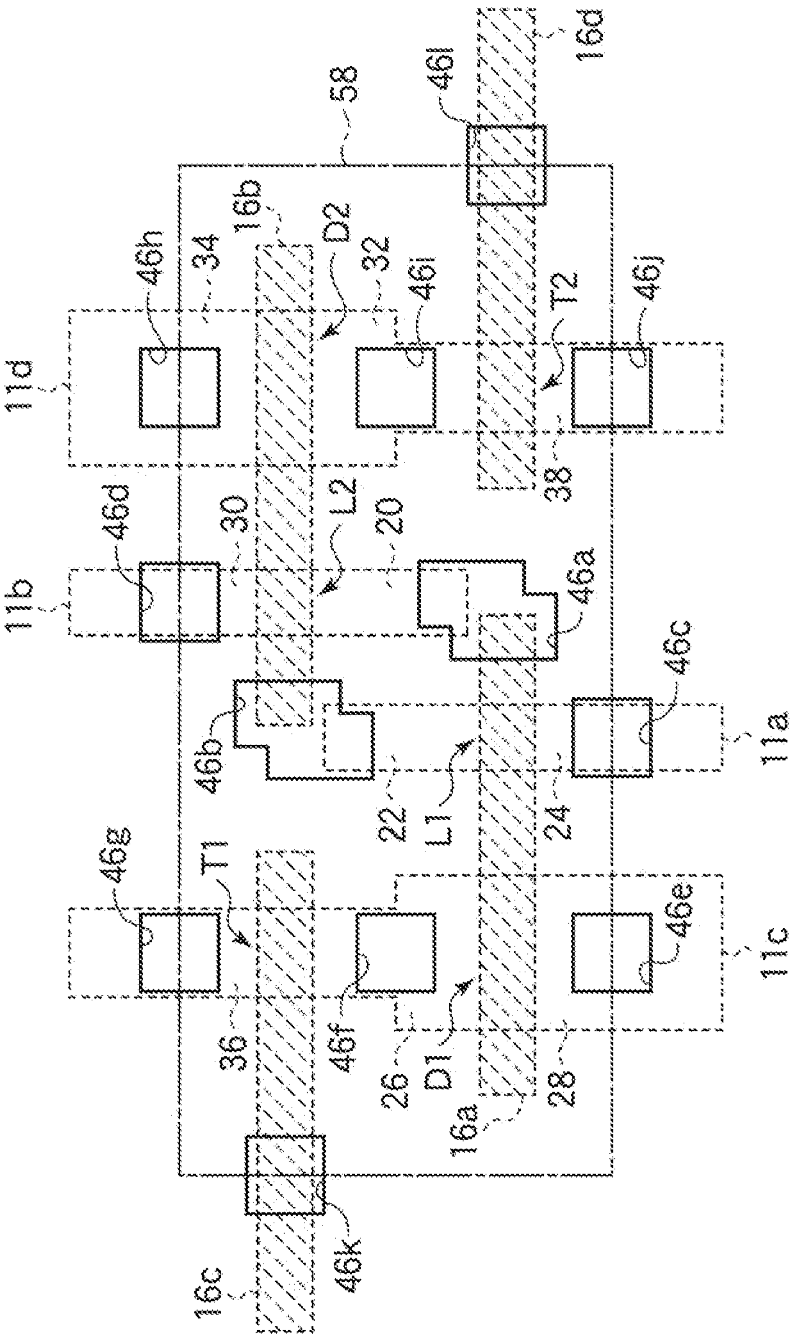
Figure 46B:
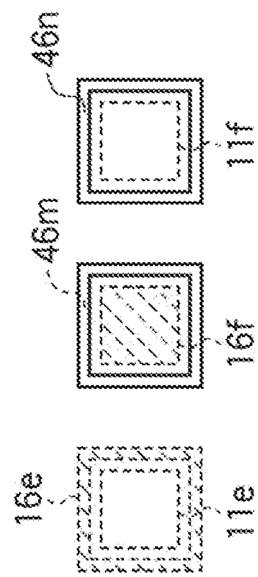
Figure 47A:
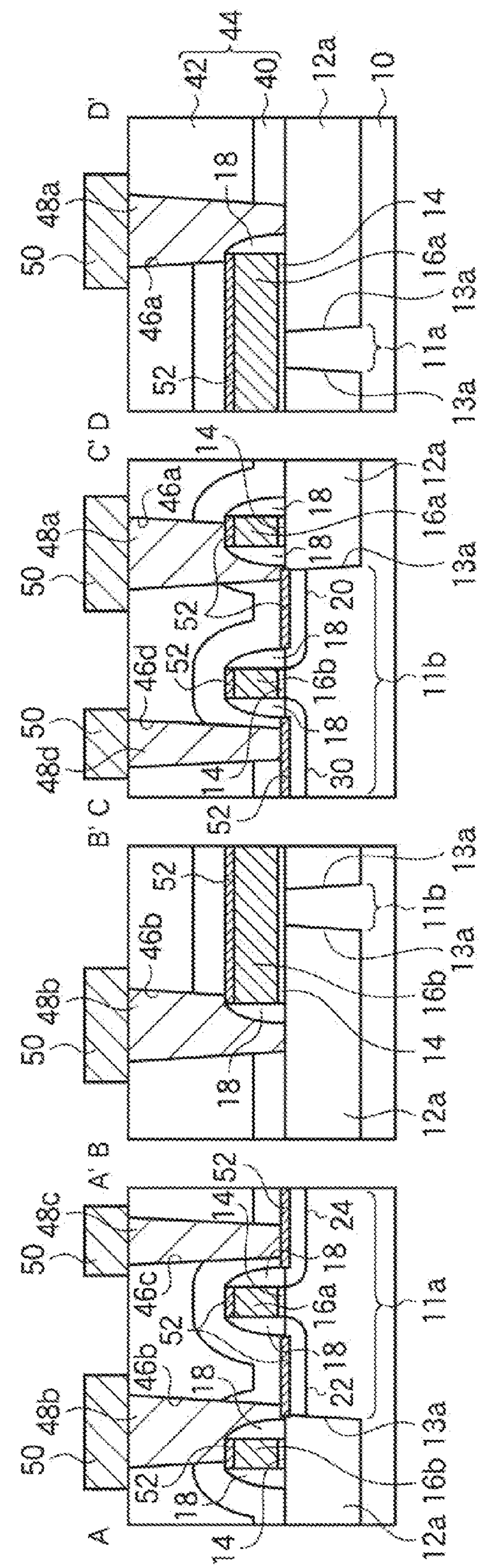
Figure 47B:
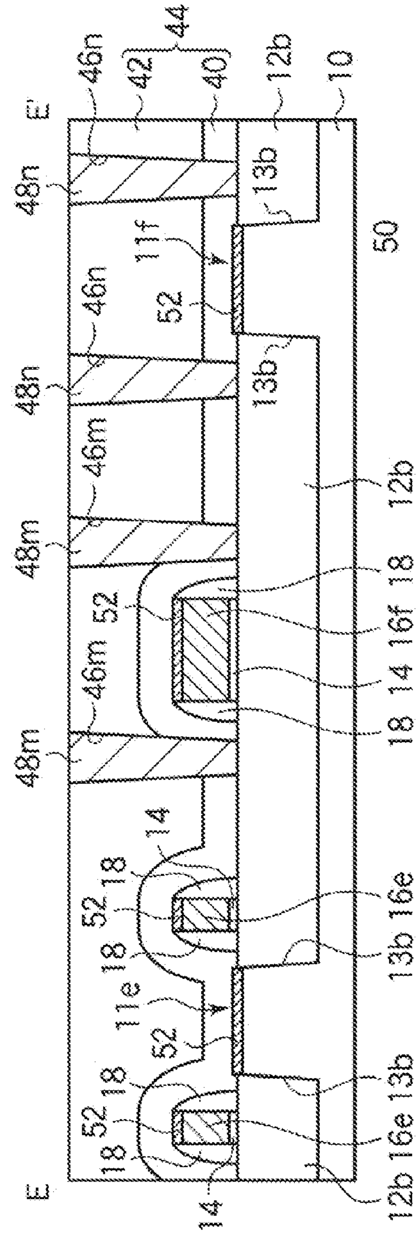
Figure 48A:
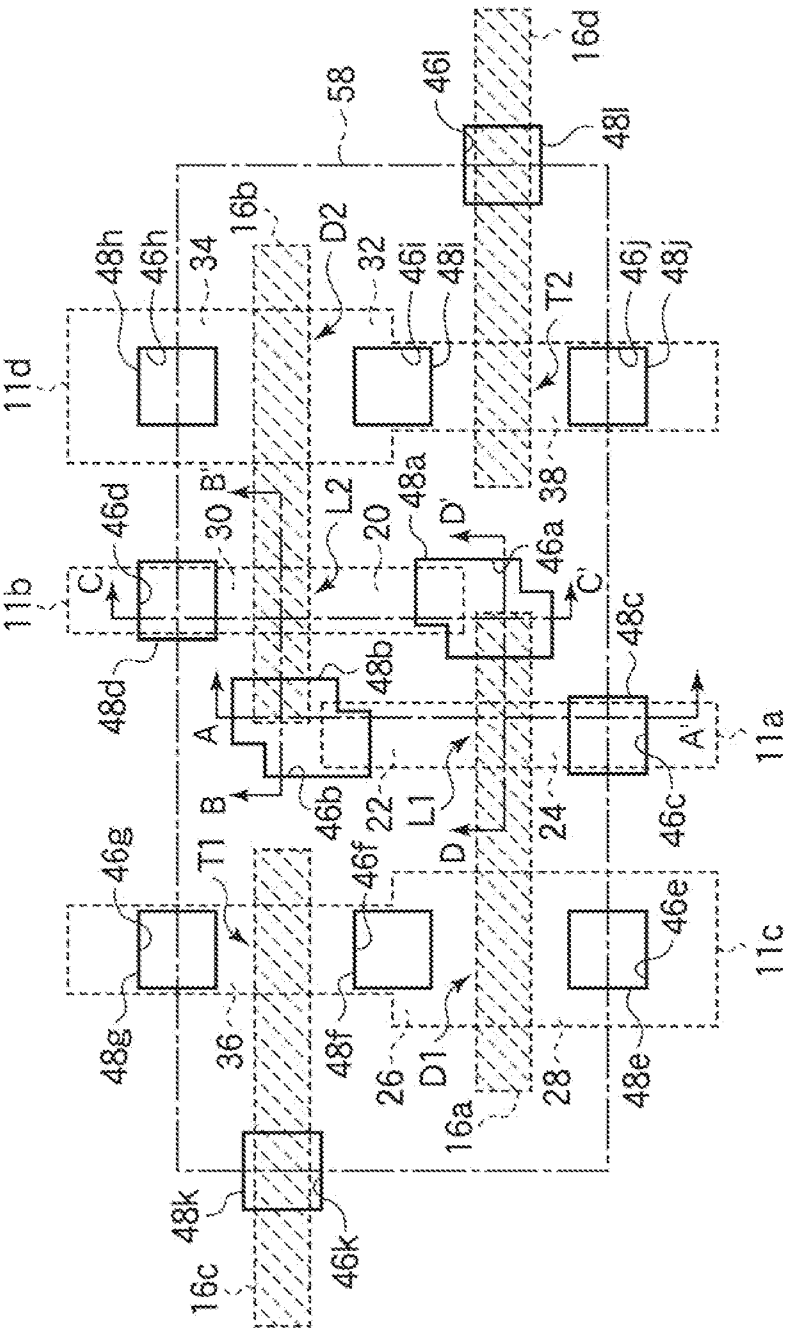
Figure 48B:
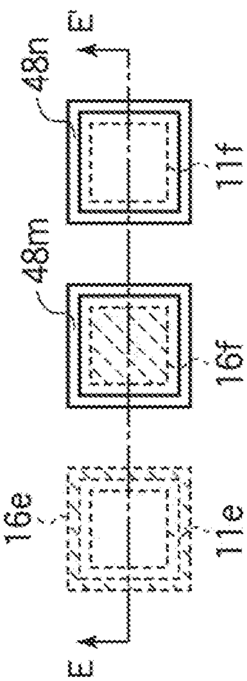

The semiconductor device manufacturing method according to a second embodiment will be described with reference to FIGS. 34A to 48B. FIGS. 34A to 48B are sectional views of the semiconductor device in the steps of the semiconductor device manufacturing method according to the present embodiment, which illustrate the method. FIGS. 34A to 35 are sectional views. FIGS. 36A and 36B are plan views corresponding to FIG. 35. FIG. 37 is a sectional view. FIGS. 38A and 39B are plan views corresponding to FIG. 37. FIGS. 39A to 41 are sectional views. FIGS. 42A and 42B are plan views corresponding to FIG. 41. FIG. 43 is a sectional view. FIGS. 44A and 44B are plan views corresponding to FIG. 43. FIGS. 45A and 45B are sectional views. FIGS. 46A and 46B are plan views corresponding to FIGS. 45A and 45B. FIGS. 47A and 47B are sectional views. FIGS. 48A and 48B are plan views corresponding to FIGS. 47A and 47B. The same members of the present embodiment as those of the semiconductor device according to the first embodiment and its manufacturing method illustrated in FIGS. 1A to 33B are represented by the same reference numbers not to repeat or to simplify their description.

The semiconductor device manufacturing method according to the present embodiment forms the contact holes 46*a*-46*l* by using a hard mask.

First, the step of forming the silicon oxide film 53 on the semiconductor substrate 10 to the step of forming the inter-layer insulation film 44 are the same as those of the method for manufacturing the semiconductor device according to the first embodiment described above with reference to FIG. 5A to 17B, and their description will not be repeated.

Next, as illustrated in FIG. 34A, a silicon nitride film 72 of an about 30 nm-film thickness is formed by, e.g., plasma CVD. The silicon nitride film 72 is to be a hard mask.

Next, a photoresist film 74 is formed on the entire surface by, e.g., spin coating.

Figure 34B:
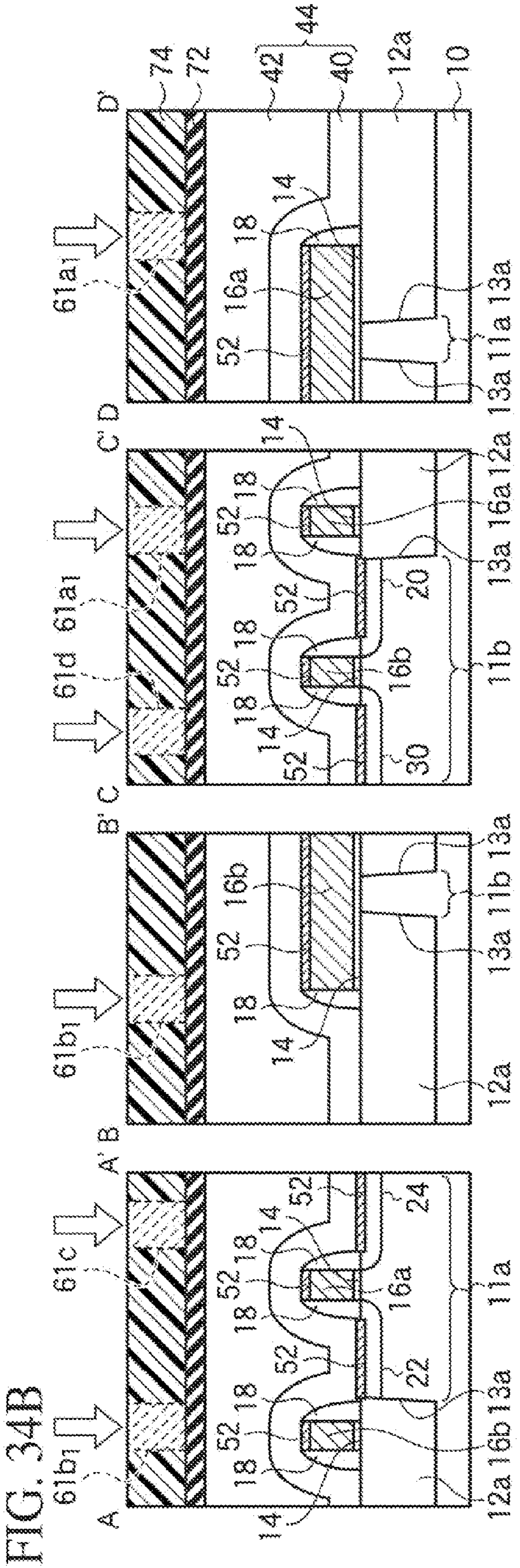

Then, in the same way as in the method for manufacturing the semiconductor device according to the first embodiment described above with reference to FIGS. 19A and 19B, the partial patterns 61*a*1 and 61*b*1 and the patterns 61*c*-61*l* (see FIGS. 19A to 20B) are exposed on the photoresist film 74 by photolithography (see FIG. 34B).

As described above, the partial patterns 61*a*1, 61*b*1 are for forming the contact holes 46*a*, 46*b*. As described above, the patterns 61*c*, 61*l* are for forming the contact holes 46*c*-46*l*. The partial patterns 61*a*1, 61*b*1 are laid out, sufficiently overlapping parts of the gate interconnections 16*a*, 16*b*. The partial patterns 61*a*1, 61*b*1 are laid out, sufficiently overlapping parts of the partial patterns 61*a*2, 61*b*2 to be described later (see FIG. 40). In aligning the first mask (the first reticle) (not illustrated) for exposing the partial patterns 61*a*1, 61*b*1 and the patterns 61*c*-61*l*, the alignment is made by using the alignment mark 16*f* (see FIGS. 20A and 20B).

The pattern of the alignment mark 16*f* and the patterns of the gate interconnections 16*a*-16*d* were transferred by using the same mask. Accordingly no disalignment takes place between the alignment mark 16*f* and the gate interconnections 16*a*, 16*b*. The alignment mark 16*f* is used in aligning the first mask, whereby the disalignment between the partial patterns 61*a*1, 61*b*1 and the gate interconnections 16*a*, 16*b* can be made extremely small. Accordingly, the partial patterns 61*a*1, 61*b*1 and parts of the gate interconnections 16*a*, 16*b* can be sufficiently overlap.

Thus, the partial patterns 61*a*1, 16*b*1 for forming the contact holes 46*a*, 46*b* and the patterns 61*c*-61*l* for forming the contact holes 46*c*-46*l* (see FIGS. 20A and 20B) are exposed on the photoresist film 60. At this time, the pattern 61*m* (see FIGS. 19A to 20B) of the alignment mark (not illustrated) for the first mask is also exposed on the photoresist film 74.

Then, the photoresist film 74 is developed. Thus, the openings 76*a*, 76*b* of the partial patterns 61*a*1, 61*b*1 of the contact holes 46*a*, 46*b* and the openings 76*c*-76*l* for forming the contact holes 46*c*-46*l* are formed in the photoresist film 74. The opening 76*m* of the pattern of the alignment mark (not illustrated) of the first mask (not illustrated) is formed in the photoresist film 74 (see FIGS. 35 to 36B).

As described above, parts of the partial patterns 61*a*1, 61*b*1 and parts of the gate interconnections 16*a*, 16*b* are sufficiently overlapped. Accordingly, the openings 76*a*, 76*b* and parts of the gate interconnections 16*a*, 16*b* are sufficiently overlapped.

Then, the silicon nitride film 72 is etched with the photoresist film 74 as the mask. Thus, a hard mask 72 with the openings 78*a*1, 78*b*1 of the partial patterns of the contact holes 46*a*, 46*b* and the openings 78*c*-78*l* for forming the contact holes 46*c*-46*l* formed in is formed. In the hard mask 72, an opening 78*m* of the pattern of the alignment mark (not illustrated) of the first mask (not illustrated) is formed (see FIGS. 37 to 38B).

As described above, the openings 76*a*, 76*b* and parts of the gate interconnections 16*a*, 16*b* are sufficiently overlapped. Thus, the openings 78*a*1, 78*b*1 and the parts of the gate interconnections 16*a*, 16*b* are sufficiently overlapped.

Figure 39A:
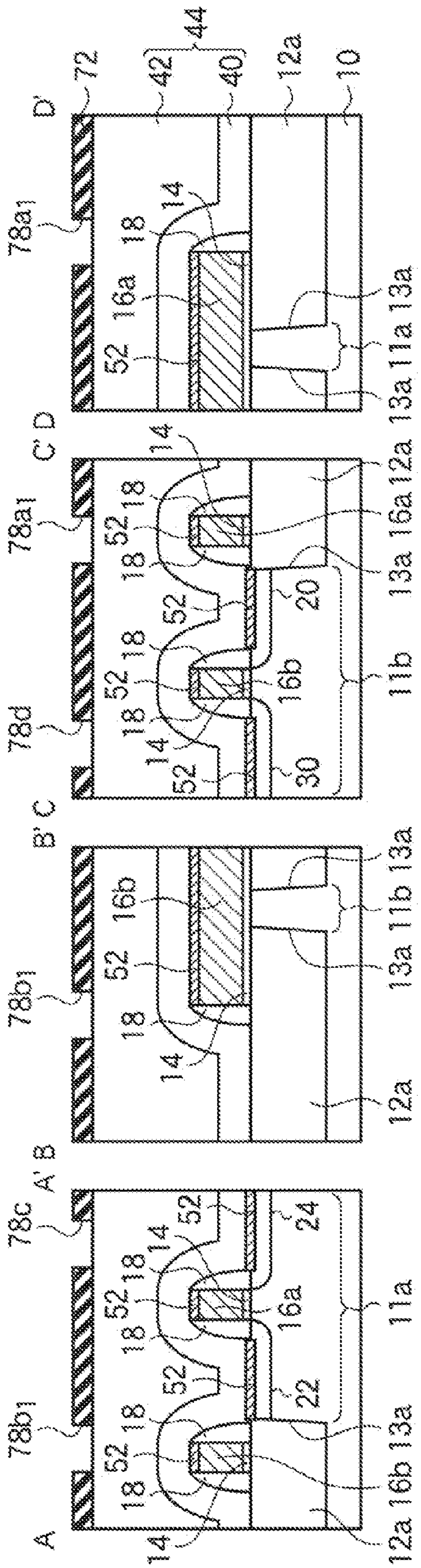
Figure 39B:
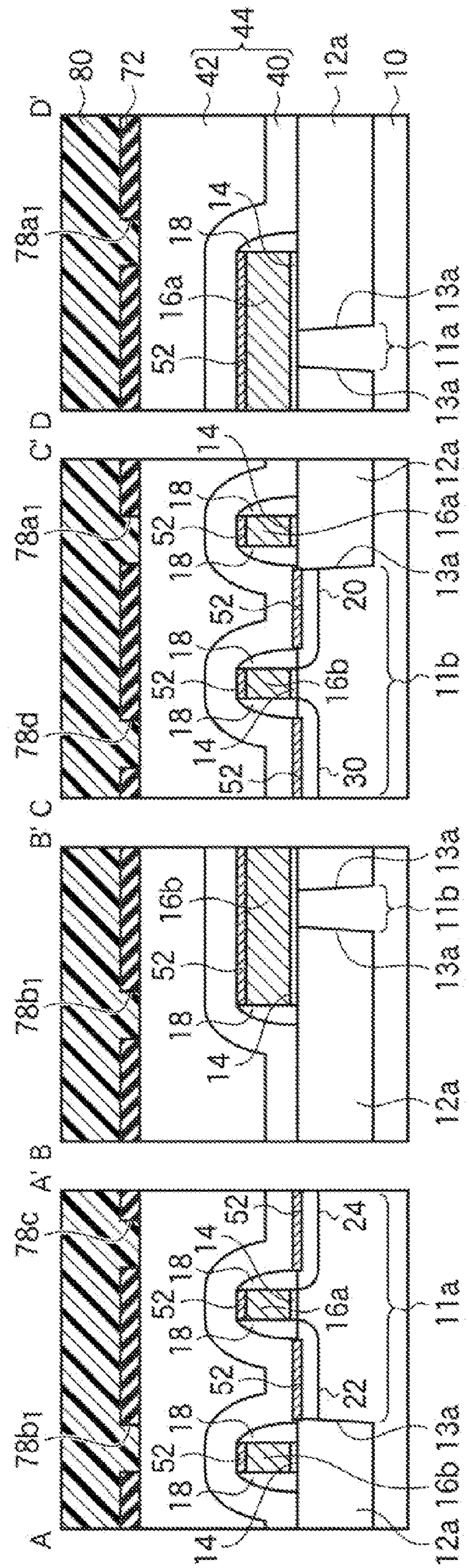

Next, as illustrated in FIG. 39A, the photoresist film 74 is removed by wet processing and asking.

Next, as illustrated in FIG. 39B, a photoresist film 80 is formed on the entire surface by, e.g., spin coating.

Figure 40:
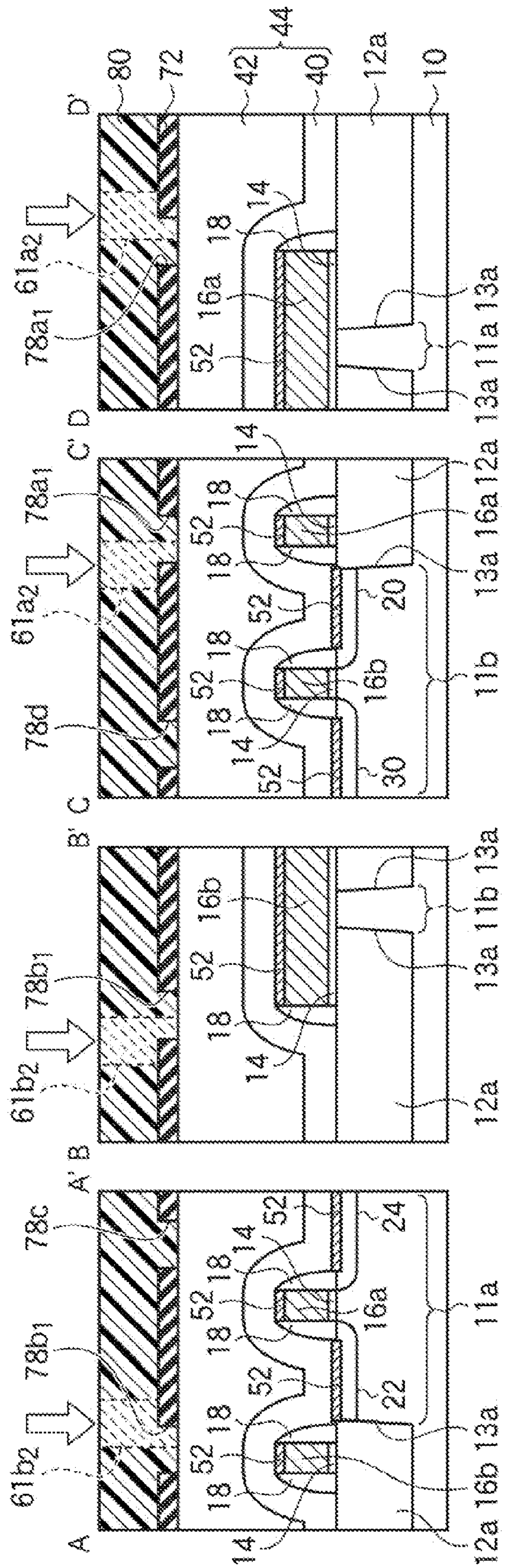
Figure 41:
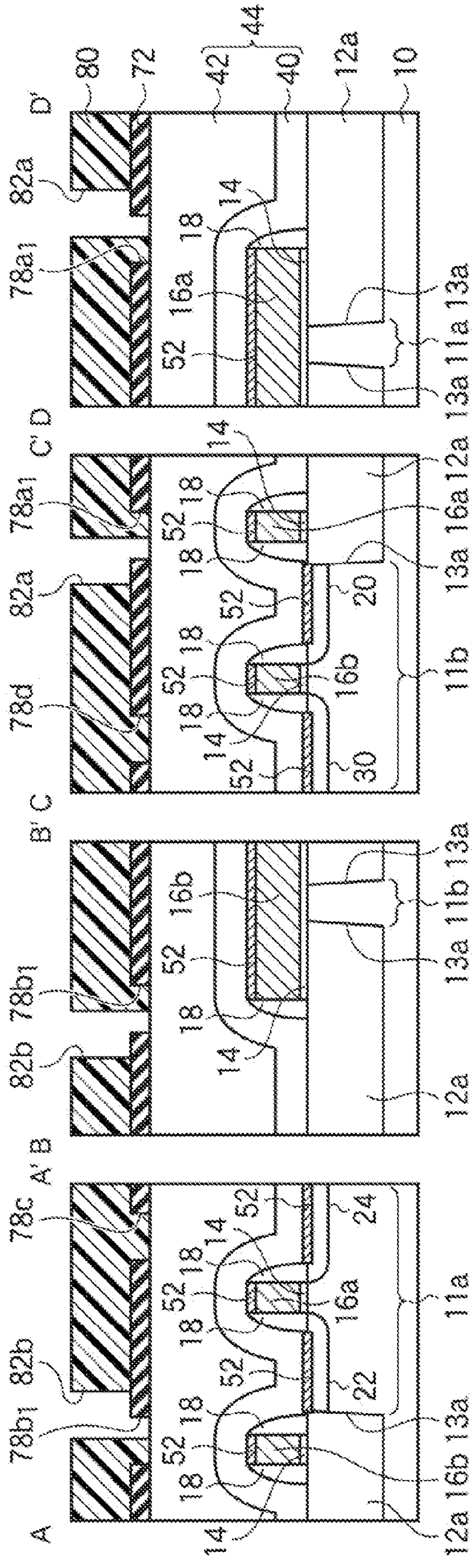

Then, the partial patterns 61*a*2, 61*b*2 are exposed on the photoresist film 80 by photolithography (see FIG. 40). The partial patterns 61*a*2, 61*b*2 are laid out, sufficiently overlapping parts of the active regions 11*b*, 11*a*. The partial patterns 61*a*2, 61*b*2 are laid out, sufficiently overlapping parts of the openings 78*a*1, 78*b*1. In aligning the second mask (not illustrated) for exposing the partial patterns 61*a*2, 61*b*2, the alignment is made by using the alignment mark 11*f*.

The pattern of the alignment mark 11*f* and the patterns of the active regions 11*a*-11*d* were transferred by using the same mask. Accordingly, no disalignment takes place between the alignment mark 11*f* and the active regions 11*a*-11*d*. The alignment mark 11*f* is used in aligning the second mask, whereby the alignment between the partial patterns 61*a*2, 61*b*2 and the active regions 11*b*, 11*a* can be made extremely small. Accordingly, parts of the partial patterns 61*a*2, 61*b*2 and parts of the active regions can be sufficiently overlapped.

Thus, the partial patterns 61*a*2, 61*b*2 of the contact holes 46*a*, 46*b* are exposed on the photoresist film 80. At this time, the pattern 61*n* (see FIGS. 42A and 42B) of the alignment mark (not illustrated) for the second mask is also exposed on the photoresist film 80.

The partial patterns 61*a*2, 61*b*2 are thus exposed, whereby parts of the openings 78*a*1, 78*b*1 and parts of the partial patterns 61*a*2, 61*b*2 can be surely overlapped even when a disalignment takes place.

Then, the photoresist film 80 is developed. Thus, the openings 82*a*, 82*b* for forming the partial patterns 61*a*2, 61*b*2 of the contact holes 46*a*, 46*b* and the opening 82*c* of the pattern of the alignment mark are formed in the photoresist film 80. Parts of the openings 82*a*, 82*b* and parts of the active regions 11*b*, 11*a* are sufficiently overlapped (see FIGS. 41 to 42B).

The hard mask 72 is etched with the photoresist film 80 as the mask. Thus, the partial patterns 61*a*2, 61*b*2 of the contact holes 46*a*, 46*b* are transferred to the hard mask 72. Thus, the openings 78*a*, 78*b* for forming the contact holes 46*a*, 46*b* are formed in the hard mask 72. The opening 78*n* of the pattern of the alignment mark (not illustrated) of the second mask (not illustrated) is also formed in the hard mask 72 (see FIGS. 43 to 44B).

As described above, parts of the openings 82*a*, 82*b* and parts of the active regions 11*b*, 11*a* are sufficiently overlapped. Accordingly the parts of the openings 78*a*, 78*b* and the parts of the active regions 11*b*, 11*a* are sufficiently overlapped. As described above, the openings 78*a*1, 78*b*1 (see FIG. 41) and parts of the gate interconnections 16*a*, 16*b* are sufficiently overlapped. Accordingly, the parts of the openings 78*a*, 78*b* and the parts of the gate interconnections 16*a*, 16*b* are sufficiently overlapped.

Next, as illustrated in FIG. 45A, the photoresist film 80 is removed by wet processing and asking.

Next, the inter-layer insulation film 44 is etched with the hard mask 72 as the mask. Thus, the contact holes 46*a*-46*l* and the openings 46*m*, 46*n* are formed in the inter-layer insulation film 44 (see FIGS. 45B to 46B).

As described above, parts of the openings 78*a*, 78*b* and parts of the active regions 11*b*, 11*a* are sufficiently overlapped. Accordingly, parts of the contact holes 46*a*, 46*b* and the parts of the active regions 11*b*, 11*a* are sufficiently overlapped. As described above, the parts of the openings 78*a*, 78*b* and parts of the gate interconnections 16*a*, 16*b* are sufficiently overlapped. Accordingly, the parts of the contact holes 46*a*, 46*b* and the parts of the gate interconnections 16*a*, 16*b* are sufficiently overlapped.

Thus, even when a disalignment takes place, the contact holes 46*a* can surely expose integrally the end of the gate interconnection 16*a* and the source/drain diffused layer 20 of the load transistor L2. Even when a disalignment takes place, the contact hole 46*b* surely exposes integrally the end of the gate interconnection 16*b* and the source/drain diffused layer 22 of the load transistor L1.

The semiconductor device manufacturing method following the above-described steps is the same as the method for manufacturing the semiconductor device according to the first embodiment described above with reference to FIGS. 27A to 29B, and its description will not be repeated.

Thus, the semiconductor device is manufactured by the semiconductor device manufacturing method according to the present embodiment (see FIGS. 47A to 48B).

As described above, the inter-layer insulation film 44 may be etched by using the hard mask 72. In the present embodiment, the partial patterns 61*a*1, 61*b*1 for forming parts of the contact holes 46*a*, 46*b* are transferred to the hard mask 72 in alignment with the alignment mark 16*f* transferred simultaneously with transferring the patterns of the gate interconnections 16*a*, 16*b*. The partial patterns 61*a*2, 61*b*2 for forming parts of the contact holes 46*a*, 46*b* are transferred to the hard mask 72 in alignment with the alignment mark 11*f* transferred simultaneously with transferring patterns of the active regions 11*a*, 11*b*. Parts of the partial patterns 61*a*1, 61*b*1 and parts of the partial patterns 61*a*2, 61*b*2 are laid out, sufficiently overlapped. Thus, according to the present embodiment as well, the contact hole 46*a* which can surely expose integrally the end of the gate interconnection 16*a* and a part of the source/drain diffused layer 20 of the load transistor L2 can be formed. The contact hole 46*b* which can surely expose integrally the end of the gate interconnection 16*b* and the end of the source/drain diffused layer 22 of the load transistor L1 can be formed. Thus, according to the present embodiment as well, the contact layer 48*a* which can surely connect integrally the end of the gate interconnection 16*a* and the source/drain diffused layer 20 of the load transistor L2 can be formed. The contact layer 48*b* which can surely connect integrally the end of the gate interconnection 16*b* and a part of the source/drain diffused layer 22 of the load transistor L1 can be formed. Thus, according to the present embodiment as well, the semiconductor device of high reliability can be manufactured with high yields.

Modified Embodiments

The present invention is not limited to the above-described embodiments and can cover other various modifications.

For example, in the above-described embodiments, in the first exposure, the partial patterns 61*a*1, 61*b*1 and the patterns 61*c*-61*m* are exposed, and the partial patterns 61*a*2, 61*b*2, 61*n* are exposed in the second exposure. However, this is not essential. For example, it is possible that in the first exposure, the partial patterns 61*a*1, 61*b*1 and the pattern 61*m* are exposed, and in the second exposure, the partial patterns 61*a*2, 61*b*2 and the patterns 61*c*-61*l*, 61*n* are exposed in the second exposure.

In the above-described embodiments, the first exposure was made with the first mask aligned with the alignment mark 16*f* transferred simultaneously with transferring the patters of the gate interconnections 16*a*, 16*b*. The second exposure was made with the second mask aligned with the alignment mark 11*f* transferred simultaneously with transferring the patterns of the active regions 11*a*, 11*b*. However, the sequence of the exposures is not limited to this. For example, it is possible that the first exposure may be made with the second mask aligned with the alignment mark 11*f* transferred simultaneously with transferring the patterns of the active regions 11*a*, 11*b*, and the second exposure is made with the first mask aligned with the alignment mark 16*f* transferred simultaneously with transferring the patterns of the gate interconnections 16*a*, 16*b*.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device manufacturing method comprising:

forming a device isolation region that defines a plurality of active regions in a semiconductor substrate and forming a first alignment mark in the semiconductor substrate;

forming a first gate interconnection that is formed, crossing over one of said plurality of active regions and that is linear and includes the gate electrode of a first transistor, and a second gate interconnection that is formed, crossing over the other of said plurality of active regions and which is linear and in parallel with the first gate interconnection over the semiconductor substrate with a gate insulation film formed therebetween, and forming a second alignment mark over the semiconductor substrate;

forming source/drain diffused layers respectively in the active regions on both sides of the gate electrodes;

forming the first insulation film over the semiconductor substrate, the first gate interconnection and the second gate interconnection;

forming over the first insulation film the second insulation film which is different from the first insulation film in the etching characteristics;

forming the first photoresist film over the second insulation film;

making alignment by using the second alignment mark and exposing on the first photoresist film a first partial pattern for a first contact hole in the first insulation film, overlapping at least a part of the first gate interconnection;

developing the first photoresist film to form a first opening in the first photoresist film at the portion where the first partial pattern has been exposed;

etching the second insulation film by using as the mask the first photoresist film with the first opening formed in;

forming a second photoresist film over the second insulation film;

making alignment by using the first alignment mark to expose on the second photoresist film a second partial pattern to form the first contact hole in the first insulation film, overlapping at least a part of the source/drain diffused layer of the second transistor;

developing the second photoresist film to form a second opening in the second photoresist film at the portion where the second partial pattern has been exposed;

etching the second insulation film by using as the mask the second photoresist film with the second opening formed in;

etching the first insulation film with the second insulation film as the mask to form in the first insulation film the first contact hole down to the first gate interconnection and the source/drain diffused layer of the second transistor; and burying the first contact layer in the first contact hole, wherein the first alignment mark is electrically insulated from the first gate interconnection and the second gate interconnection, and the second alignment mark is electrically insulated from the first gate interconnection and the second gate interconnection.

2. The semiconductor device manufacturing method according to claim 1, wherein in the exposing the first partial pattern on the first photoresist film, a third partial pattern for forming a second contact hole in the first insulation film is exposed, overlapping at least a part of the second gate interconnection, in the developing the first photoresist film, a third opening is further formed in the first photoresist film at the portion where the third partial pattern has been exposed, in the etching the second insulation film with the first photoresist film as the mask, the second insulation film is etched by using as the mask the first photoresist film with the third opening further formed in, in the exposing the second partial pattern on the second photoresist film, a fourth partial pattern for forming the second contact hole in the first insulation film is further exposed on the second photoresist film, overlapping at least a part of the source/drain diffused layer of the first transistor, in the developing the second photoresist film, a fourth opening is further formed in the second photoresist film at the portion where the fourth partial pattern has been exposed, and in the etching the second insulation film with the second photoresist film as the mask, the second insulation film is etched by using as the mask the second photoresist film with the fourth opening further formed in, in the etching the first insulation film as the second insulation film as the mask, the second contact hole is further formed in the first insulation film down to the second gate interconnection and the source/drain diffused layer of the first transistor, and in the burying the first contact layer in the first contact hole, the second contact layer is further buried in the second contact hole.

3. The semiconductor device manufacturing method according to claim 1, wherein the first alignment mark is defined by the same film that forms the device isolation region defining the active regions.

4. The semiconductor device manufacturing method according to claim 3, wherein a pattern of the first alignment mark and patterns of the active regions are transferred by using the same first mask; and a pattern of the second alignment mark and patterns of the first gate interconnection and the second interconnection are transferred by using the same second mask.

5. The semiconductor device manufacturing method according to claim 4, wherein the transferring of the pattern of the first alignment mark and the patterns of the active regions by using the same first mask and the transferring of the pattern of the second alignment mark and the patterns of the first gate interconnection and the second interconnection by using the same second mask are continuously executed before etching.

6. The semiconductor device manufacturing method according to claim 1, wherein the second alignment mark is formed of the same film as the first gate interconnection and the second gate interconnection.

7. The semiconductor device manufacturing method according to claim 6, wherein a pattern of the first alignment mark and patterns of the active regions are transferred by using the same first mask; and a pattern of the second alignment mark and patterns of the first gate interconnection and the second interconnection are transferred by using the same second mask.

8. The semiconductor device manufacturing method according to claim 7, wherein the transferring of the pattern of the first alignment mark and the patterns of the active regions by using the same first mask and the transferring of the pattern of the second alignment mark and the patterns of the first gate interconnection and the second interconnection by using the same second mask are continuously executed before etching.

* * * * *